(12) United States Patent
Kitagawa

(10) Patent No.: US 10,050,135 B2
(45) Date of Patent: *Aug. 14, 2018

(54) SEMICONDUCTOR DEVICE AND METHOD FOR DRIVING SAME

(71) Applicant: Kabushiki Kaisha Toshiba, Minato-ku, Tokyo (JP)

(72) Inventor: Mitsuhiko Kitagawa, Bunkyo Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/652,416

(22) Filed: Jul. 18, 2017

(65) Prior Publication Data

US 2017/0317199 A1 Nov. 2, 2017

Related U.S. Application Data

(62) Division of application No. 15/042,854, filed on Feb. 12, 2016, now Pat. No. 9,741,836.

(30) Foreign Application Priority Data

Sep. 10, 2015 (JP) ................................. 2015-178582

(51) Int. Cl.
*H01L 29/744* (2006.01)
*H01L 29/749* (2006.01)
(Continued)

(52) U.S. Cl.
CPC ...... *H01L 29/7397* (2013.01); *H01L 29/0634* (2013.01); *H01L 29/0878* (2013.01);
(Continued)

(58) Field of Classification Search
CPC .............. H01L 29/7455; H01L 29/744; H01L 29/1095; H01L 29/749; H01L 29/7397; H01L 29/7813
(Continued)

(56) References Cited

U.S. PATENT DOCUMENTS 5,311,050 A * 5/1994 Nitayama ............. H01L 27/092
257/330
5,393,995 A 2/1995 Nakagawa et al.
(Continued)

FOREIGN PATENT DOCUMENTS

JP 2000-228491 A 8/2000
JP 2001-320049 A 11/2001
(Continued)

OTHER PUBLICATIONS

Y. Yamaguti et al., "200° C. High Temperature Operations of 250V 0.5A One Chip Inverter in SOI," Advanced Semiconductor Device Research Laboratories, Toshiba Corporation, pp. 17-20 (1998).
(Continued)

*Primary Examiner* — Brandon S Cole
(74) *Attorney, Agent, or Firm* — White & Case LLP

(57) ABSTRACT

A semiconductor device according to an embodiment includes a first semiconductor layer of a first conductivity type, a second semiconductor layer of a second conductivity type, a third semiconductor layer of the first conductivity type, a fourth semiconductor layer of the second conductivity type, a first electrode connected to the second semiconductor layer and the fourth semiconductor layer, a second electrode facing the second semiconductor layer with an insulating film interposed, a fifth semiconductor layer of the second conductivity type, a sixth semiconductor layer of the first conductivity type, a seventh semiconductor layer of the second conductivity type, a third electrode connected to the fifth semiconductor layer and the seventh semiconductor layer, and a fourth electrode facing the fifth semiconductor layer with an insulating film interposed.

14 Claims, 63 Drawing Sheets

(51) Int. Cl.
*H01L 29/739* (2006.01)
*H01L 29/06* (2006.01)
*H01L 29/08* (2006.01)
*H01L 29/78* (2006.01)
*H03K 17/687* (2006.01)
*H03K 17/567* (2006.01)

(52) U.S. Cl.
CPC ........ *H01L 29/7813* (2013.01); *H03K 17/567* (2013.01); *H03K 2017/6878* (2013.01)

(58) Field of Classification Search
USPC .................................................. 327/334–509
See application file for complete search history.

(56) References Cited

U.S. PATENT DOCUMENTS

| | | | |
|---|---|---|---|
| 5,670,810 | A | 9/1997 | Tamaki et al. |
| 5,780,898 | A * | 7/1998 | Tamaki ............. H01L 21/82385 257/331 |
| 6,069,384 | A * | 5/2000 | Hause ............. H01L 21/823468 257/330 |
| 6,399,468 | B2 * | 6/2002 | Nishibe ............... H01L 29/6659 257/E21.417 |
| 7,187,041 | B2 | 3/2007 | Mizokuchi et al. |
| 7,615,846 | B2 | 11/2009 | Harada |
| 8,415,711 | B2 | 4/2013 | Kitagawa |
| 9,324,815 | B2 | 4/2016 | Ogura et al. |
| 2010/0237457 | A1 | 9/2010 | Kitagawa |
| 2011/0210391 | A1 | 9/2011 | Kitagawa |
| 2012/0068221 | A1 | 3/2012 | Kitagawa |
| 2015/0021656 | A1 | 1/2015 | Kitagawa |
| 2015/0127673 | A1 | 5/2015 | Pogrebnyak et al. |
| 2015/0236104 | A1 | 8/2015 | Ogura et al. |
| 2015/0349103 | A1 | 12/2015 | Onozawa et al. |
| 2016/0071964 | A1 | 3/2016 | Kitagawa |
| 2017/0077273 | A1 * | 3/2017 | Kitagawa ............ H01L 29/7397 |

FOREIGN PATENT DOCUMENTS

| | | |
|---|---|---|
| JP | 2002-095267 A | 3/2002 |
| JP | 3281194 B2 | 5/2002 |
| JP | 2007-266622 A | 10/2007 |
| JP | 2008-141056 A | 6/2008 |
| JP | 4198251 A | 10/2008 |
| JP | 2010-225748 A | 10/2010 |
| JP | 2010-251517 A | 11/2010 |
| JP | 2011-181583 A | 9/2011 |
| JP | 2011-243872 A | 12/2011 |
| JP | 5299373 A | 6/2013 |
| JP | 2016-058428 A | 4/2016 |
| JP | 2017-054968 A | 3/2017 |

OTHER PUBLICATIONS

A. Nakagawa, "200° C. Temperature and High-Speed Operation of 440 V Lateral IGBTs on 1.5 μm thick SOI," Research and Development Center, Toshiba Corporation, IEDM 93-687-690; pp. 28.5.1-28.54 (1993).

H. Funaki et al., "Lateral SOI Diode Design Optimization for High Ruggedness and Low Temperature Dependence of Reverse Recovery Characteristics," Proceedings of 1998 International Symposium on Power Semiconductor Devices & ICs, Kyoto, pp. 33-36 (1998).

* cited by examiner

MOSFET MODE
(COLLECTOR VOLTAGE: LOW)

IEGT MODE
(COLLECTOR VOLTAGE: HIGH)

SEMICONDUCTOR DEVICE AND METHOD FOR DRIVING SAME

CROSS-REFERENCE TO RELATED APPLICATIONS

This application is a divisional of application Ser. No. 15/042,854, filed Feb. 12, 2016 and is based upon and claims the benefit of priority from Japanese Patent Application No. 2015-178582, filed on Sep. 10, 2015; the entire contents of which are incorporated herein by reference.

FIELD

Embodiments described herein relate generally to a semiconductor device and a method for driving the same.

BACKGROUND

In recent years, a MOSFET (Metal Oxide Semiconductor Field-Effect Transistor), a super junction-type MOSFET, an IGBT (Insulated Gate Bipolar Transistor), an IEGT (Injection Enhanced Gate Transistor), etc., are used as semiconductor devices for power control. Compared to a unipolar MOSFET, a larger current can be controlled in IGBTs and IEGTs because IGBTs and IEGTs are bipolar semiconductor devices that use both electrons and holes as carriers. However, even in such a semiconductor device for power control, it is desirable to control even larger currents.

BRIEF DESCRIPTION OF THE DRAWINGS

FIG. 2A shows a MOSFET mode; and FIG. 2B shows an IEGT mode;

FIG. 6B shows the ON state of the IEGT mode; FIG. 6C shows the case where the collector side has low injection in the ON state of the IEGT mode; FIG. 6D shows the ON state of the MOSFET mode;

DETAILED DESCRIPTION

A semiconductor device according to an embodiment includes a first semiconductor layer of a first conductivity type, a second semiconductor layer of a second conductivity type provided on the first semiconductor layer, a third semiconductor layer of the first conductivity type provided on the second semiconductor layer, a fourth semiconductor layer of the second conductivity type provided on the second semiconductor layer, a first electrode connected to the second semiconductor layer and the fourth semiconductor layer, a second electrode facing the second semiconductor layer with an insulating film interposed, a fifth semiconductor layer of the second conductivity type provided under the first semiconductor layer, a sixth semiconductor layer of the first conductivity type provided under the fifth semiconductor layer, a seventh semiconductor layer of the second conductivity type provided under the fifth semiconductor layer, a third electrode connected to the fifth semiconductor layer and the seventh semiconductor layer, and a fourth electrode facing the fifth semiconductor layer with an insulating film interposed. A carrier concentration of the third semiconductor layer is higher than a carrier concentration of the first semiconductor layer. A carrier concentration of the fourth semiconductor layer is higher than a carrier concentration of the second semiconductor layer. A carrier concentration of the sixth semiconductor layer is higher than the carrier concentration of the first semiconductor layer. A carrier concentration of the seventh semiconductor layer is higher than a carrier concentration of the fifth semiconductor layer.

First Embodiment

First, a first embodiment will be described.

Figure 1:
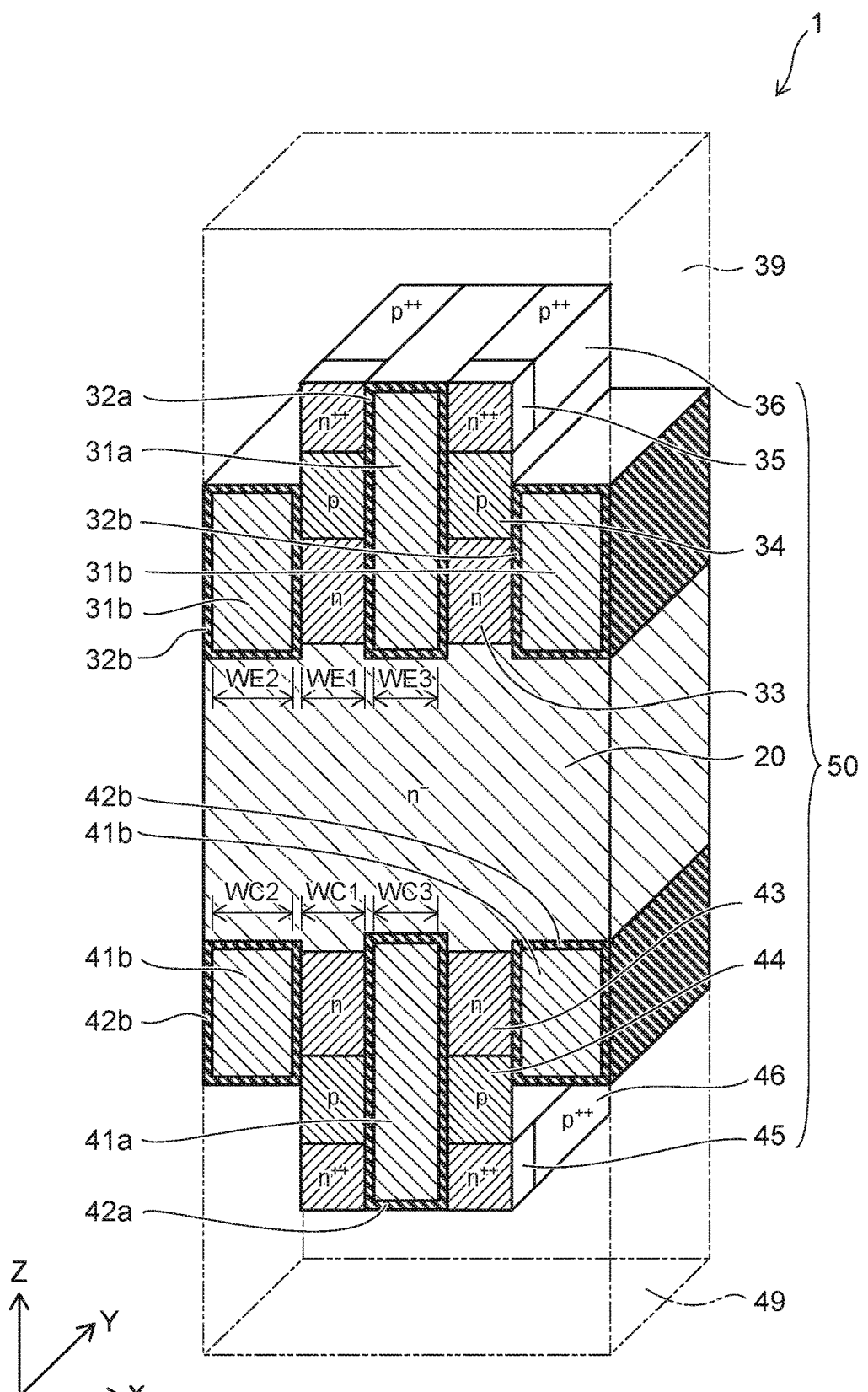
FIG. 1 is a perspective cross-sectional view showing a semiconductor device according to a first embodiment.

FIG. 1 is a perspective cross-sectional view showing a semiconductor device according to the embodiment.

As shown in FIG. 1, the semiconductor device according to the embodiment is an IEGT in which trench gate electrodes are provided in the upper surface and the lower surface.

As shown in FIG. 1, an n$^-$-type high resistance layer 20 of an n$^-$-type conductivity is provided in the semiconductor device 1 according to the embodiment. In the specification, for example, the notation of the "n$^-$-type high resistance layer 20" indicates that the conductivity type of the layer is the n-type. The superscript characters "+" and "−" indicate relative carrier concentrations and mark the characters of "p" and "n" indicating the conductivity types. For example, a region of the n-type conductivity is notated by "n$^{++}$-type," "n$^+$-type," "n-type," and "n$^-$-type" in the order of high to low carrier concentration. This is similar for the p-type as well. The carrier concentration is considered to be the effective impurity concentration. The "effective impurity concentration" refers to the concentration of the impurities contributing to the conduction of the semiconductor material, and in the case where some portion includes both an impurity that forms donors and an impurity that forms acceptors, refers to the concentration excluding the cancelled portion of the donors and the acceptors.

An XYZ orthogonal coordinate system is employed in the specification for convenience of description. Two mutually-orthogonal directions parallel to the upper surface of the n$^-$-type high resistance layer 20 are taken as an "X-direction" and a "Y-direction;" and a direction perpendicular to the upper surface is taken as a "Z-direction." The "Z-direction" is a direction that connects the collector electrode and the emitter electrode described below. Although the emitter electrode side is called "up" and the collector electrode side is called "down" in the specification for convenience of description, these notations are independent of the direction of gravity.

Emitter-side trench gate electrodes 31a and 31b that extend in the Y-direction are provided on the upper surface of the n$^-$-type high resistance layer 20. The emitter-side trench gate electrodes 31a (hereinbelow, also called simply the "electrode 31a;" this is similar for the other electrodes as well) and 31b are arranged alternately and separated from each other along the X-direction. For example, the electrodes 31a and 31b are formed of polysilicon. The length in the Z-direction of the electrode 31a is longer than the length in the Z-direction of the electrode 31b. In the Z-direction, the lower end of the electrode 31a and the lower end of the electrode 31b are at substantially the same position. On the other hand, the upper end of the electrode 31a is higher than the upper end of the electrode 31b. An insulating film 32a is provided around the electrode 31a. An insulating film 32b is provided around the electrode 31b.

An n-type base layer 33 that extends in the Y-direction is provided between the electrode 31a and the electrode 31b.

The lower surface of the n-type base layer 33 contacts the upper surface of the n⁻-type high resistance layer 20. The side surface of the n-type base layer 33 facing the X-direction is covered with the insulating film 32a and the insulating film 32b. A p-type base layer 34 that extends in the Y-direction is provided on the n-type base layer 33. The lower surface of the p-type base layer 34 contacts the upper surface of the n-type base layer 33. One side surface of the p-type base layer 34 facing the X-direction is covered with the insulating film 32a; and the lower portion of the other side surface is covered with the insulating film 32b. An n⁺⁺-type contact layer 35 and a p⁺⁺-type contact layer 36 are provided on the p-type base layer 34. The n⁺⁺-type contact layer 35 and the p⁺⁺-type contact layer 36 are arranged alternately along the Y-direction. The lower surface of the n⁺⁺-type contact layer 35 and the lower surface of the p⁺⁺-type contact layer 36 contact the upper surface of the p-type base layer 34; and one side surface of the n⁺⁺-type contact layer 35 facing the X-direction and one side surface of the p⁺⁺-type contact layer 36 facing the X-direction are covered with the insulating film 32a.

Thereby, the electrode 31a faces, with the insulating film 32a interposed, the n⁻-type high resistance layer 20, the n-type base layer 33, the p-type base layer 34, the n⁺⁺-type contact layer 35, and the p⁺⁺-type contact layer 36. The electrode 31b faces, with the insulating film 32b interposed, the n⁻-type high resistance layer 20, the n-type base layer 33, and the lower portion of the p-type base layer 34.

An emitter electrode 39 that is made of, for example, a metal is provided above the emitter-side trench gate electrodes 31a and 31b, the insulating films 32a and 32b, the n-type base layer 33, the p-type base layer 34, the n⁺⁺-type contact layer 35, and the p⁺⁺-type contact layer 36 to cover these components. The emitter electrode 39 contacts the upper surface of the insulating film 32a, the upper surface of the insulating film 32b, the upper portion of one side surface facing the X-direction of the p-type base layer 34, the upper surface and one side surface facing the X-direction of the n⁺⁺-type contact layer 35, and the upper surface and one side surface facing the X-direction of the p⁺⁺-type contact layer 36.

The configuration of the collector side is a configuration in which the configuration of the emitter side is vertically inverted. In other words, collector-side trench gate electrodes 41a and 41b that extend in the Y-direction are provided on the lower surface of the n⁻-type high resistance layer 20. The collector-side trench gate electrodes 41a and 41b are arranged alternately and separated from each other along the X-direction. For example, the electrodes 41a and 41b are formed of polysilicon. The length in the Z-direction of the electrode 41a is longer than the length in the Z-direction of the electrode 41b. In the Z-direction, the upper end of the electrode 41a and the upper end of the electrode 41b are at substantially the same position. On the other hand, the lower end of the electrode 41a is lower than the lower end of the electrode 41b. An insulating film 42a is provided around the electrode 41a. An insulating film 42b is provided around the electrode 41b.

An n-type base layer 43 that extends in the Y-direction is provided between the electrode 41a and the electrode 41b. The upper surface of the n-type base layer 43 contacts the lower surface of the n⁻-type high resistance layer 20. The side surfaces of the n-type base layer 43 facing the X-direction are covered with the insulating film 42a and the insulating film 42b. A p-type base layer 44 that extends in the Y-direction is provided under the n-type base layer 43. The upper surface of the p-type base layer 44 contacts the lower surface of the n-type base layer 43. One side surface of the p-type base layer 44 facing the X-direction is covered with the insulating film 42a; and the upper portion of the other side surface is covered with the insulating film 42b. An n⁺⁺-type contact layer 45 and a p⁺⁺-type contact layer 46 are provided under the p-type base layer 44. The n⁺⁺-type contact layer 45 and the p⁺⁺-type contact layer 46 are arranged alternately along the Y-direction. The upper surface of the n⁺⁺-type contact layer 45 and the upper surface of the p⁺⁺-type contact layer 46 contact the lower surface of the p-type base layer 44; and one side surface of the n⁺⁺-type contact layer 45 facing the X-direction and one side surface of the p⁺⁺-type contact layer 46 facing the X-direction are covered with the insulating film 42a.

A collector electrode 49 that is made of, for example, a metal is provided below the collector-side trench gate electrodes 41a and 41b, the insulating films 42a and 42b, the n-type base layer 43, the p-type base layer 44, the n⁺⁺-type contact layer 45, and the p⁺⁺-type contact layer 46 to cover these components. The collector electrode 49 contacts the lower surface of the insulating film 42a, the lower surface of the insulating film 42b, the lower portion of one side surface facing the X-direction of the p-type base layer 44, the lower surface and one side surface facing the X-direction of the n⁺⁺-type contact layer 45, and the lower surface and one side surface facing the X-direction of the p⁺⁺-type contact layer 46.

Thereby, the electrode 41a faces, with the insulating film 42a interposed, the n⁻-type high resistance layer 20, the n-type base layer 43, the p-type base layer 44, the n⁺⁺-type contact layer 45, and the p⁺⁺-type contact layer 46. The electrode 41b faces, with the insulating film 42b interposed, the n⁻-type high resistance layer 20, the n-type base layer 43, and the upper portion of the p-type base layer 44.

The n⁻-type high resistance layer 20, the n-type base layer 33, the p-type base layer 34, the n⁺⁺-type contact layer 35, the p⁺⁺-type contact layer 36, the n-type base layer 43, the p-type base layer 44, the n⁺⁺-type contact layer 45, and the p⁺⁺-type contact layer 46 are generally called a semiconductor portion 50. For example, the semiconductor portion 50 is formed as one body of monocrystalline silicon. For example, the insulating films 32a, 32b, 42a, and 42b are formed of silicon oxide. In FIG. 1, the emitter electrode 39 and the collector electrode 49 are illustrated by double dot-dash lines for easier viewing of the drawing.

To further promote the injection of the electrons (the n-type carrier) of the emitter side by the electron IE effect, it is effective to design a width WE1 to be narrow and favorable to set the width WE1 to be, for example, 1 μm or less, where the width of the emitter-side trench gate electrode 31a in the X-direction is WE3, the width of the emitter-side trench gate electrode 31b in the X-direction is WE2, and the distance in the X-direction between the electrode 31a and the electrode 31b, i.e., the width of the n-type base layer 33, the p-type base layer 34, the n⁺⁺-type contact layer 35, and the p⁺⁺-type contact layer 36 on the emitter side is WE1. It is possible to further increase the electron IE effect by designing the width WE2 and the width WE3 to be wider than the width WE1.

For example, it is favorable when $WE2 > 2 \times WE1$, and $WE3 > 2 \times WE1$;

and more favorable when $WE2 > 10 \times WE1$, and $WE3 > 10 \times WE1$.

The width WE2 and the width WE3 may be configured by single trenches having wide widths (referring to FIG. 27, etc.) or multiple subdivided trenches.

This is similar for the collector side as well. To further promote the injection of the holes (the p-type carrier) of the collector side by the hole IE effect, it is effective to design a width WC1 to be narrow and favorable to set the width WC1 to be, for example, 1 μm or less, where the width of the collector-side trench gate electrode 41*a* is WC3, the width of the collector-side trench gate electrode 41*b* is WC2, and the distance between the electrode 41*a* and the electrode 41*b*, i.e., the width of the n-type base layer 43, the p-type base layer 44, the $n^{++}$-type contact layer 45, and the $p^{++}$-type contact layer 46 on the collector side, is WC1. It is possible to further increase the hole IE effect by designing the width WC2 and the width WC3 to be wider than the width WC1.

For example, it is favorable when $$WC2 > 2 \times WC1, \text{ and}$$

$$WC3 > 2 \times WC1;$$

and more favorable when $$WC2 > 10 \times WC1, \text{ and}$$

$$WC3 > 10 \times WC1.$$

The width WC2 and the width WC3 may be configured by single trenches having wide widths (referring to FIG. 27, etc.) or multiple subdivided trenches.

Operations of the semiconductor device according to the embodiment, i.e., a method for driving the semiconductor device according to the embodiment, will now be described.

First, the basic driving method will be described.

Figure 2A:
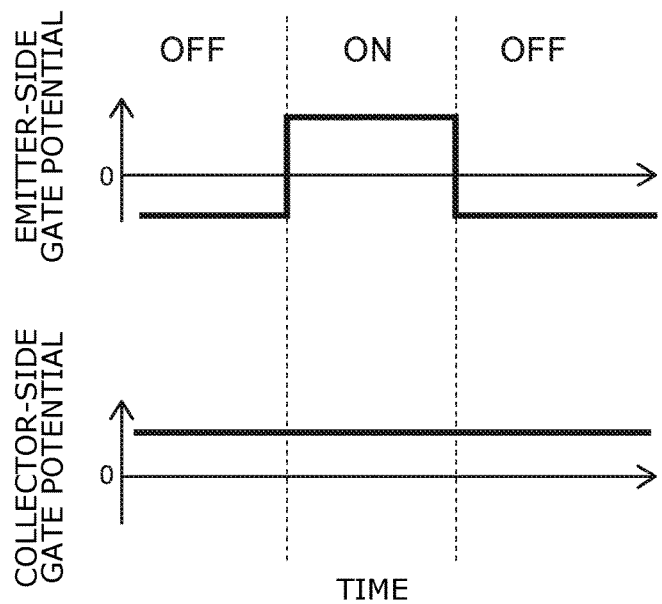
FIGS. 2A and 2B are graphs of operations of the semiconductor device according to the first embodiment, where the horizontal axis is time, and the vertical axis is the gate potential.
Figure 2B:
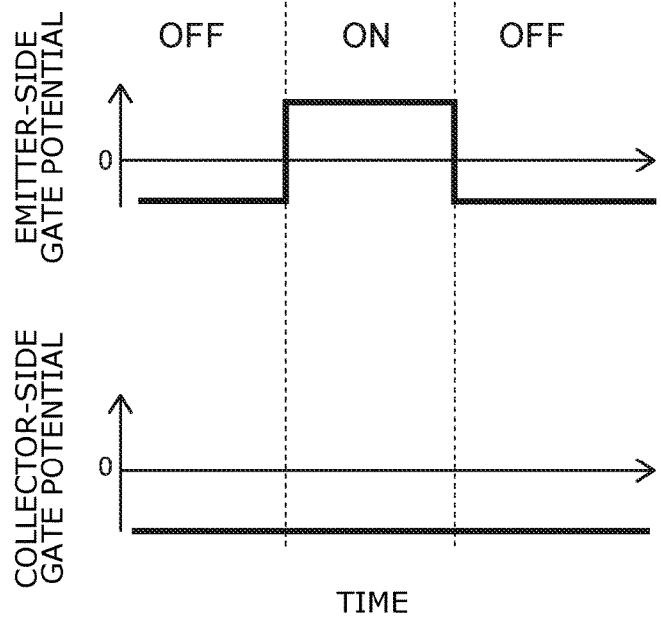

FIGS. 2A and 2B are graphs of operations of the semiconductor device according to the embodiment, where the horizontal axis is time, and the vertical axis is the gate potential; FIG. 2A shows a MOSFET mode; and FIG. 2B shows an IEGT mode.

Figure 3:
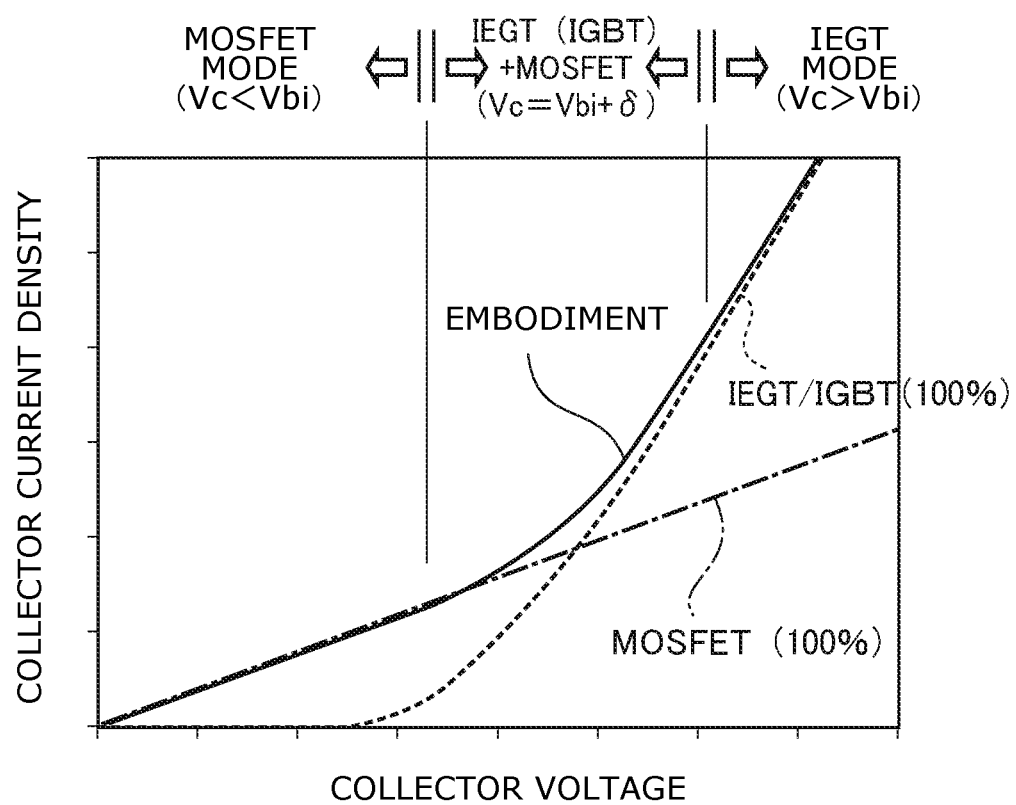
FIG. 3 is a graph of the relationship between the collector voltage and the collector current density of the semiconductor device according to the first embodiment, where the horizontal axis is the collector voltage, and the vertical axis is the collector current density.

FIG. 3 is a graph of the relationship (the V-J characteristic) between the collector voltage and the collector current density of the semiconductor device according to the embodiment, where the horizontal axis is the collector voltage, and the vertical axis is the collector current density.

Figures 4A, 4B:
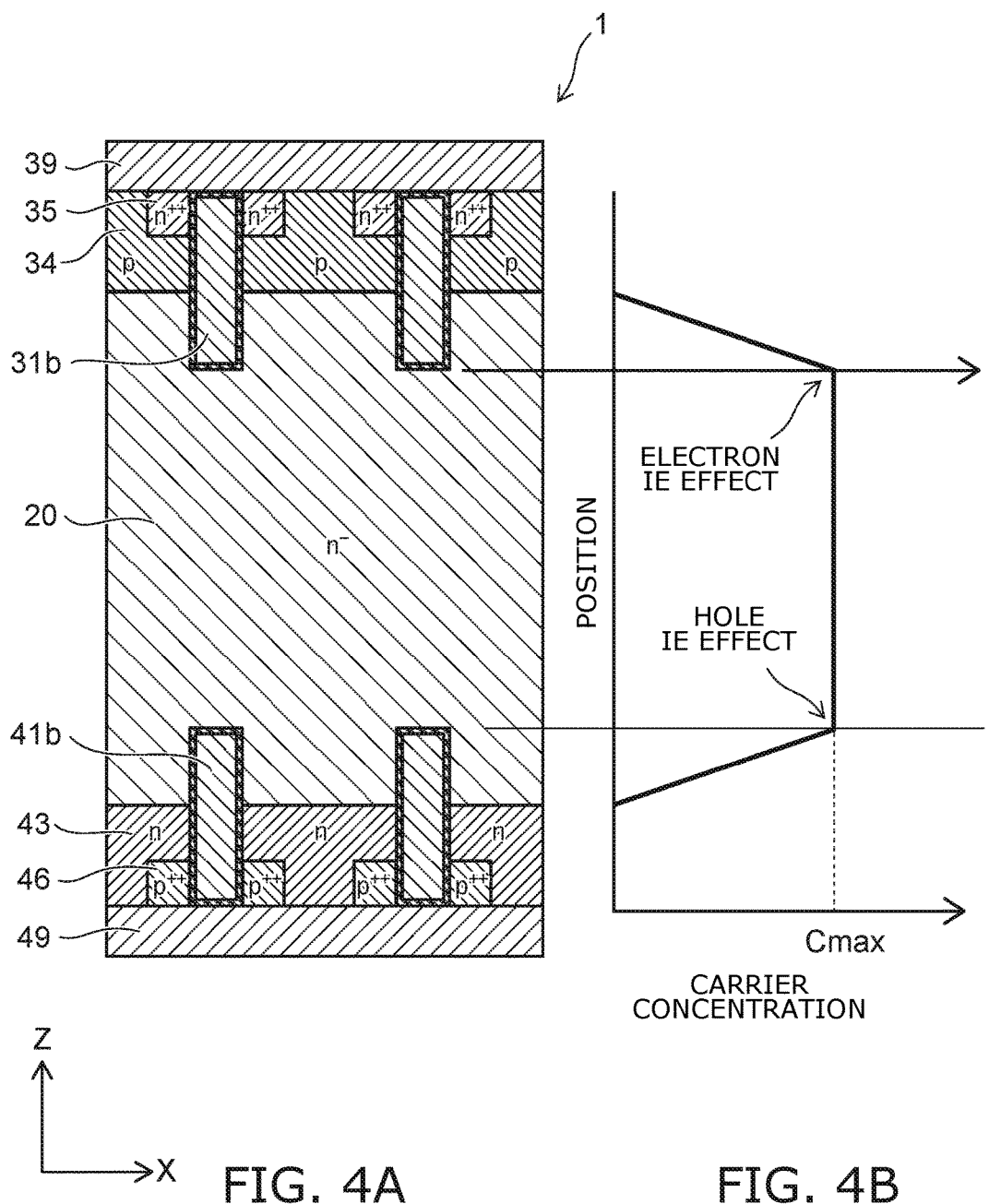
FIG. 4A schematically shows the semiconductor device according to the first embodiment.
FIG. 4B is a graph of the excess carrier concentration distribution inside the high resistance layer in the ON state of the IEGT mode, where the vertical axis is the position, and the horizontal axis is the excess carrier concentration.

FIG. 4A schematically shows the semiconductor device according to the embodiment; and FIG. 4B is a graph of the excess carrier concentration distribution inside the high resistance layer in the ON state of the IEGT mode, where the vertical axis is the position, and the horizontal axis is the excess carrier concentration.

Compared to FIG. 1, a simplified configuration of the semiconductor device is shown in FIG. 4A. The position of the vertical axis of FIG. 4B corresponds to FIG. 4A. The excess carrier concentration of the n-type and the excess carrier concentration of the p-type are equal to each other.

As shown in FIG. 1, a collector voltage is applied between the emitter electrode 39 and the collector electrode 49 so that the emitter electrode 39 is negative and the collector electrode 49 is positive. For example, a ground potential is applied to the emitter electrode 39.

Then, as shown in FIG. 2A, by setting the potentials of the collector-side trench gate electrodes 41*a* and 41*b* (hereinbelow, also called the "collector-side gate potential") to a potential that is positive with respect to the potential (the collector potential) of the collector electrode 49 and setting a collector voltage Vc to be lower than a built-in voltage Vbi, the inflow of the holes from the collector electrode 49 is impeded; and on the other hand, an inversion layer is formed in the p-type base layer 44; the resistance of the electrons flowing in the collector electrode 49 from the $n^-$-type high resistance layer 20 decreases; and electrons are injected through the path of the $n^{++}$-type contact layer 45, the inversion layer of the p-type base layer 44, and the n-type base layer 43. Thereby, the semiconductor device 1 operates as a unipolar MOSFET having only electrons as the carrier.

When the potentials of the emitter-side trench gate electrodes 31*a* and 31*b* (hereinbelow, also called the "emitter-side gate potential") are set to negative potentials in this state, an inversion layer is not formed in the p-type base layer 34; the electron current is blocked because a reverse bias is applied to the p-n interface between the p-type base layer 34 and the n-type base layer 33; and the semiconductor device 1 is switched to the OFF state.

On the other hand, when the emitter-side gate potential is set to a positive potential, an inversion layer is formed in the p-type base layer 34; and electrons are injected through the path of the $n^{++}$-type contact layer 35, the inversion layer of the p-type base layer 34, and the n-type base layer 33. Thereby, an electron current flows inside the semiconductor portion 50; and the semiconductor device 1 is switched to the ON state.

As shown in FIG. 2B, when the collector-side gate potential is set to a potential that is negative with respect to the collector potential, an inversion layer is formed in the n-type base layer 43; and by applying the collector voltage Vc, holes are injected through the path of the $p^{++}$-type contact layer 46, the p-type base layer 44, and the inversion layer of the n-type base layer 43. Thereby, the holes that are injected from the collector electrode 49 into the $n^-$-type high resistance layer 20 increase; and the semiconductor device 1 functions as an IGBT (an IEGT) having electrons and holes as carriers.

When the emitter-side gate potential is set to a negative potential in this state, an inversion layer is not formed in the p-type base layer 34; and the semiconductor device 1 is switched to the OFF state. On the other hand, when the emitter-side gate potential is set to a positive potential, an inversion layer is formed in the p-type base layer 34; and electrons are injected. Thereby, the semiconductor device 1 is switched to the ON state as a bipolar IEGT having electrons and holes as carriers.

Thus, the semiconductor device 1 according to the embodiment can be switched between the MOSFET mode and the IEGT mode by selecting the carrier injected into the semiconductor portion 50 by controlling the collector-side gate potential. Modes that are intermediate between the MOSFET mode and the IEGT mode also are possible. A diode mode also is possible. The ON state and the OFF state can be switched by controlling the emitter-side gate potential.

In the semiconductor device 1 shown in FIG. 1, by reversing the potential of the gate and the potentials of the emitter and the collector and by combining the control methods described above, a single IEGT can function to cause currents to flow in two directions (ON) and function to impede the current (OFF).

Generally, in a unipolar device such as a MOSFET or the like, there is no built-in voltage and a current flows from a low applied voltage (substantially 0 V); but the current-carrying capacity of a unipolar device is nowhere near that of a bipolar device such as an IGBT, an IEGT, a thyristor, a GCT (Gate Commutated Turn-Off thyristor), etc., in the region where the applied voltage is the built-in voltage or higher. While the current-carrying capacity of the bipolar device is superior in the region where the applied voltage is the built-in voltage or higher, a current does not flow when the applied voltage is less than the built-in voltage. The built-in voltage of silicon (Si) is about 0.5 V; and the built-in voltage of silicon carbide (SiC) is about 3.5 V.

As shown in FIG. 3, in the semiconductor device 1 according to the embodiment as well, the collector current density, i.e., the density of the current flowing from the collector electrode 49 to the emitter electrode 39, is higher for a MOSFET than for an IEGT when the collector voltage, i.e., the voltage between the collector electrode 49 and the emitter electrode 39, is relatively low. On the other hand, the collector current density is higher for an IEGT than for a MOSFET when the collector voltage is relatively high. Therefore, in the semiconductor device 1, the collector current density can be increased for a wide range of collector voltages by switching the operation mode according to the collector voltage.

In the semiconductor device 1 as shown in FIGS. 4A and 4B, the discharge of the holes from the semiconductor portion 50 toward the emitter electrode 39 is regulated because the emitter-side trench gate electrodes 31a and 31b are provided on the emitter side. Thereby, the injection of the electrons from the emitter electrode 39 into the semiconductor portion 50 is promoted. In other words, an IE (Injection Enhanced) effect of the electrons is obtained. On the other hand, the discharge of the electrons from the semiconductor portion 50 toward the collector electrode 49 is regulated because the collector-side trench gate electrodes 41a and 41b are provided on the collector side. Thereby, the injection of the holes from the collector electrode 49 into the semiconductor portion 50 is promoted. In other words, an IE effect of the holes is obtained.

As a result, the carrier can be stored at a high density inside the n$^-$-type high resistance layer 20 of the semiconductor portion 50. A maximum value Cmax of the carrier concentration of the n$^-$-type high resistance layer 20 is, for example, $1 \times 10^{13}$ to $1 \times 10^{19}$ cm$^{-3}$. Thereby, the ON resistance can be reduced; and the collector current can be increased even further.

A practical driving method will now be described.

According to the embodiment, various operations are possible by adjusting the timing of the switching of the operation mode and the switching ON/OFF.

Figure 5:
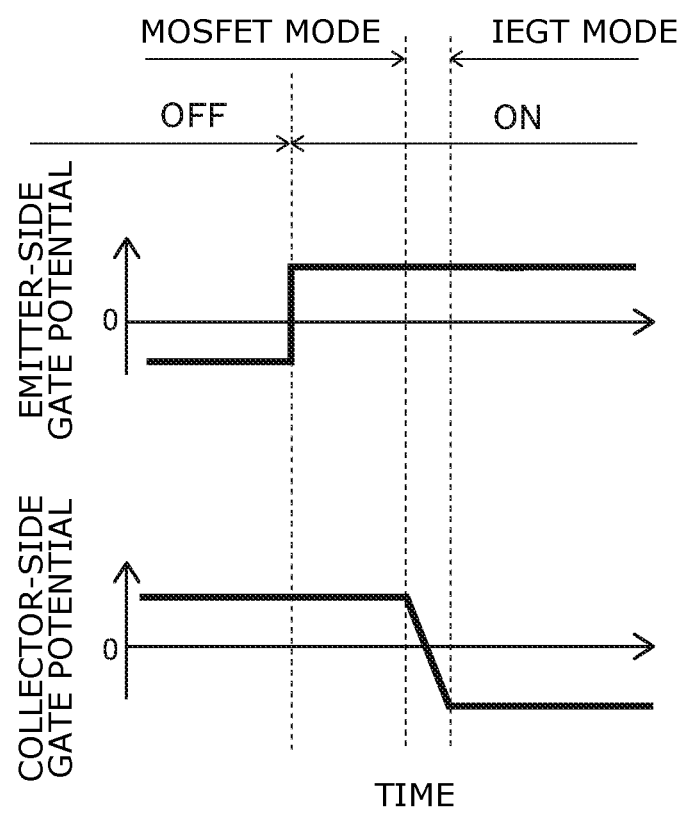
FIG. 5 is a graph of the turn-on operation of the semiconductor device according to the first embodiment, where the horizontal axis is time, and the vertical axis is the gate potential.

FIG. 5 is a graph of the turn-on operation of the semiconductor device according to the embodiment, where the horizontal axis is time, and the vertical axis is the gate potential.

Figure 6:
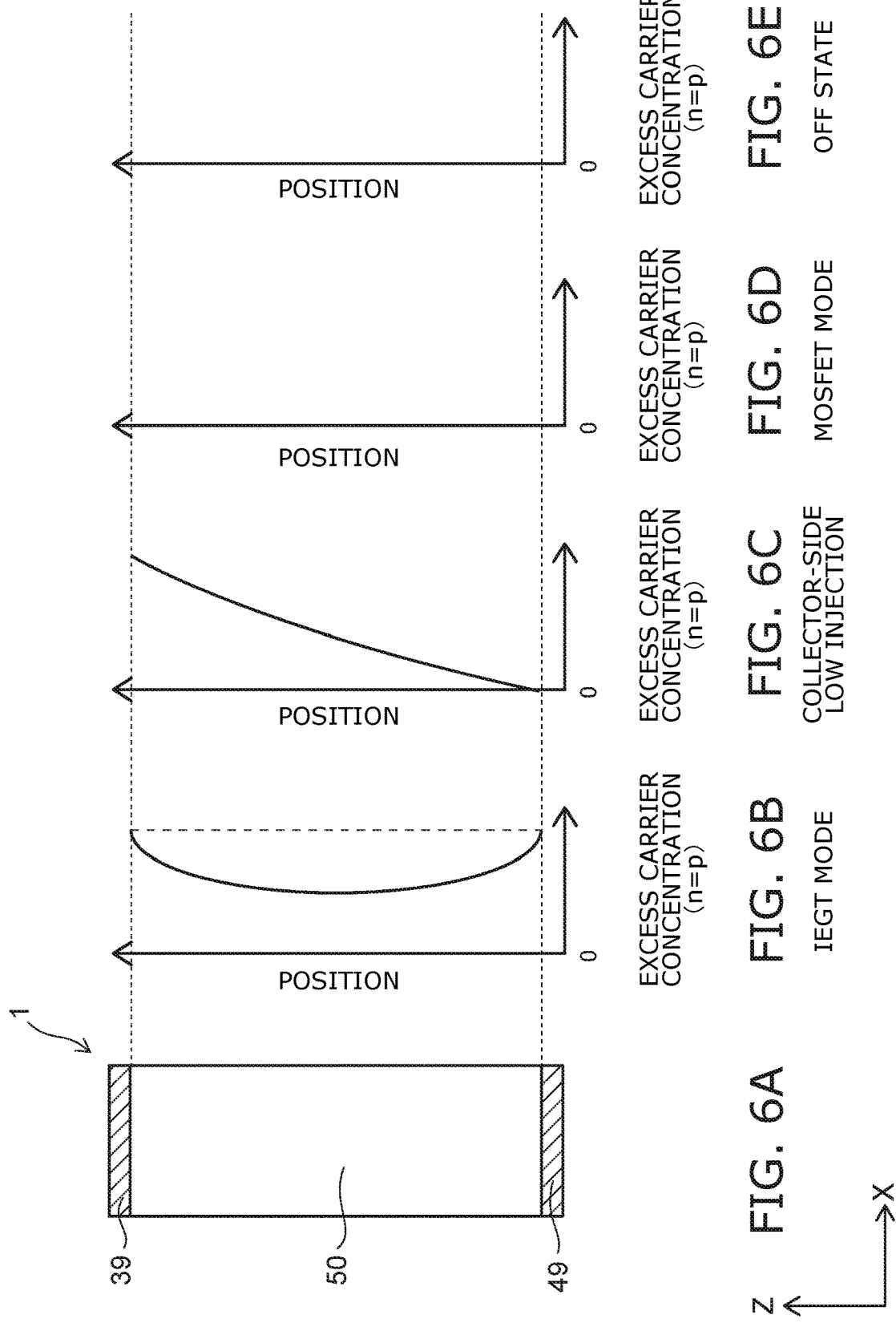
FIG. 6A schematically shows the semiconductor device according to the first embodiment.
FIGS. 6B to 6D show the excess carrier distribution inside the semiconductor device, where the vertical axis is the position in the Z-direction, and the horizontal axis is the excess carrier concentration.
FIG. 6E shows the OFF state.

FIG. 6A schematically shows the semiconductor device according to the embodiment; FIGS. 6B to 6D show the excess carrier distribution inside the semiconductor device, where the vertical axis is the position in the Z-direction, and the horizontal axis is the excess carrier concentration; FIG. 6B shows the ON state of the IEGT mode; FIG. 6C shows the case where the collector side has low injection in the ON state of the IEGT mode; FIG. 6D shows the ON state of the MOSFET mode; and FIG. 6E shows the OFF state.

The position shown at the vertical axis for FIGS. 6B to 6E corresponds to FIG. 6A.

In this operation as shown in FIG. 5, turn-on is performed in the MOSFET mode; and subsequently, the mode transitions to the IEGT mode in the ON state. Because the ON state of the MOSFET mode is a state in which the inflow of the holes is regulated and only the electron current flows, the excess carrier concentration distribution is a distribution in which the emitter side is high and the collector side is low as shown in FIG. 6C. Because the ON state of the IEGT mode is a state in which the holes and the electrons both flow in, the excess carrier concentration distribution is a distribution in which both the emitter side and the collector side are high as shown in FIG. 6B. The broken line of FIG. 6B illustrates the excess carrier concentration distribution in the case where the lifetime of the carriers in the n$^-$-type high resistance layer 20 is long.

Figure 7:
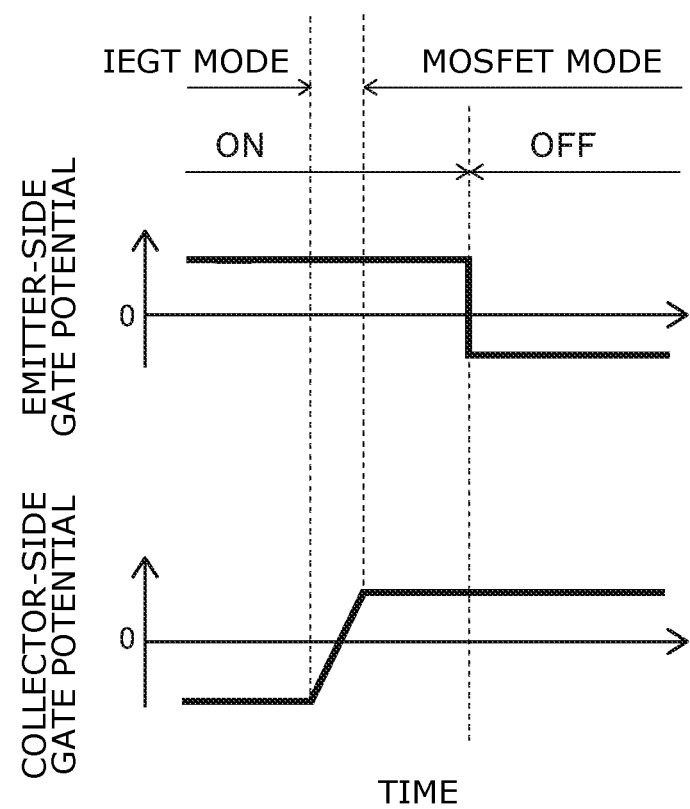
FIG. 7 is a graph of the turn-off operation of the semiconductor device according to the first embodiment, where the horizontal axis is time, and the vertical axis is the gate potential.

FIG. 7 is a graph of the turn-off operation of the semiconductor device according to the embodiment, where the horizontal axis is time, and the vertical axis is the gate potential.

In this operation as shown in FIG. 7, the mode transitions from the ON state of the IEGT mode to the ON state of the MOSFET mode; and subsequently, turn-off is performed in the MOSFET mode. In the ON state of the IEGT mode, the excess carrier concentration distribution is a distribution in which both pole sides are high as shown in FIG. 6B. When the potentials of the collector-side trench gate electrodes 41a and 41b are reduced from this state, the inflow of the holes stops; the holes inside the semiconductor portion 50 are discharged; and therefore, the excess carrier concentration distribution is a distribution in which the emitter side decreases as shown in FIG. 6C. Then, when the semiconductor device 1 transitions completely to the MOSFET mode, the excess carrier concentration inside the semiconductor portion 50 is substantially zero as shown in FIG. 6D. Even when turn-off is performed subsequently, the excess carriers inside the semiconductor portion 50 remain substantially zero as shown in FIG. 6E. By operating using such a method, the excess carriers at turn-off can be reduced; and the tail portion of the current caused by excess carriers can be suppressed. As a result, the turn-off loss can be reduced.

Although an example of an operation is shown in FIG. 5 in which the semiconductor device 1 transitions to the ON state of the IEGT mode after being in the ON state of the MOSFET mode, and an example of an operation is shown in FIG. 7 in which the semiconductor device 1 is switched to the OFF state after transitioning from the ON state of the IEGT mode to the ON state of the MOSFET mode, this is not limited thereto. Various operations are possible by using different timing for the potential change of the emitter-side trench gate electrodes 31a and 31b and the potential change of the collector-side trench gate electrodes 41a and 41b. For example, it is also possible to control the semiconductor device 1 to switch from the OFF state to the ON state in the IEGT mode without transitioning to the MOSFET mode.

In the embodiment, as a modification of the operation shown in FIG. 7, the applied voltage and the timing of the applied voltage for the gate on the collector side and the applied voltage and the timing of the applied voltage for the gate on the emitter side can be controlled to reduce the turn-off loss or turn-on loss as much as possible.

For example, when a depletion layer or a strong space charge region undesirably spreads from the opposite side of the side used as the major junction when in the OFF state, a loss that is larger than that of normal operation occurs; but in the embodiment, such abnormal operations can be avoided effectively by appropriate gate control.

Similarly, by controlling each of the gate applied voltages and the timing of the gate applied voltages, it is possible to prevent abnormal operations causing element breakdown and/or heat generation and the undesirable behavior of the carriers in the element interior in the operation of the semiconductor device 1.

The potential of the emitter-side trench gate electrode 31a and the potential of the electrode 31b may be controlled independently from each other. For example, the potential of one of the electrode 31a or 31b may be set to be the same as the potential of the emitter electrode 39 or the potential of the collector electrode 49. Or, the potential of the collector-side trench gate electrode 41a and the potential of the electrode 41b may be controlled independently from each other. For example, the potential of one of the electrode 41a or 41b may be set to be the same as the potential of the emitter electrode 39 or the potential of the collector electrode 49. By such settings, the electrostatic capacitance of the trench gate electrode can be reduced; and high-speed and stable operations of the semiconductor device 1 are possible.

An example in which a DC-DC converter includes the semiconductor device according to the embodiment will now be described.

Figures 8A, 8B:
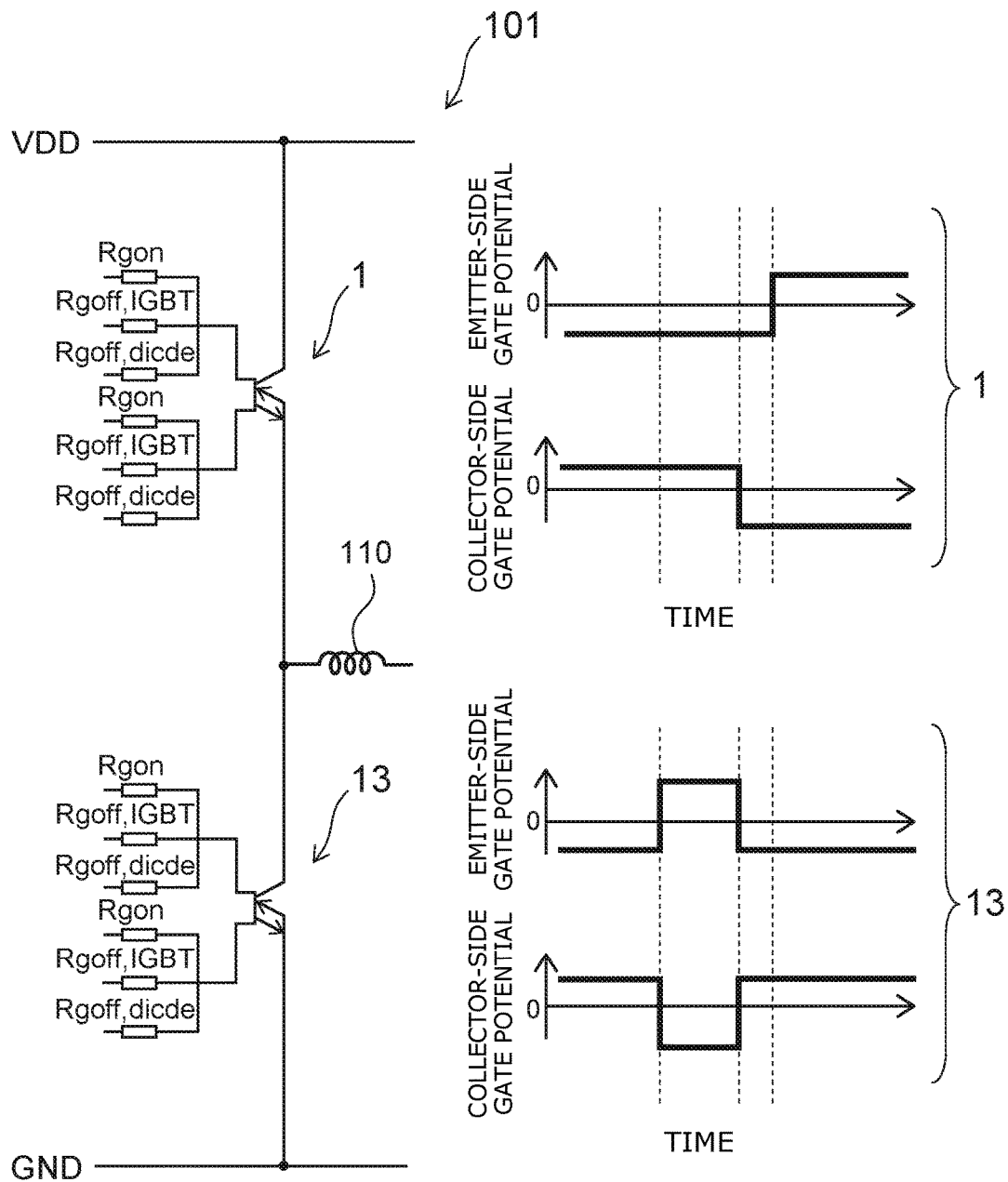
FIG. 8A is a circuit diagram showing the DC-DC converter of the first embodiment.
FIG. 8B is a graph of the operation of the DC-DC converter, where the horizontal axis is time, and the vertical axis is the gate potential.

FIG. 8A is a circuit diagram showing the DC-DC converter of the embodiment; and FIG. 8B is a graph of the operation of the DC-DC converter, where the horizontal axis is time, and the vertical axis is the gate potential.

In a DC-DC converter 101 of the embodiment as shown in FIG. 8A, the semiconductor device 1 and a semiconductor device 13 are connected in series between a high potential-side power supply interconnect VDD and a low potential-side power supply interconnect GND. The semiconductor device 1 is connected to the high potential-side power supply potential interconnect VDD. The semiconductor device 13 is connected to the low potential-side power supply interconnect GND. The semiconductor device 13 is a p-n diode. The configuration of the semiconductor device 13 is described below in the thirteenth embodiment (referring to FIG. 20). One terminal of an inductor 110 is connected to the connection point between the semiconductor device 1 and the semiconductor device 13. The other terminal of the inductor 110 is connected to a load (not shown).

As shown in FIG. 8B, the semiconductor device 1 on the high potential side is set to the MOSFET mode when switching the semiconductor device 13 on the low potential side to the ON state and switching the semiconductor device 1 to the OFF state. Then, after switching the semiconductor device 13 to the OFF state, the semiconductor device 1 is caused to transition to the IEGT mode; and the semiconductor device 1 is switched to the ON state.

Similarly, by controlling each of the gate applied voltages and the timing of the gate applied voltages for the semiconductor device 13 and the semiconductor device 1, the semiconductor device 13 and the semiconductor device 1 can function as slow diodes, fast diodes, MOSFETs, MOSFETs including a protection function, IEGTs (IGBTs), IEGTs (IGBTs) including a protection function, the reverse blocking type of each of these devices, etc. These functions of the semiconductor device 13 and the semiconductor device 1 can be realized by controlling each of the gate applied voltages and the timing of the gate applied voltages at any timing when operating or when not operating the application device. Thus, because one semiconductor device can have many functions and the optimal operation of each function is possible, the number of components of the application device decreases drastically; the reliability increases; and the performance also improves drastically.

Effects of the embodiment will now be described.

As described above, according to the embodiment, both a low ON resistance and a low turn-off loss can be realized. More stable operations are possible by selecting the timing of the operation mode and ON/OFF control according to the purpose.

According to the embodiment, the injection efficiency of the electrons and holes on the emitter side and the injection efficiency of the electrons and holes on the collector side can be controlled freely. As a result, a large current can be controlled efficiently in the semiconductor device 1 and the DC-DC converter 101.

Although an example is illustrated in the embodiment in which the semiconductor portion 50 is formed of silicon, this is not limited thereto; and the semiconductor portion 50 may be formed of a semiconductor material having a larger bandgap than silicon such as silicon carbide (SiC), gallium nitride (GaN), diamond, etc.

The proportion of the electron current flowing from the n⁻-type high resistance layer 20 toward the collector electrode 49 can be reduced by optimizing the disposition of the diffusion layers or the geometrical configurations of the collector-side trench gate electrodes 41a and 41b, etc. Thereby, the IE effect of the holes increases further; and more holes can be injected into the n⁻-type high resistance layer 20. As a result, the ON resistance of the semiconductor device 1 can be reduced even further.

Second Embodiment

A second embodiment will now be described.

Figure 9:
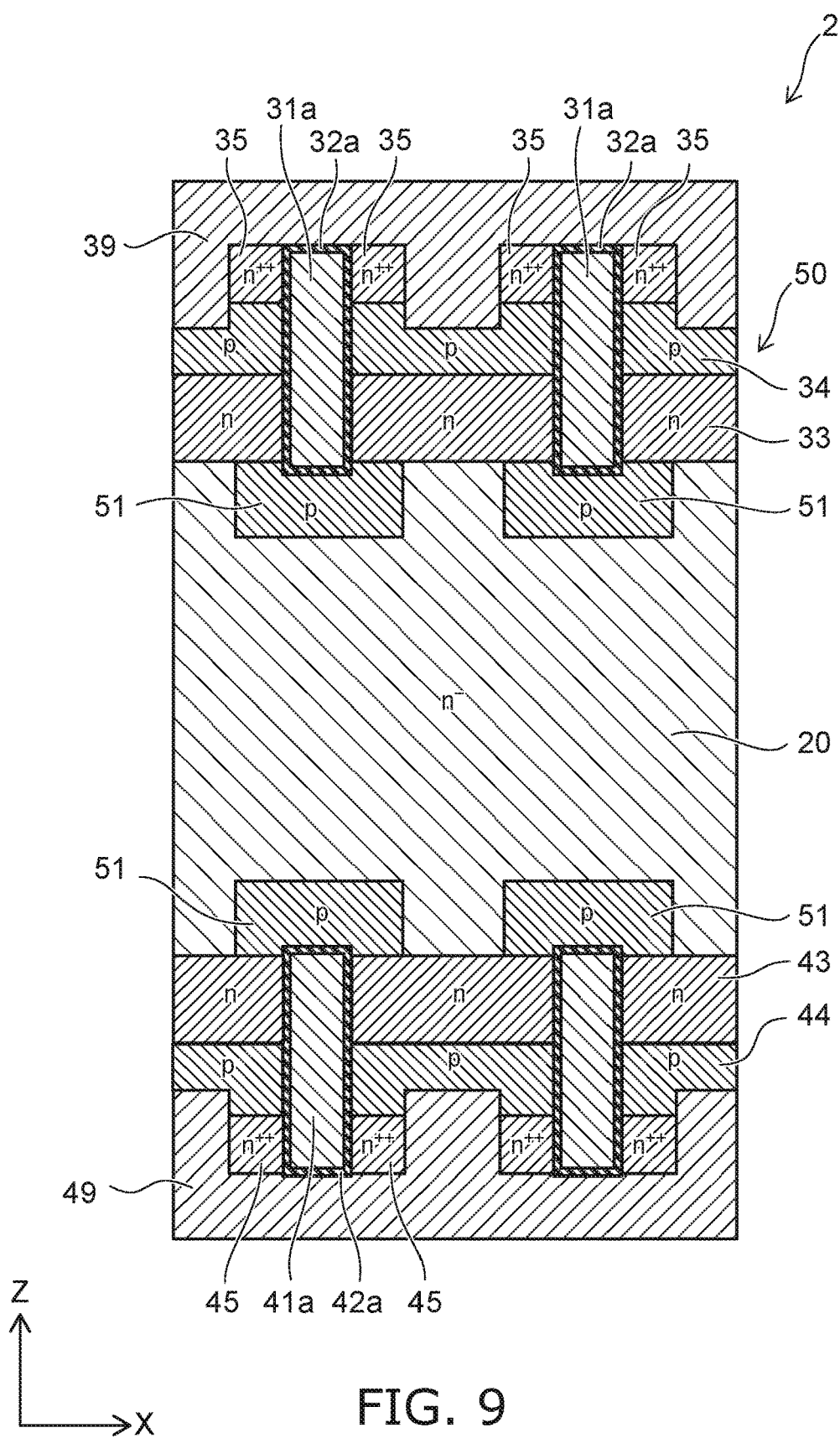
FIG. 9 is a cross-sectional view showing a semiconductor device according to a second embodiment.

FIG. 9 is a cross-sectional view showing a semiconductor device according to the embodiment.

In the semiconductor device 2 according to the embodiment as shown in FIG. 9, the semiconductor portion 50 is formed of silicon carbide (SiC). Compared to the semiconductor device 1 according to the first embodiment described above (referring to FIG. 1), the collector-side trench gate electrode 31b and the emitter-side trench gate electrode 41b are not provided. Also, a p-type layer 51 is formed between the n⁻-type high resistance layer 20 and the insulating film 32a and between the n⁻-type high resistance layer 20 and the insulating film 42a.

The following relationship is favorable, where the thickness of the n⁻-type high resistance layer 20 in the Z-direction is D (cm), and the specific resistance of the n⁻-type high resistance layer 20 is R (Ω·cm).

$$R/D > 10^4$$

According to the embodiment, both a low ON resistance and a high switching speed can be realized by forming the semiconductor portion 50 of silicon carbide which has a larger bandgap than silicon. By providing the p-type layer 51 between the n⁻-type high resistance layer 20 and the insulating films 32a and 42a, the electric field applied to the interface between the n⁻-type high resistance layer 20 made of silicon carbide and to the insulating films 32a and 42a made of silicon oxide can be relaxed.

Otherwise, the configuration, the operations, and the effects of the embodiment are similar to those of the first embodiment described above.

Third Embodiment

A third embodiment will now be described.

Figure 10:
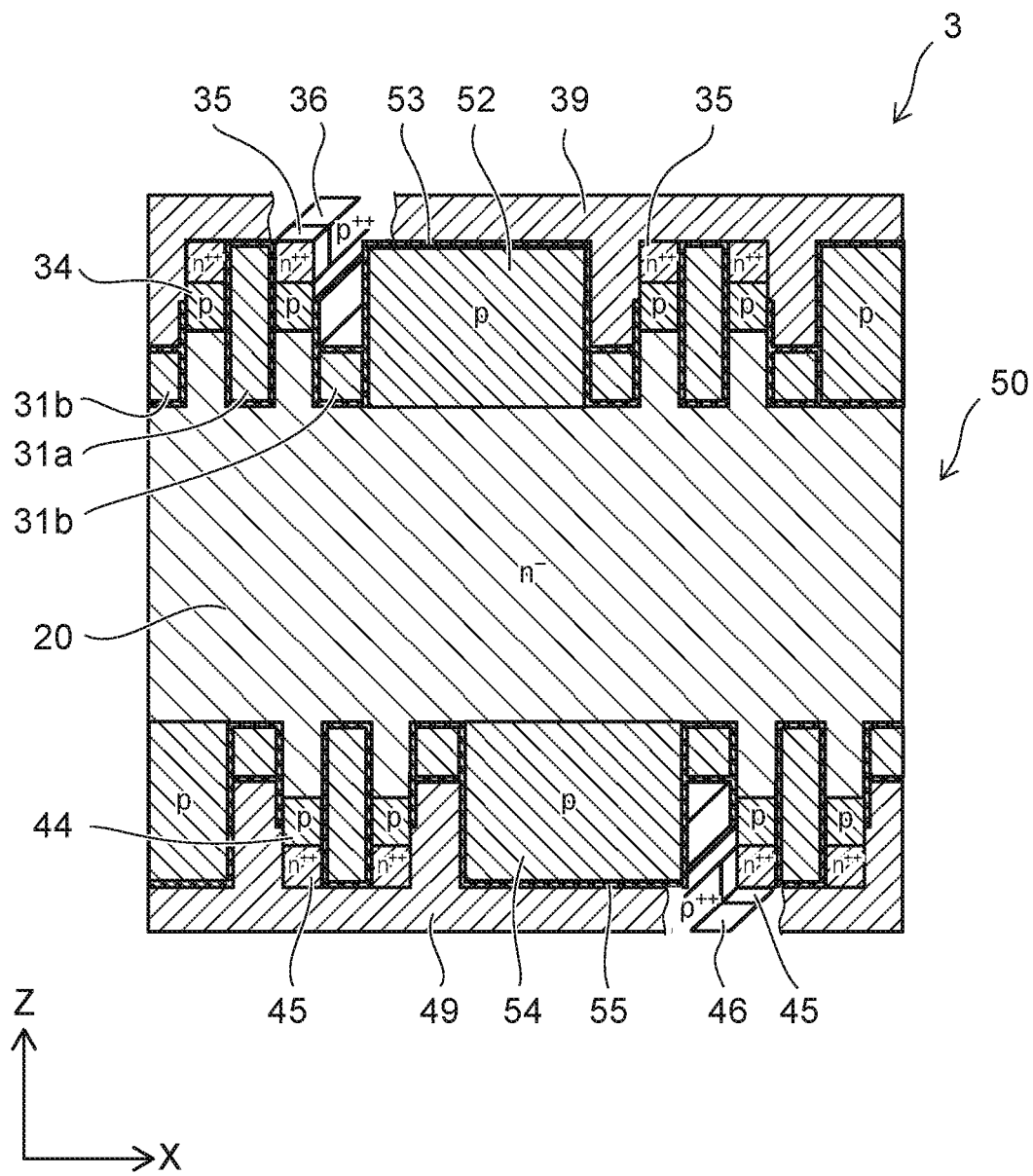
FIG. 10 is a cross-sectional view showing a semiconductor device according to a third embodiment.

FIG. 10 is a cross-sectional view showing a semiconductor device according to the embodiment.

However, a portion of FIG. 10 is shown as a perspective view for convenience of illustration.

As shown in FIG. 10, the semiconductor device 3 according to the embodiment differs from the semiconductor device 1 according to the first embodiment described above (referring to FIG. 1) in that the lengths in the Z-direction of the electrodes 31b and 41b are short, the n-type base layer 33 and the n-type base layer 43 are not provided, a p-type buffer layer 52 is provided between the electrodes 31b, and a p-type buffer layer 54 is provided between the electrodes 41b. The upper portion of the p-type buffer layer 52 is positioned inside the emitter electrode 39; and an insulating film 53 is provided between the p-type buffer layer 52 and the emitter electrode 39. Similarly, the lower portion of the p-type buffer layer 54 is positioned inside the collector electrode 49; and an insulating film 55 is provided between the p-type buffer layer 54 and the collector electrode 49.

According to the embodiment, the connection portion between the semiconductor portion 50 and the emitter electrode 39 is thinned out by providing the p-type buffer layer 52 and the insulating film 53. Thereby, the holes are stored on the emitter side of the semiconductor portion 50; and the IE effect of the electrons can be increased further. Similarly, the connection portion between the semiconductor portion 50 and the collector electrode 49 is thinned out by providing the p-type buffer layer 54 and the insulating film 55. Thereby, the electrons are stored on the collector side of the semiconductor portion 50; and the IE effect of the holes can be increased further.

Otherwise, the configuration, the operations, and the effects of the embodiment are similar to those of the first embodiment described above.

Fourth Embodiment

A fourth embodiment will now be described.

Figure 11:
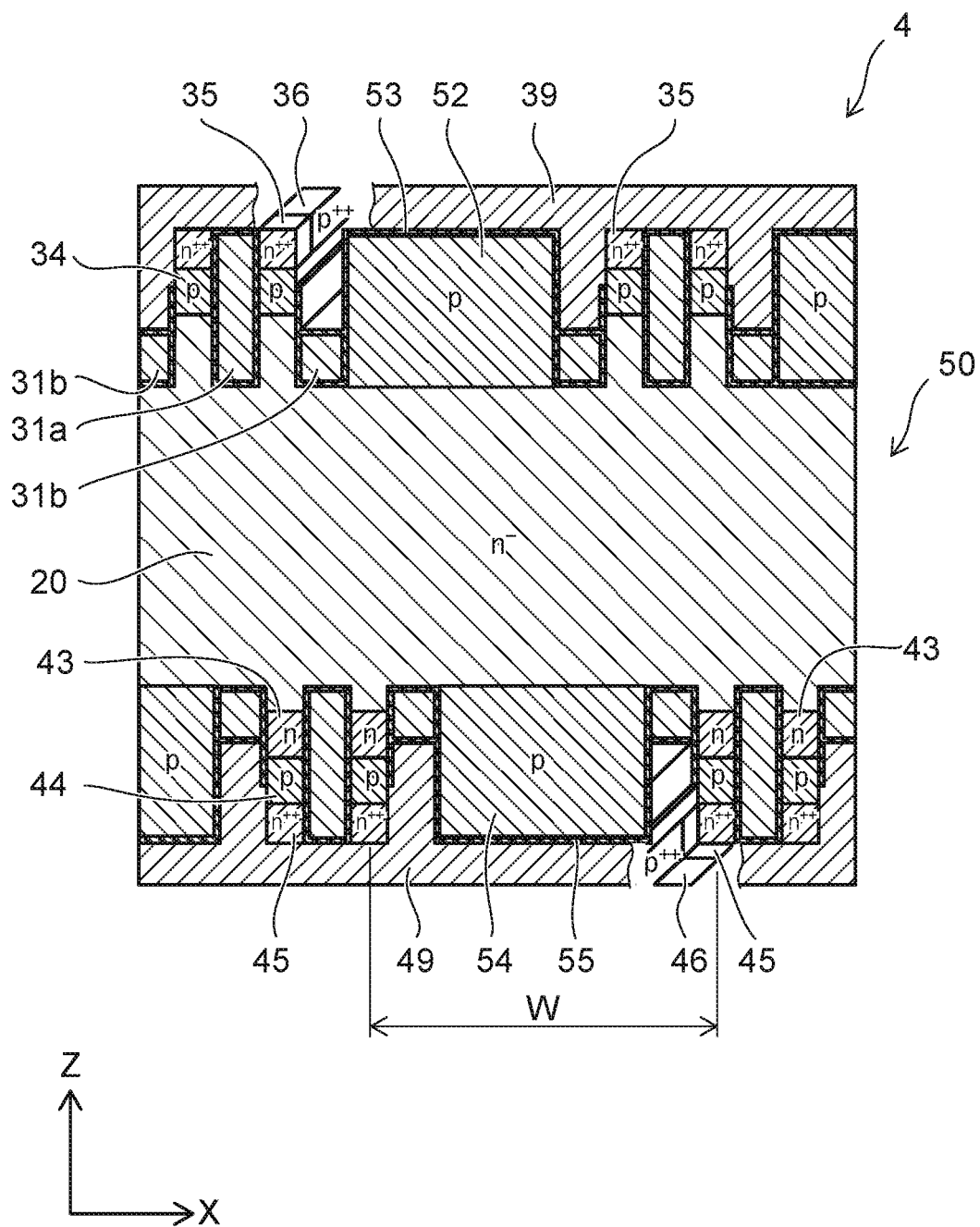
FIG. 11 is a cross-sectional view showing a semiconductor device according to a fourth embodiment.

FIG. 11 is a cross-sectional view showing a semiconductor device according to the embodiment.

However, a portion of FIG. 11 is shown as a perspective view for convenience of illustration.

In the semiconductor device 4 according to the embodiment as shown in FIG. 11, the n-type base layer 43 is provided in addition to the configuration of the semiconductor device 3 according to the third embodiment described above. By providing the n-type base layer 43, the discharge of the holes is suppressed even further. Therefore, a distance W in the X-direction of the n-type base layer 43, the p-type base layer 44, the $n^{++}$-type contact layer 45, and the $p^{++}$-type contact layer 46 can be increased; and the formation is easy.

Otherwise, the configuration, the operations, and the effects of the embodiment are similar to those of the third embodiment described above.

Fifth Embodiment

A fifth embodiment will now be described.

Figure 12:
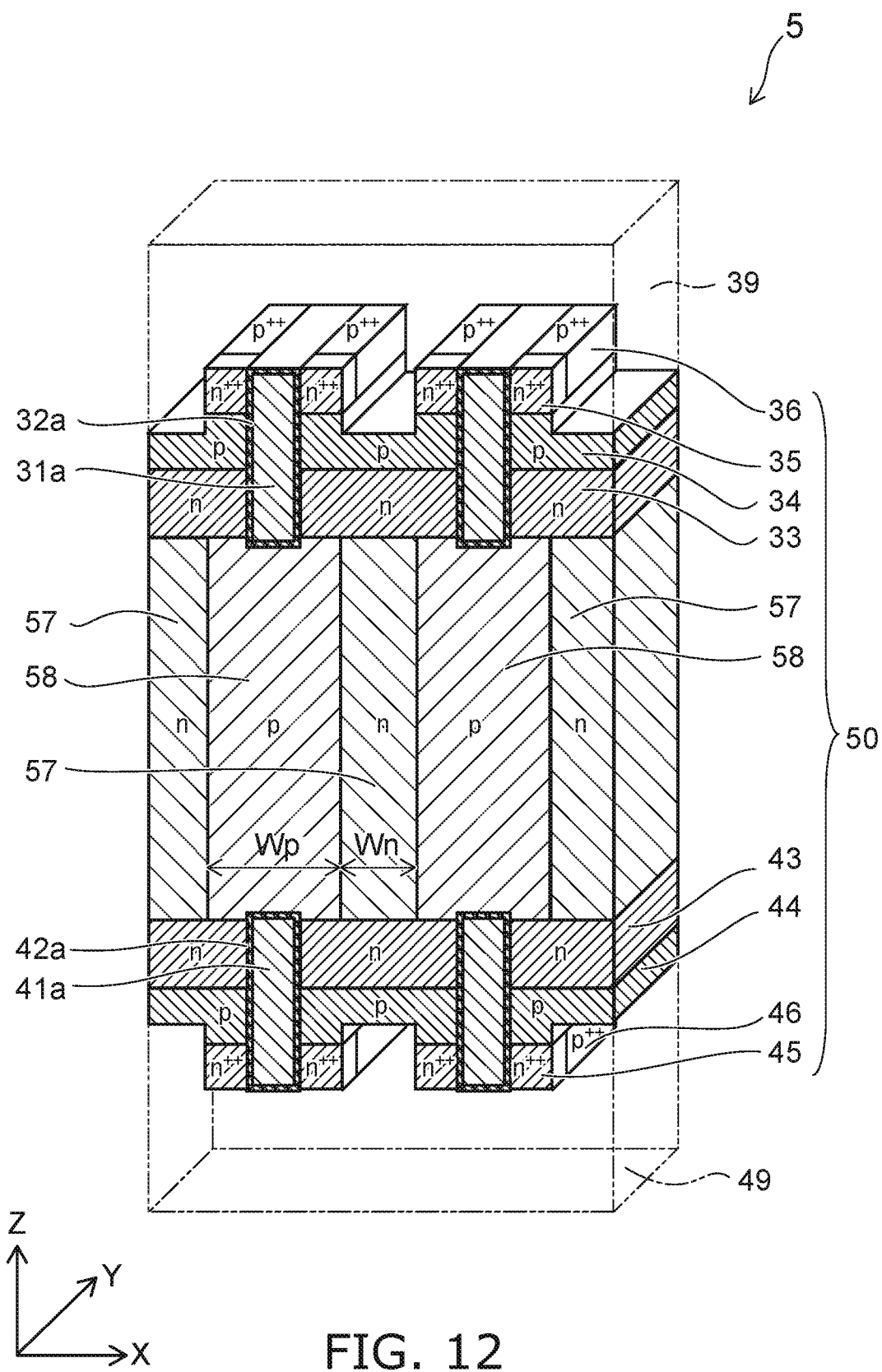
FIG. 12 is a cross-sectional view showing a semiconductor device according to a fifth embodiment.

FIG. 12 is a perspective cross-sectional view showing a semiconductor device according to the embodiment.

Similarly to FIG. 1, the emitter electrode 39 and the collector electrode 49 are illustrated by double dot-dash lines in FIG. 12.

As shown in FIG. 12, the semiconductor device 5 according to the embodiment differs from the semiconductor device 1 according to the first embodiment described above (referring to FIG. 1) in that a super junction structure is formed. In other words, multiple n-type drift layers 57 and multiple p-type drift layers 58 are provided in the semiconductor device 5 instead of the $n^-$-type high resistance layer 20. The n-type drift layer 57 and the p-type drift layer 58 extend in the Y-direction and are arranged alternately along the X-direction. A composite layer that has a super junction structure includes the n-type drift layer 57 and the p-type drift layer 58 arranged alternately. Although the case is illustrated in the embodiment where a width Wp of the p-type drift layer 58 in the X-direction is wider than a width Wn of the n-type drift layer 57 in the X-direction, the width Wp and the width Wn may be the same or the width Wn may be wider than the width Wp to match the intended final characteristics of the element.

Compared to the semiconductor device 1, the emitter-side trench gate electrode 31b, the insulating film 32b around the emitter-side trench gate electrode 31b, the collector-side trench gate electrode 41b, and the insulating film 42b around the collector-side trench gate electrode 41b are provided in the semiconductor device 5. Thereby, the n-type base layer 33 and the p-type base layer 34 are provided to be continuous between the emitter-side trench gate electrodes 31a adjacent to each other in the X-direction. Also, the n-type base layer 43 and the p-type base layer 44 are provided to be continuous between the collector-side trench gate electrodes 41a adjacent to each other in the X-direction. Similarly to the semiconductor device 1 according to the first embodiment described above (referring to FIG. 1), the collector-side trench gate electrode 41a is disposed in the region directly under the emitter-side trench gate electrode 31a.

The n-type drift layer 57 is disposed between the X-direction central portion of the n-type base layer 33 and the X-direction central portion of the n-type base layer 43. The p-type drift layer 58 is disposed between the entire emitter-side trench gate electrode 31a, two X-direction end portions of the n-type base layer 33, the entire collector-side trench gate electrode 41a, and two X-direction end portions of the n-type base layer 43. Thereby, the n-type base layer 33 and the n-type base layer 43 are connected to both the n-type drift layer 57 and the p-type drift layer 58; and a super junction structure is realized by the n-type drift layer 57 and the p-type drift layer 58.

According to the embodiment, because the super junction structure is realized, the ON resistance can be reduced even further; and the breakdown voltage can be increased even further.

In the embodiment, the $n^-$-type high resistance layer 20 of the first embodiment described above is replaced with the super junction structure made of the n-type drift layer 57 and the p-type drift layer 58 that vertically traverse the greater part of the semiconductor device 5 in the vertical direction (the Z-direction). Thereby, the movement path of the electrons is ensured by the n-type drift layer 57; and the movement path of the holes is ensured by the p-type drift layer 58. As a result, the injection (the storage) of the electrons from the emitter electrode 39 into the interior of the semiconductor device 5, the discharge (the extraction) of the electrons into the emitter electrode 39, the injection (the storage) of the holes from the collector electrode 49 into the interior of the semiconductor device 5, and the discharge (the extraction) of the holes into the collector electrode 49 can be controlled at a high speed and with high precision. Also, the injection (the storage) of the electrons from the emitter electrode 39 into the interior of the semiconductor device 5, the discharge (the extraction) of the electrons into the collector electrode 49, the injection (the storage) of the holes from the collector electrode 49 into the interior of the semiconductor device 5, and the discharge (the extraction) of the holes into the emitter electrode 39 can be controlled at a high speed and with high precision. Thereby, the speed of the switching operation can be increased; and the ON characteristics and the OFF characteristics can be improved.

Otherwise, the configuration, the basic operations, and the effects according to the embodiment are similar to those of the first embodiment described above.

First Modification of Fifth Embodiment

A first modification of the fifth embodiment will now be described.

Figure 13:
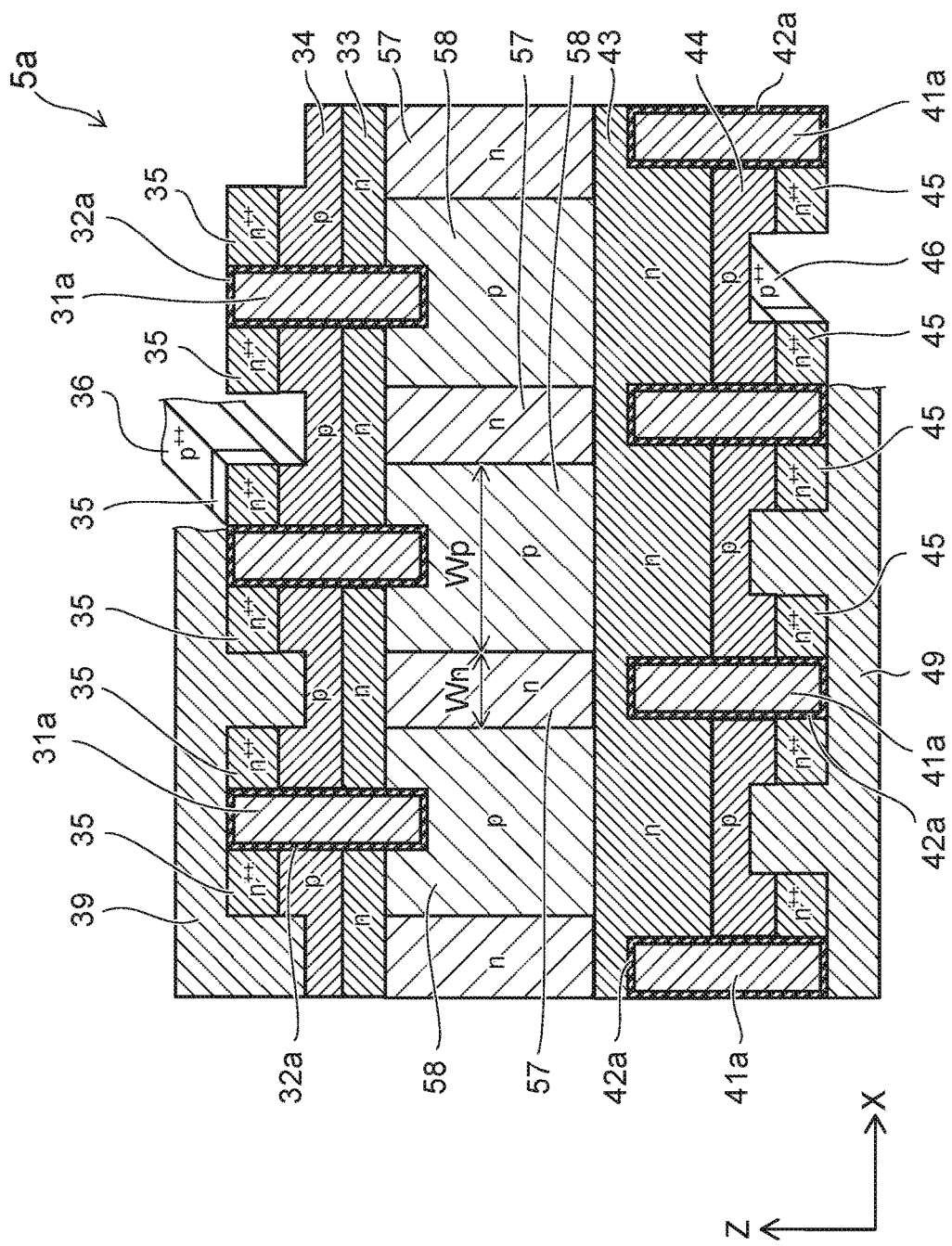
FIG. 13 is a cross-sectional view showing a semiconductor device according to a first modification of the fifth embodiment.

FIG. 13 is a cross-sectional view showing a semiconductor device according to the modification.

However, a portion of FIG. 13 is shown as a perspective view for convenience of illustration. This is similar for FIG. 14 to FIG. 24 described below as well.

As shown in FIG. 13, the semiconductor device 5a according to the modification differs from the semiconductor device 5 according to the fifth embodiment described above (referring to FIG. 12) in that the n-type base layer 43 covers the upper surface of the insulating film 42a, and the collector-side trench gate electrode 41a and the insulating film 42a are disposed in the region directly under the n-type drift layer 57. In other words, the emitter-side trench gate electrode 31a and the collector-side trench gate electrode 41a are disposed differently from each other in the X-direction. Otherwise, the configuration, the operations, and the effects of the modification are similar to those of the fifth embodiment described above.

Second Modification of Fifth Embodiment

A second modification of the fifth embodiment will now be described.

Figure 14:
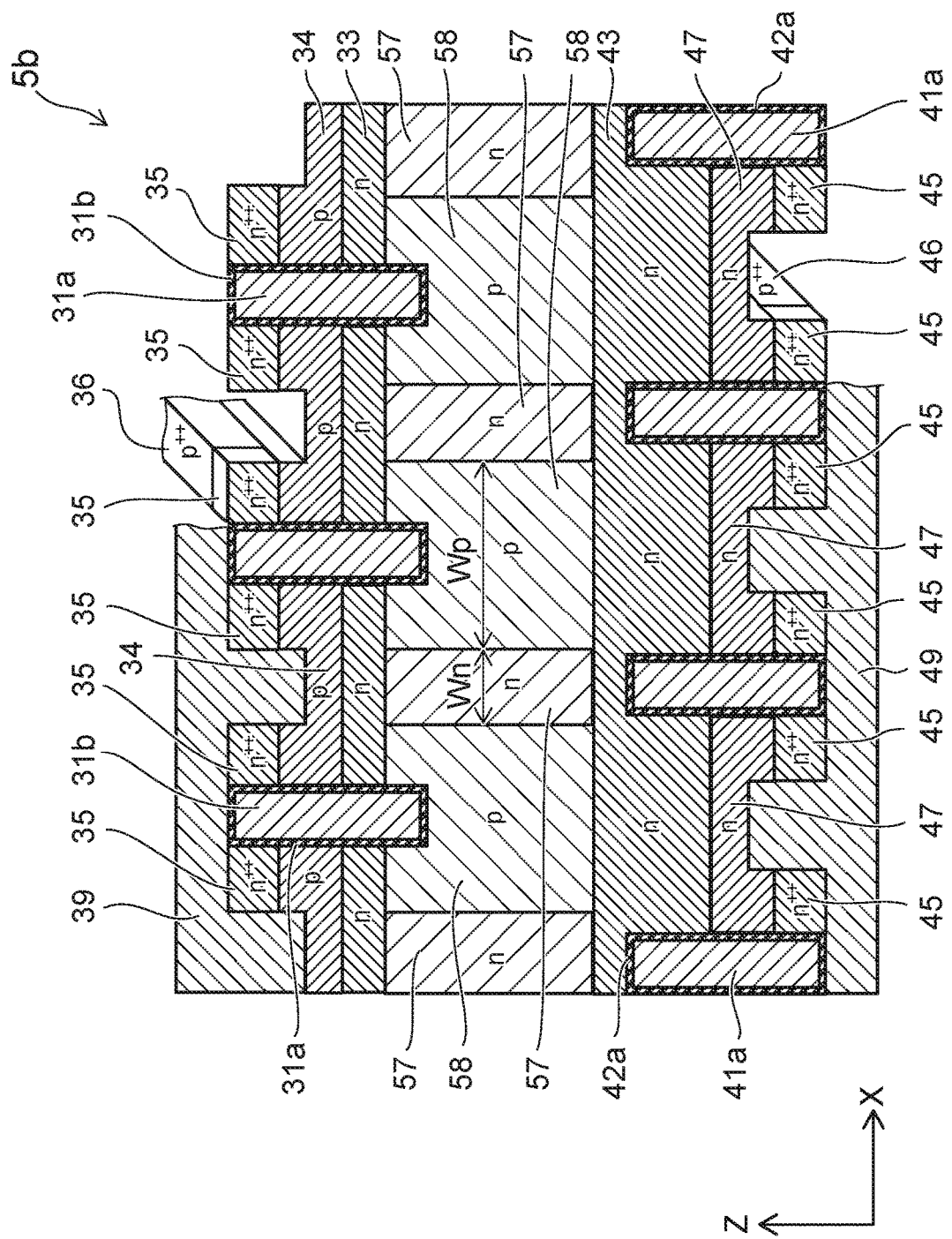
FIG. 14 is a cross-sectional view showing a semiconductor device according to a second modification of the fifth embodiment.

FIG. 14 is a cross-sectional view showing a semiconductor device according to the modification.

As shown in FIG. 14, the semiconductor device 5b according to the modification differs from the semiconductor device 5a according to the first modification described above (referring to FIG. 13) in that an n-type base layer 47 is provided instead of the p-type base layer 44.

Otherwise, the configuration, the operations, and the effects according to the modification are similar to those of the first modification described above.

Third Modification of Fifth Embodiment

A third modification of the fifth embodiment will now be described.

Figure 15:
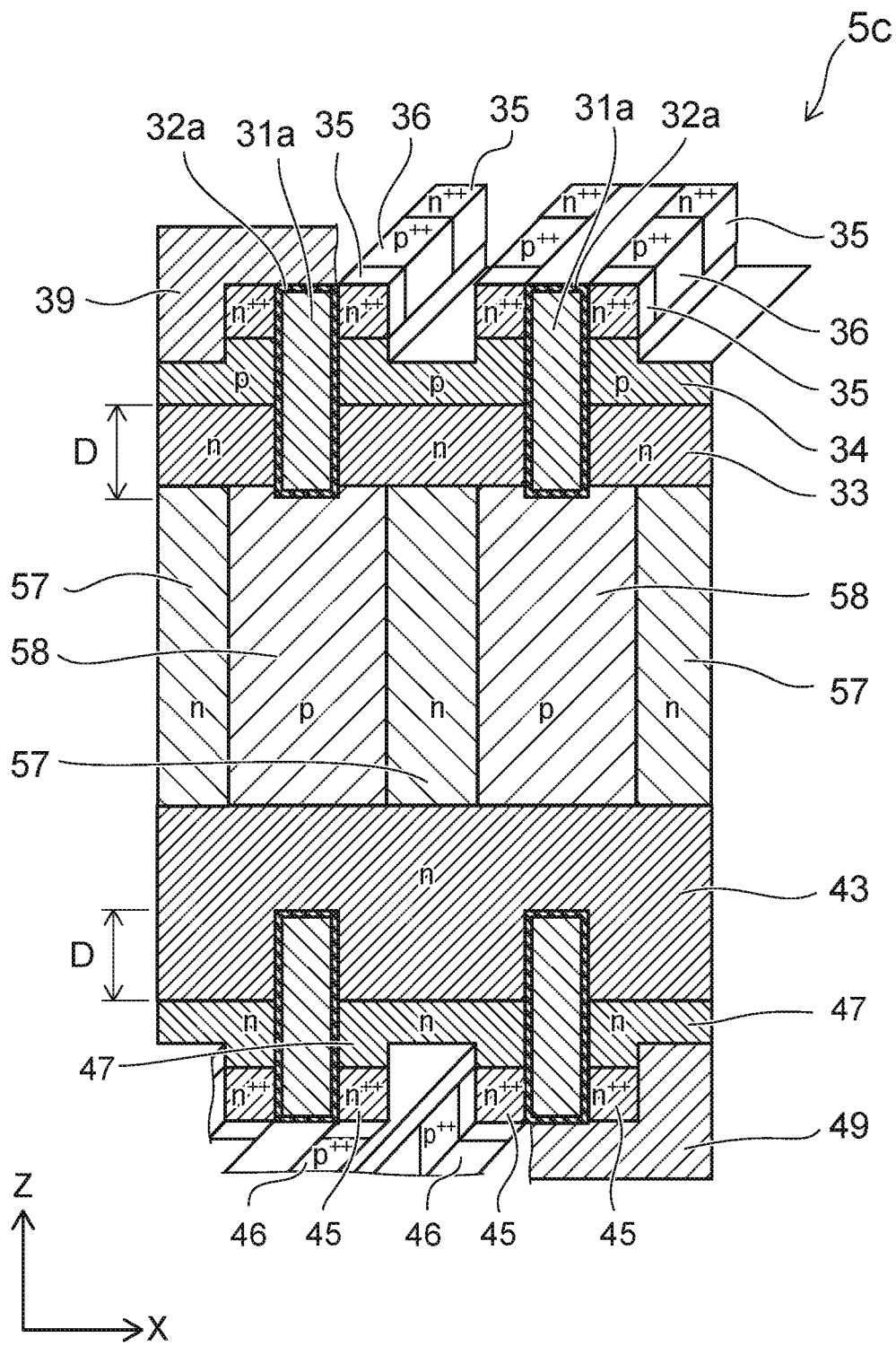
FIG. 15 is a cross-sectional view showing a semiconductor device according to a third modification of the fifth embodiment.

FIG. 15 is a cross-sectional view showing a semiconductor device according to the modification.

As shown in FIG. 15, the semiconductor device 5c according to the modification differs from the semiconductor device 5b according to the second modification described above (referring to FIG. 14) in that the collector-side trench gate electrode 41a and the insulating film 42a are disposed in the region directly under the p-type drift layer 58. In other words, the emitter-side trench gate electrode 31a and the collector-side trench gate electrode 41a are disposed at the same position in the X-direction. The distance D between the lower surface of the p-type base layer 34 and the lower surface of the insulating film 32a is equal to the distance D between the upper surface of the n-type base layer 47 and the upper surface of the insulating film 42a.

Otherwise, the configuration, the operations, and the effects of the modification are similar to those of the second modification described above.

Fourth Modification of Fifth Embodiment

A fourth modification of the fifth embodiment will now be described.

Figure 16:
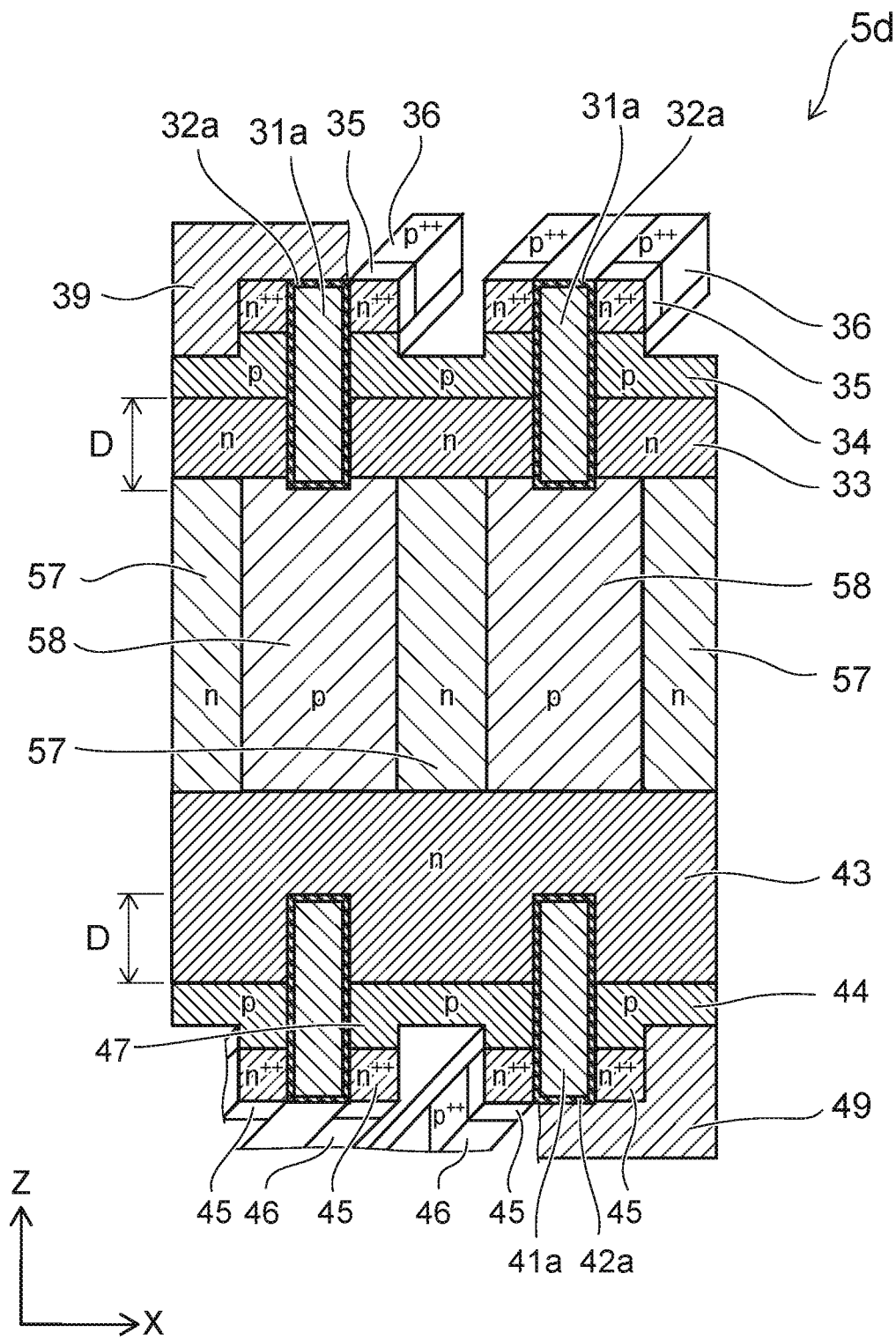
FIG. 16 is a cross-sectional view showing a semiconductor device according to a fourth modification of the fifth embodiment.

FIG. 16 is a cross-sectional view showing a semiconductor device according to the modification.

As shown in FIG. 16, the semiconductor device 5d according to the modification differs from the semiconductor device 5c according to the third modification described above (referring to FIG. 15) in that the p-type base layer 44 is provided instead of the n-type base layer 47.

Otherwise, the configuration, the operations, and the effects according to the modification are similar to those of the third modification described above.

Fifth Modification of Fifth Embodiment

A fifth modification of the fifth embodiment will now be described.

Figure 17:
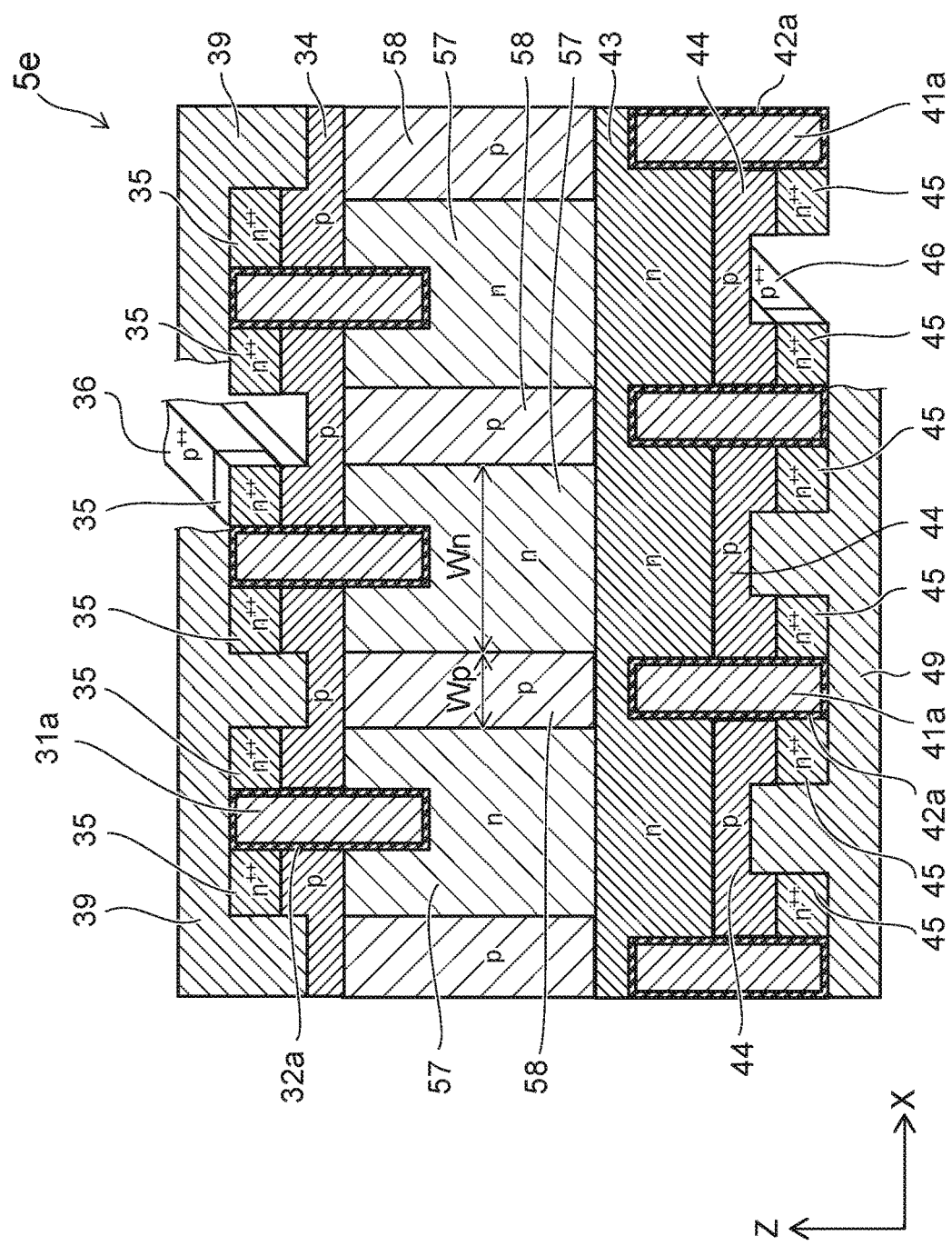
FIG. 17 is a cross-sectional view showing a semiconductor device according to a fifth modification of the fifth embodiment.

FIG. 17 is a cross-sectional view showing a semiconductor device according to the modification.

As shown in FIG. 17, the semiconductor device 5e according to the modification differs from the semiconductor device 5a according to the first modification described above (referring to FIG. 13) in that the n-type drift layer 57 and the p-type drift layer 58 are interchanged, and the n-type base layer 33 is not provided. In the semiconductor device 5e, the n-type drift layer 57 and the p-type drift layer 58 contact the p-type base layer 34. Also, the width Wn of the n-type drift layer 57 in the X-direction is wider than the width Wp of the p-type drift layer 58 in the X-direction.

Otherwise, the configuration, the operations, and the effects of the modification are similar to those of the first modification described above.

Sixth Modification of Fifth Embodiment

A sixth modification of the fifth embodiment will now be described.

Figure 18:
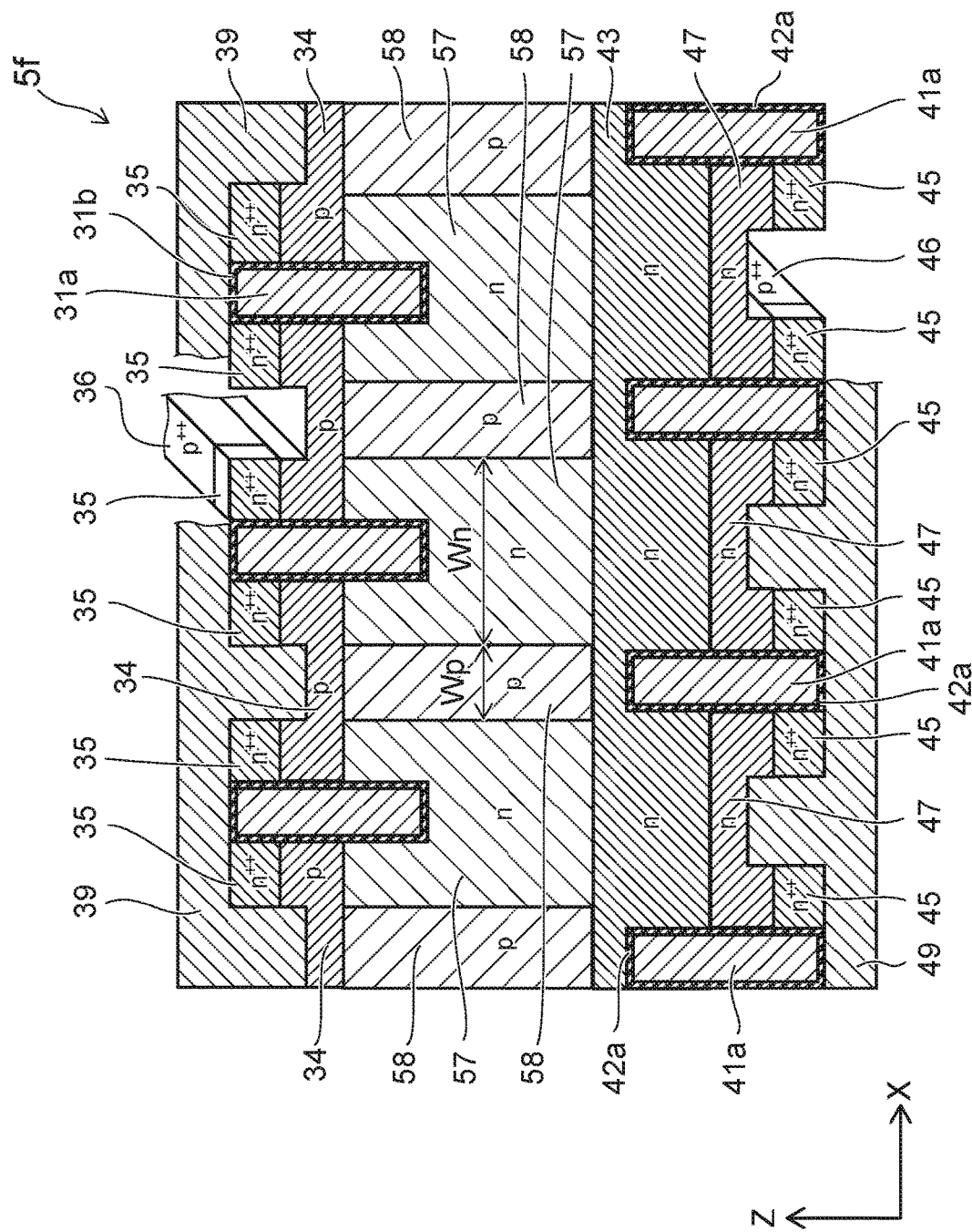
FIG. 18 is a cross-sectional view showing a semiconductor device according to a sixth modification of the fifth embodiment.

FIG. 18 is a cross-sectional view showing a semiconductor device according to the modification.

As shown in FIG. 18, the semiconductor device 5f according to the modification differs from the semiconductor device 5e according to the fifth modification described above (referring to FIG. 17) in that the n-type base layer 47 is provided instead of the p-type base layer 44.

Otherwise, the configuration, the operations, and the effects of the modification are similar to those of the fifth modification described above.

Seventh Modification of Fifth Embodiment

A seventh modification of the fifth embodiment will now be described.

Figure 19:
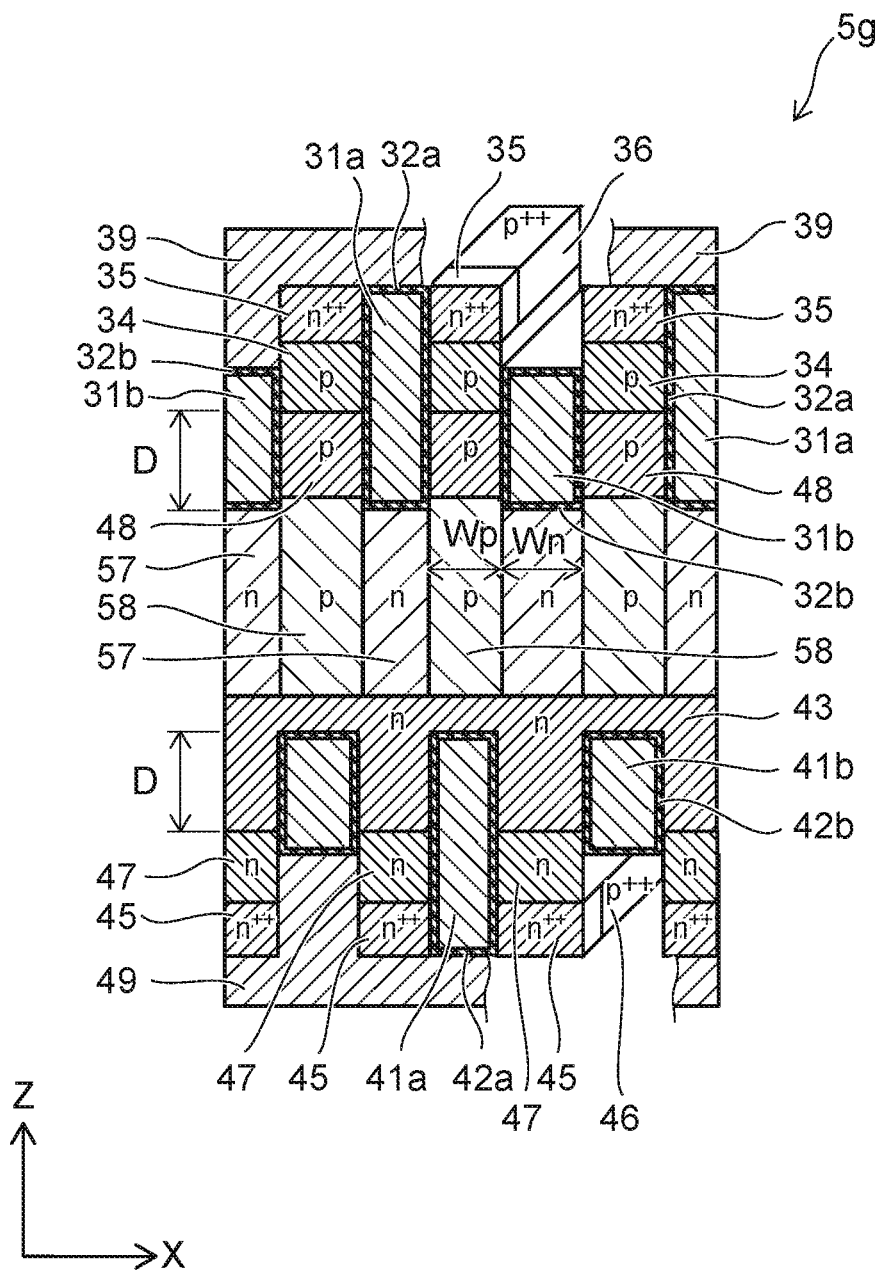
FIG. 19 is a cross-sectional view showing a semiconductor device according to a seventh modification of the fifth embodiment.

FIG. 19 is a cross-sectional view showing a semiconductor device according to the modification.

As shown in FIG. 19, the semiconductor device 5g according to the modification differs from the semiconductor device 5b according to the second modification described above (referring to FIG. 14) in that the electrode 31b is provided between the mutually-adjacent electrodes 31a, the electrode 41b is provided between the mutually-adjacent electrodes 41a, the electrode 31a or the electrode 31b is disposed in the region directly above the n-type drift layer 57, the electrode 41a or the electrode 41b is disposed in the region directly under the p-type drift layer 58, and a p-type base layer 48 is provided instead of the n-type base layer 33. Also, the width Wp and the width Wn are about the same.

According to the modification, compared to the semiconductor device 5b according to the second modification described above (referring to FIG. 14), the spacing between the trench gate electrodes can be reduced by providing the electrodes 31b and 41b. Thereby, the electron IE effect and the hole IE effect can be increased even further. According to the modification, the leakage current in the OFF state can be suppressed because the channel lengths on the emitter side and the collector side lengthen.

Otherwise, the configuration, the operations, and the effects of the modification are similar to those of the second modification described above.

Eighth Modification of Fifth Embodiment

An eighth modification of the fifth embodiment will now be described.

Figure 20:
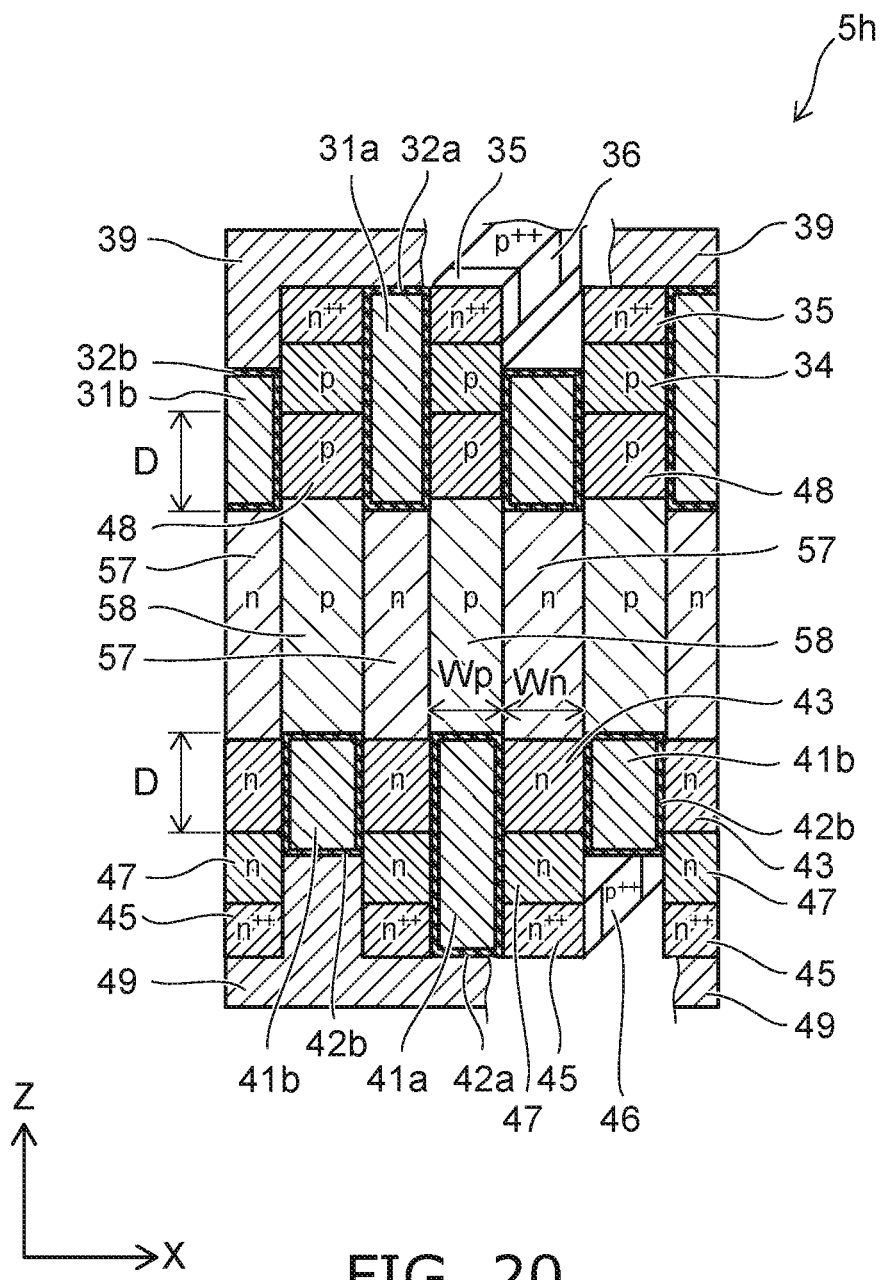
FIG. 20 is a cross-sectional view showing a semiconductor device according to an eighth modification of the fifth embodiment.

FIG. 20 is a cross-sectional view showing a semiconductor device according to the modification.

As shown in FIG. 20, the semiconductor device 5h according to the modification differs from the semiconductor device 5g according to the seventh modification described above (referring to FIG. 19) in that the upper surface of the n-type base layer 43 is positioned to be lower than the upper surfaces of the insulating films 42a and 42b; and the n-type base layer 43 covers the upper surfaces of the insulating films 42a and 42b.

According to the modification, the injection (the storage) and the discharge (the extraction) of the carriers can be performed at a higher speed for the super junction structure because the n-type drift layer 57 and the p-type drift layer 58 contact the electrodes 41a and 41b on the collector side. As a result, the speed of the switching characteristics can be increased; and the ON characteristics and the OFF characteristics can be improved further.

Otherwise, the configuration, the basic operations, and the effects of the modification are similar to those of the seventh modification described above.

Ninth Modification of Fifth Embodiment

A ninth modification of the fifth embodiment will now be described.

Figure 21:
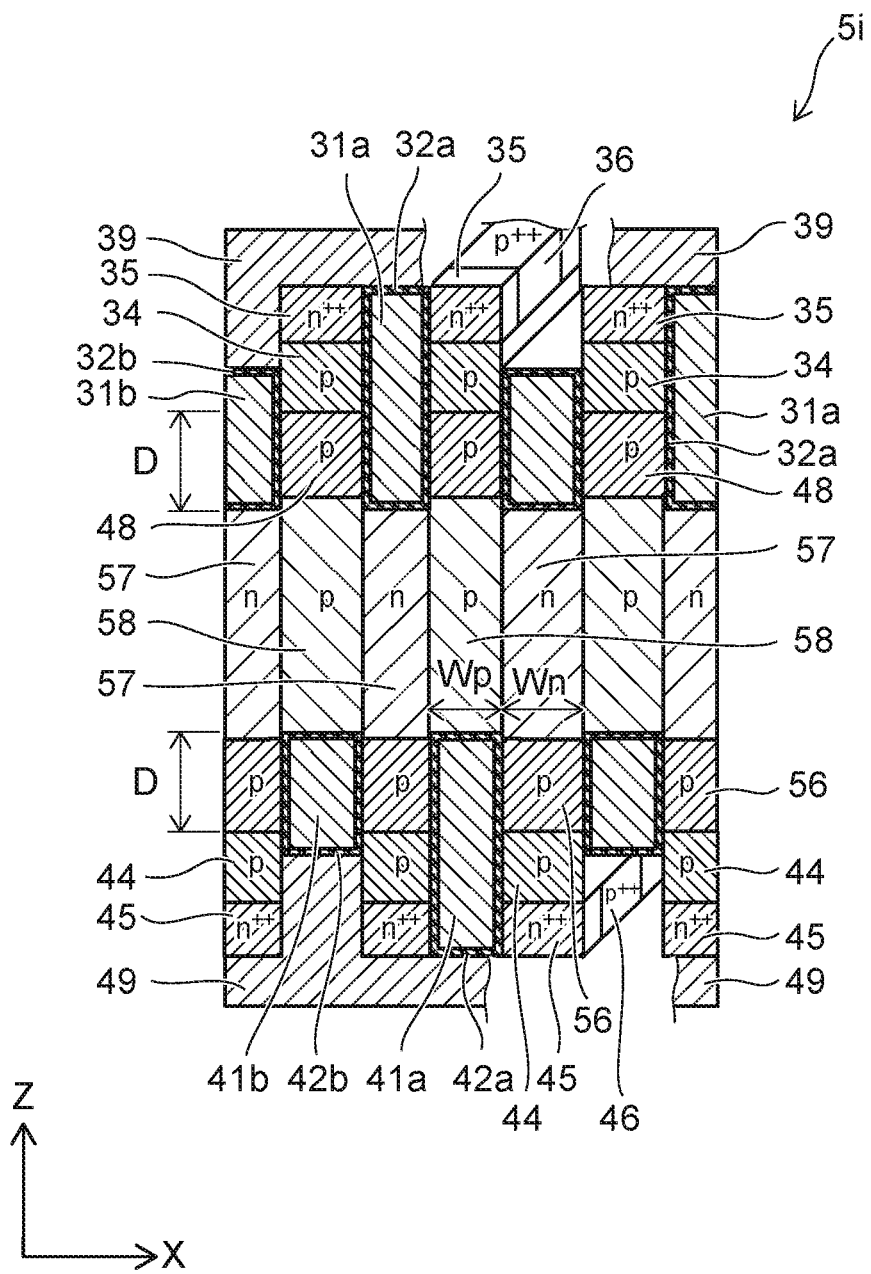
FIG. 21 is a cross-sectional view showing a semiconductor device according to a ninth modification of the fifth embodiment.

FIG. 21 is a cross-sectional view showing a semiconductor device according to the modification.

As shown in FIG. 21, the semiconductor device 5i according to the modification differs from the semiconductor device 5h according to the eighth modification described above (referring to FIG. 20) in that the p-type base layer 56 and the p-type base layer 44 are provided instead of the n-type base layer 43 and the n-type base layer 47.

Otherwise, the configuration, the operations, and the effects of the modification are similar to those of the eighth modification described above.

Tenth Modification of Fifth Embodiment

A tenth modification of the fifth embodiment will now be described.

Figure 22:
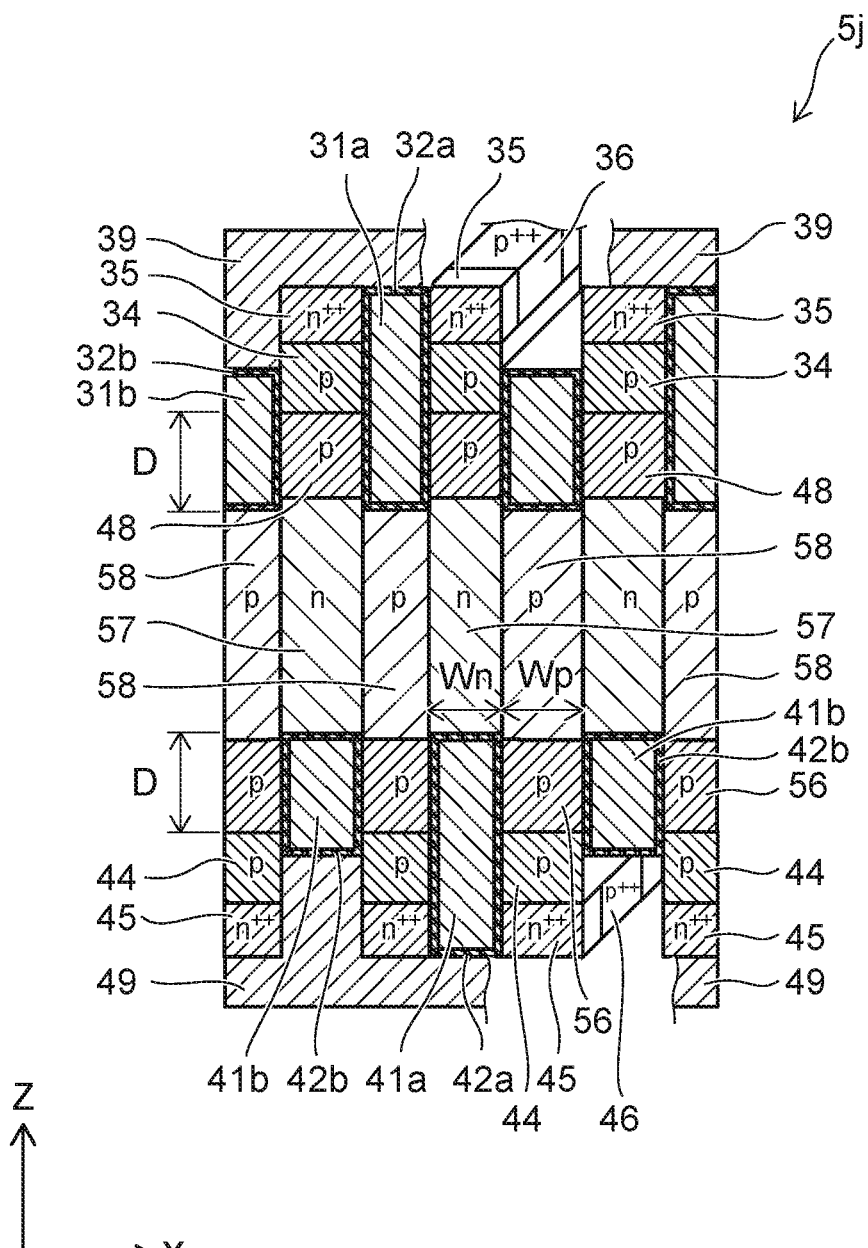
FIG. 22 is a cross-sectional view showing a semiconductor device according to a tenth modification of the fifth embodiment.

FIG. 22 is a cross-sectional view showing a semiconductor device according to the modification.

As shown in FIG. 22, compared to the semiconductor device 5i according to the ninth modification described above (referring to FIG. 21), the n-type drift layer 57 and the p-type drift layer 58 are interchanged in the semiconductor device 5j according to the modification. In other words, the n-type drift layer 57 contacts the p-type base layer 48 on the emitter side; and the p-type drift layer 58 contacts the p-type base layer 56 on the collector side.

Otherwise, the configuration, the operations, and the effects of the modification are similar to those of the ninth modification described above.

Eleventh Modification of Fifth Embodiment

An eleventh modification of the fifth embodiment will now be described.

Figure 23:
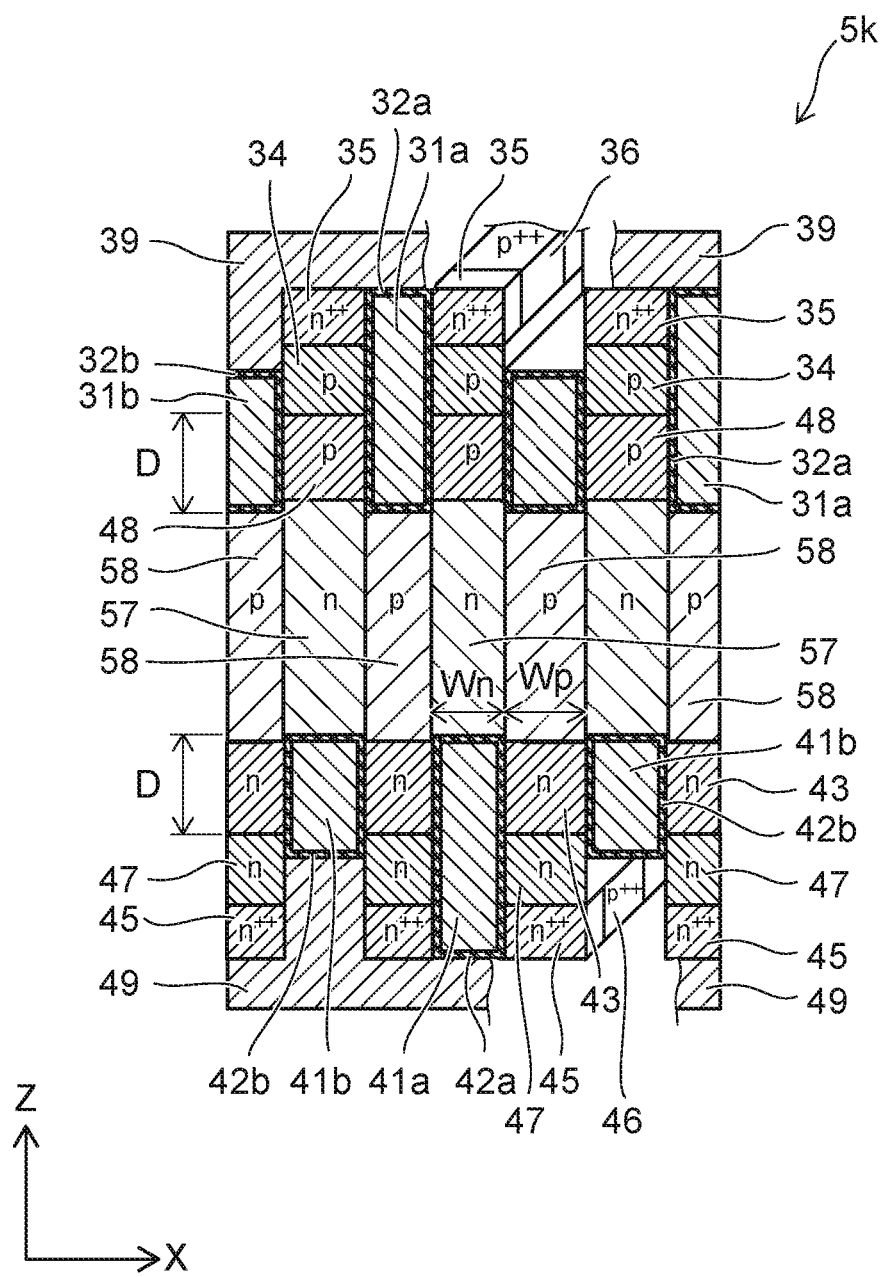
FIG. 23 is a cross-sectional view showing a semiconductor device according to an eleventh modification of the fifth embodiment.

FIG. 23 is a cross-sectional view showing a semiconductor device according to the modification.

As shown in FIG. 23, the semiconductor device 5k according to the modification differs from the semiconductor device 5j according to the tenth modification described above (referring to FIG. 22) in that the n-type base layer 43 and the n-type base layer 47 are provided instead of the p-type base layer 56 and the p-type base layer 44. In other words, compared to the semiconductor device 5h according to the eighth modification described above (referring to FIG. 20), the n-type drift layer 57 and the p-type drift layer 58 are interchanged in the semiconductor device 5k.

Otherwise, the configuration, the operations, and the effects of the modification are similar to those of the tenth modification described above.

Twelfth Modification of Fifth Embodiment

A twelfth modification of the fifth embodiment will now be described.

Figure 24:
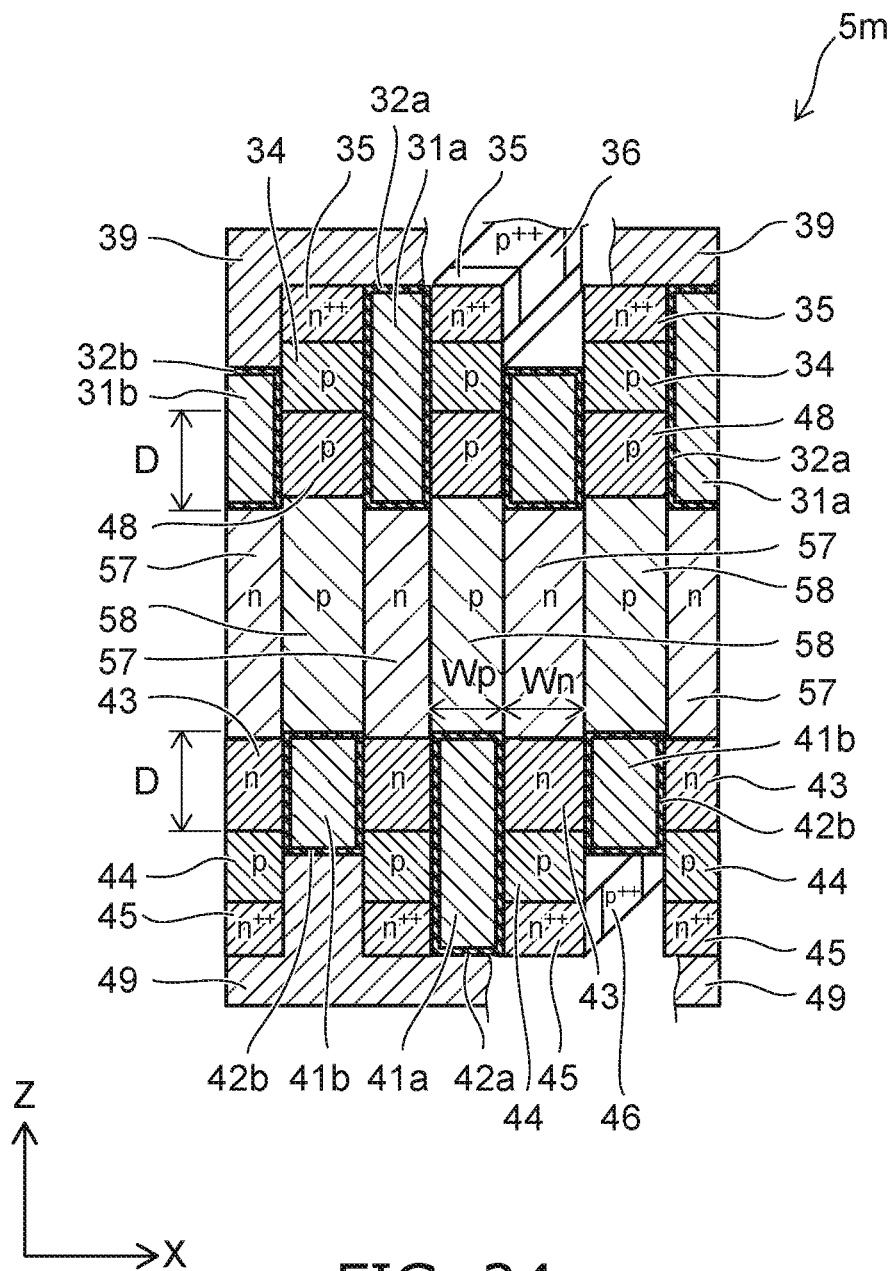
FIG. 24 is a cross-sectional view showing a semiconductor device according to a twelfth modification of the fifth embodiment.

FIG. 24 is a cross-sectional view showing a semiconductor device according to the modification.

As shown in FIG. 24, the semiconductor device 5m according to the modification differs from the semiconductor device 5h according to the eighth modification described above (referring to FIG. 20) in that the p-type base layer 44 is provided instead of the n-type base layer 47.

Otherwise, the configuration, the operations, and the effects of the modification are similar to those of the eighth modification described above.

The positional relationship between the emitter-side trench gate electrodes 31a and 31b and the collector-side trench gate electrodes 41a and 41b is not limited to the case of being aligned vertically as in the fifth embodiment described above or the case of being different from each other vertically as in the first modification of the fifth embodiment described above; and any positional relationship is possible. For example, the electrodes 31a and 31b and the gate electrodes 41a and 41b may be arranged along mutually-different directions in the XY plane.

Sixth Embodiment

A sixth embodiment will now be described.

Figure 25:
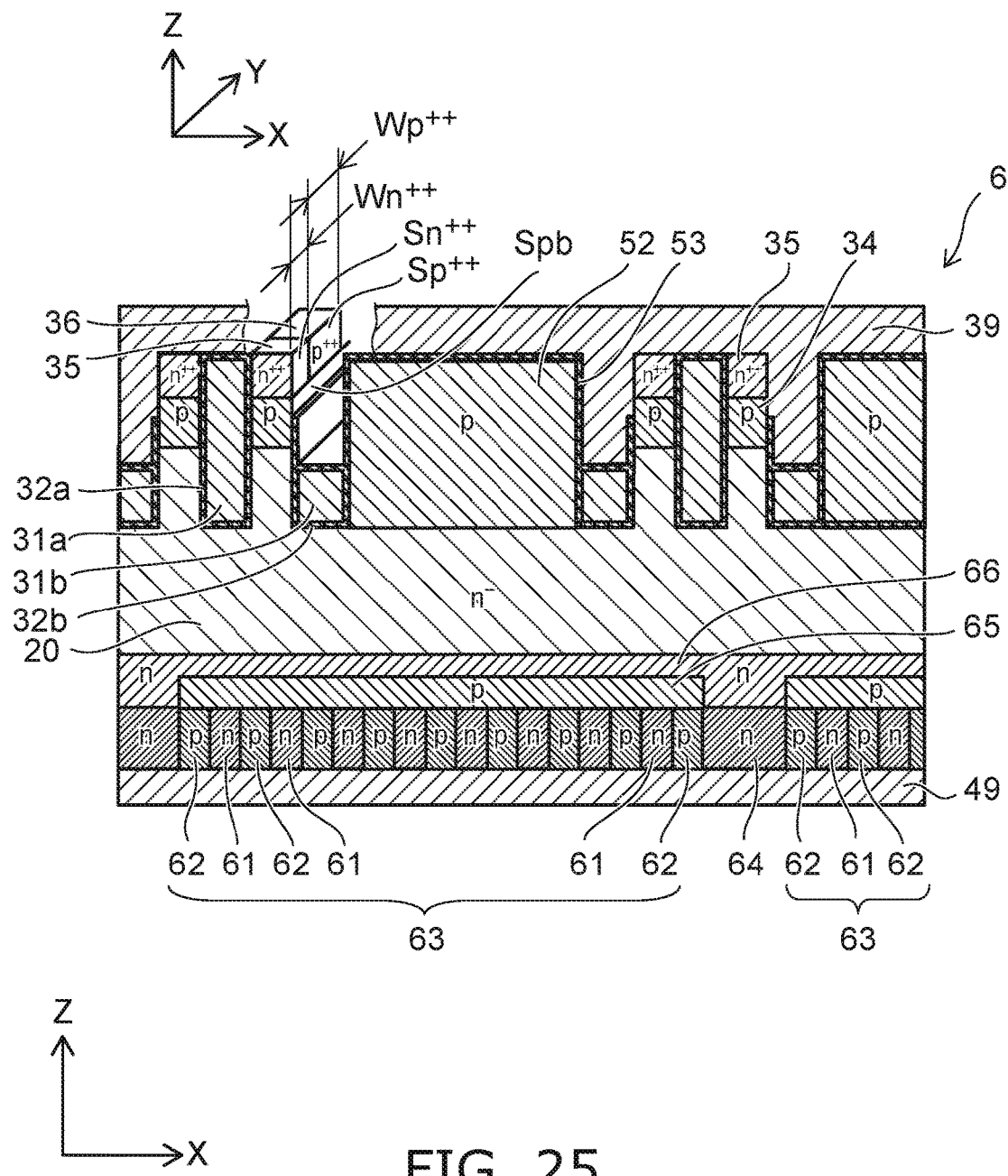
FIG. 25 is a cross-sectional view showing a semiconductor device according to a sixth embodiment.

FIG. 25 is a cross-sectional view showing a semiconductor device according to the embodiment.

However, a portion of FIG. 25 is shown as a perspective view for convenience of illustration.

In the semiconductor device 6 according to the embodiment as shown in FIG. 25, the trench gate electrodes are provided on only the emitter side; and the trench gate electrodes are not provided on the collector side.

The configuration of the emitter side of the semiconductor device 6 is the same as the configuration of the emitter side of the semiconductor device 3 according to the third embodiment described above (referring to FIG. 10). However, it is favorable for the relationship of the lengths to be $$Wp^{++} > 3 \times Wn^{++},$$

and more favorable to be $$Wp^{++} > 4 \times Wn^{++},$$

where the length of the n$^{++}$-type contact layer 35 in the Y-direction is Wn$^{++}$, and the length of the p$^{++}$-type contact layer 36 in the Y-direction is Wp$^{++}$.

It is favorable for the relationship of the surface areas to be $$Spb+Sp^{++}>3\times Sn^{++},$$

and more favorable to be $$Spb+Sp^{++}>4\times Sn^{++},$$

where the contact surface area between the emitter electrode 39 and the n$^{++}$-type contact layer 35 is Sn$^{++}$, the contact surface area between the emitter electrode 39 and the p$^{++}$-type contact layer 36 is Sp$^{++}$, and the contact surface area between the emitter electrode 39 and the p-type base layer 34 is Spb.

On the other hand, on the collector side, a block 63 that is made of n-type layers 61 and p-type layers 62 periodically arranged alternately along the X-direction is multiply provided. The n-type layers 61 and the p-type layers 62 extend in the Y-direction. The blocks 63 are arranged to be separated from each other along the X-direction. An n-type layer 64 is provided between the blocks 63. In the X-direction, the width of the n-type layer 64 is wider than the widths of the n-type layer 61 and the p-type layer 62. The n-type layer 61, the p-type layer 62, and the n-type layer 64 contact the collector electrode 49. A p-type layer 65 is provided on the block 63. An n-type layer 66 is provided to cover the n-type layer 64 and the p-type layer 65. The upper surface of the n-type layer 66 contacts the lower surface of the n$^-$-type high resistance layer 20.

According to the embodiment, the ON resistance can be reduced further by the sizes of the n$^{++}$-type contact layer 35 and the p$^{++}$-type contact layer 36 satisfying the formulas recited above.

Otherwise, the configuration, the operations, and the effects of the embodiment are similar to those of the third embodiment described above.

Seventh Embodiment

A seventh embodiment will now be described.

Figure 26:
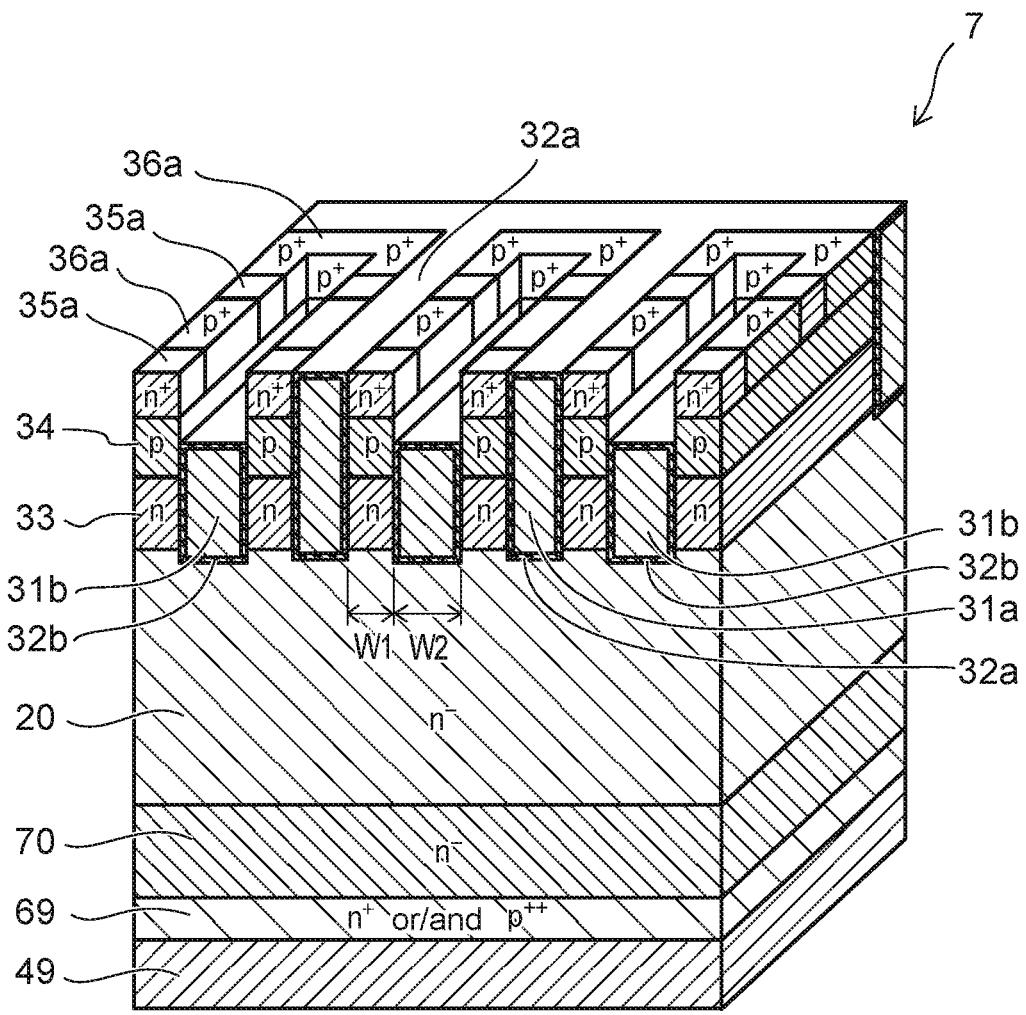
FIG. 26 is a perspective cross-sectional view showing a semiconductor device according to a seventh embodiment.

FIG. 26 is a perspective cross-sectional view showing a semiconductor device according to the embodiment.

In FIG. 26, the emitter electrode 39 (referring to FIG. 1) is not shown for convenience of illustration.

In the semiconductor device 7 according to the embodiment as shown in FIG. 26, the configurations of the emitter-side trench gate electrodes 31a and 31b are comb-shaped configurations; and the space corresponding to the region directly above the electrode 31b, i.e., the end portion in the Y-direction of the portion where the emitter electrode 39 protrudes downward, is surrounded by a p$^+$-type contact layer 36a from three directions, i.e., two X-direction sides and one Y-direction side.

To further promote the injection of the electrons on the emitter side by the electron IE effect, it is effective to design a width W1 to be narrow and favorable to set the width W1 to be, for example, 1 μm or less, where the width of the n-type base layer 33 in the X-direction is W1, and the width of the electrode 31b in the X-direction is W2. Also, it is possible to increase the electron IE effect by designing the width W2 to be wider than the width W1.

It is favorable for the relationship of the width W1 and the width W2 to be, for example, $$W2>2\times W1,$$

and more favorable to be $$W2>10\times W1.$$

The width W2 may be configured by a single wide trench or multiple subdivided trenches.

On the other hand, the configuration of the collector side of the semiconductor device 7 is planar. In other words, a contact layer 69 that has a flat plate configuration is provided on the collector electrode 49; and an n$^-$-type drift layer 70 is provided on the contact layer 69. The upper surface of the n$^-$-type drift layer 70 contacts the lower surface of the n$^-$-type high resistance layer 20. The conductivity type of the contact layer 69 may be the n$^+$-type or the p$^+$-type; and both an n$^+$-type portion and a p$^+$-type portion may be provided.

According to the embodiment, the injection of the electrons from the end portion in the Y-direction of the semiconductor device 7 can be suppressed because the p$^+$-type contact layer 36a is provided to surround the end portion in the Y-direction of the region directly above the electrode 31b. As a result, the breakdown voltage of the end portion in the Y-direction increases; and a semiconductor device having a high breakdown voltage as an entirety can be obtained.

Otherwise, the configuration, the operations, and the effects of the embodiment are similar to those of the first embodiment described above.

First Modification of Seventh Embodiment

A first modification of the seventh embodiment will now be described.

Figure 27:
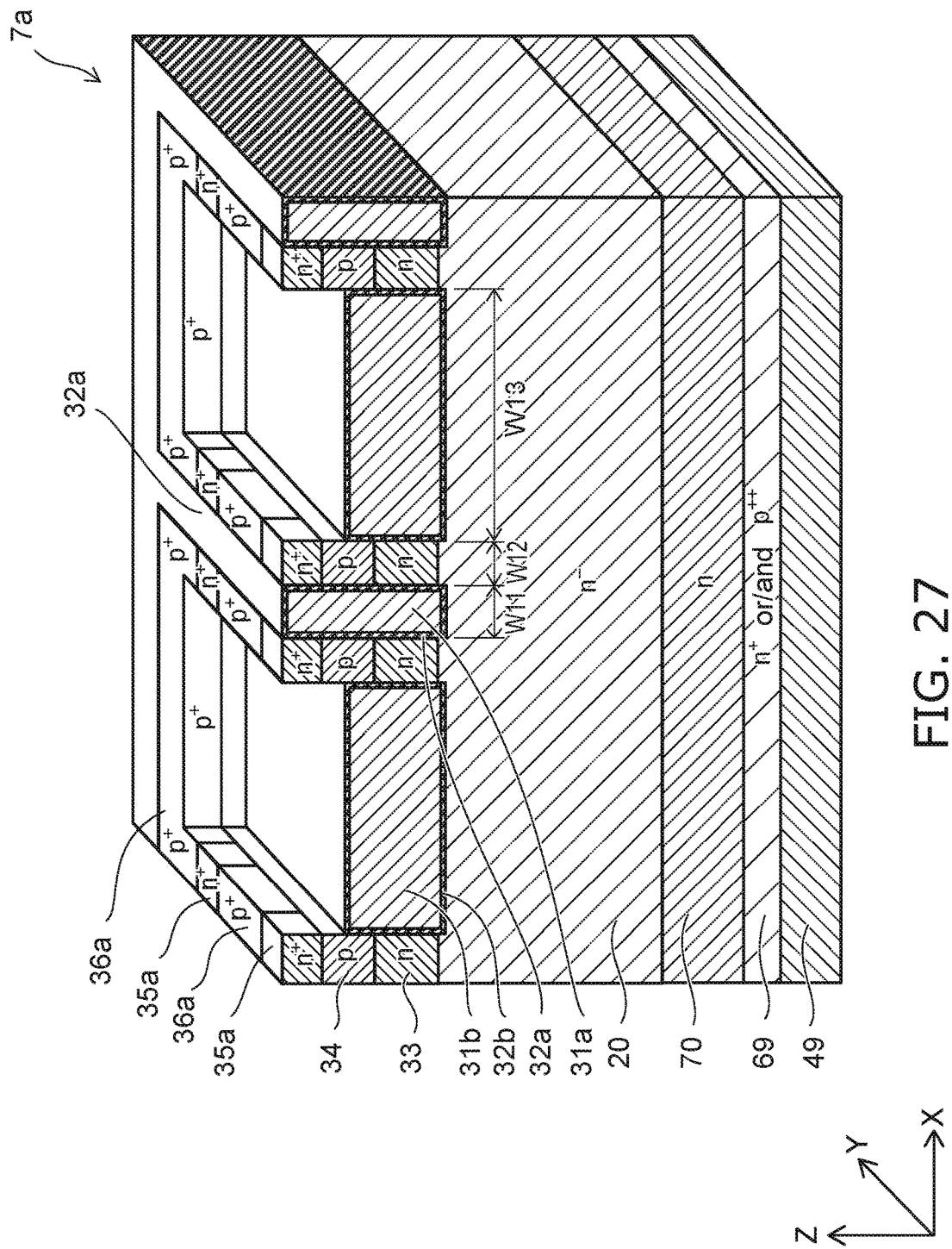
FIG. 27 is a perspective cross-sectional view showing a semiconductor device according to a first modification of the seventh embodiment.

FIG. 27 is a perspective cross-sectional view showing a semiconductor device according to the modification.

In the semiconductor device 7a according to the modification as shown in FIG. 27, compared to the semiconductor device 7 according to the seventh embodiment described above (referring to FIG. 26), a width W13 in the X-direction of the emitter-side trench gate electrode 31b is wider than a width W11 in the X-direction of the emitter-side trench gate electrode 31a and wider than a width W12 in the X-direction of the n-type base layer 33.

To further promote the injection of the electrons on the emitter side by the electron IE effect, it is effective to design the width W12 to be narrow and favorable to set the width W12 to be, for example, 1 μm or less. Also, it is possible to increase the electron IE effect by designing the width W11 and the width W13 to be wider than the width W12.

For example, it is favorable when $$W11>2\times W12, \text{ and}$$

$$W13>2\times W12;$$

and more favorable for $$W11>10\times W12, \text{ and}$$

$$W13>10\times W12.$$

The width W11 and the width W13 may be configured by a single trench having a wide width or multiple subdivided trenches.

Otherwise, the configuration, the operations, and the effects of the modification are similar to those of the seventh embodiment described above.

Second Modification of Seventh Embodiment

A seventh embodiment and the second modification will now be described.

Figure 28:
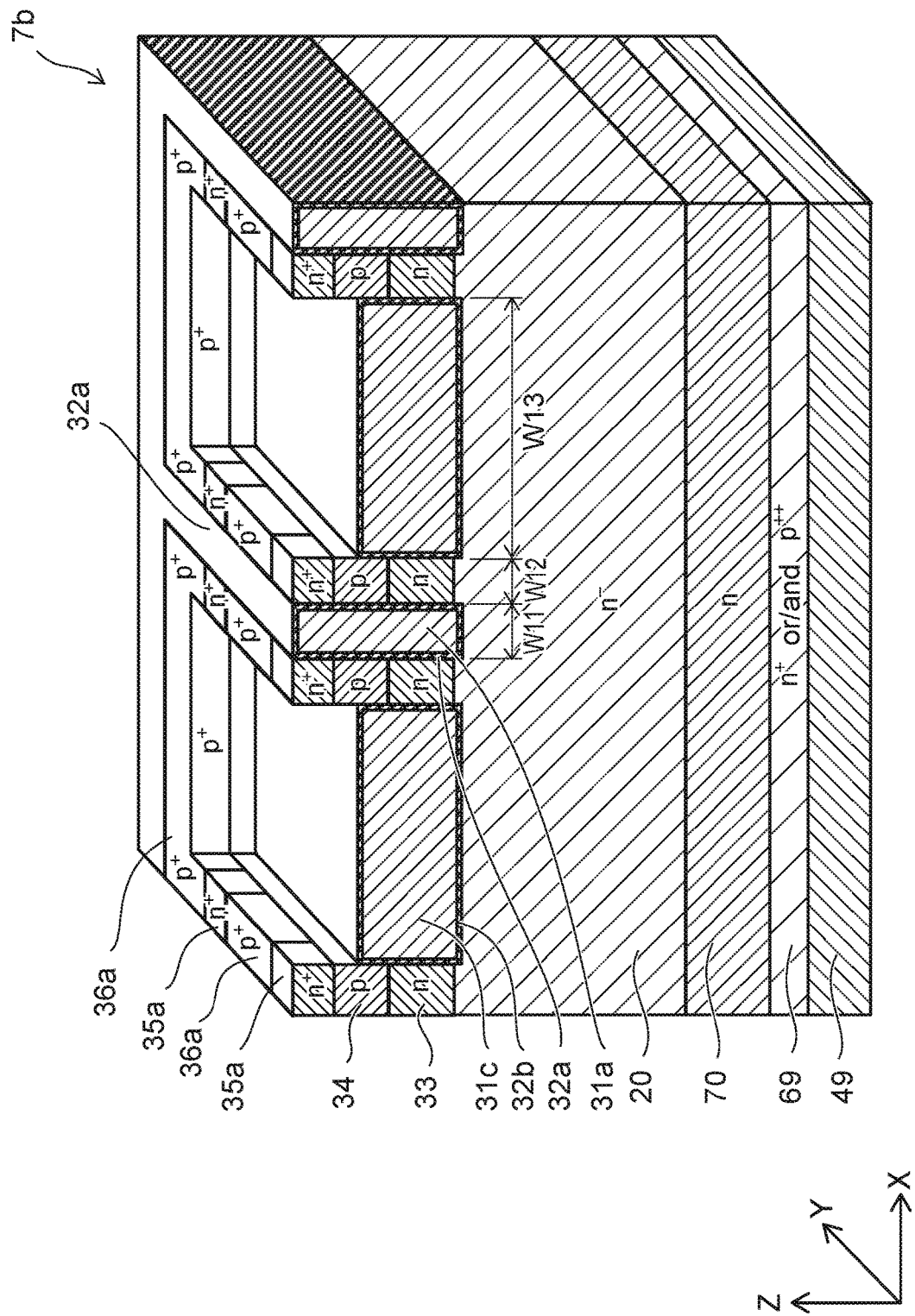
FIG. 28 is a perspective cross-sectional view showing a semiconductor device according to a second modification of the seventh embodiment.

FIG. 28 is a perspective cross-sectional view showing a semiconductor device according to the modification.

In the semiconductor device 7b according to the modification as shown in FIG. 28, an electrode 31c is provided instead of the emitter-side trench gate electrode 31b (referring to FIG. 27). The electrode 31c may be connected to the electrode 31a, may be connected to the emitter electrode 39 (referring to FIG. 1), and may be a control electrode that independently controls the electrode 31a and the emitter electrode 39. Or, the electrode 31c may be a combination of these configurations. For example, the electrode 31c may be multiply provided in the semiconductor device 7b and divided into three groups; the electrode 31c of the first group may be connected to the electrode 31a; the electrode 31c of the second group may be connected to the emitter electrode 39; and the electrode 31c of the third group may be controlled independently.

Otherwise, the configuration, the operations, and the effects of the modification are similar to those of the first modification of the seventh embodiment described above.

Third Modification of Seventh Embodiment

A third modification of the seventh embodiment will now be described.

Figure 29:
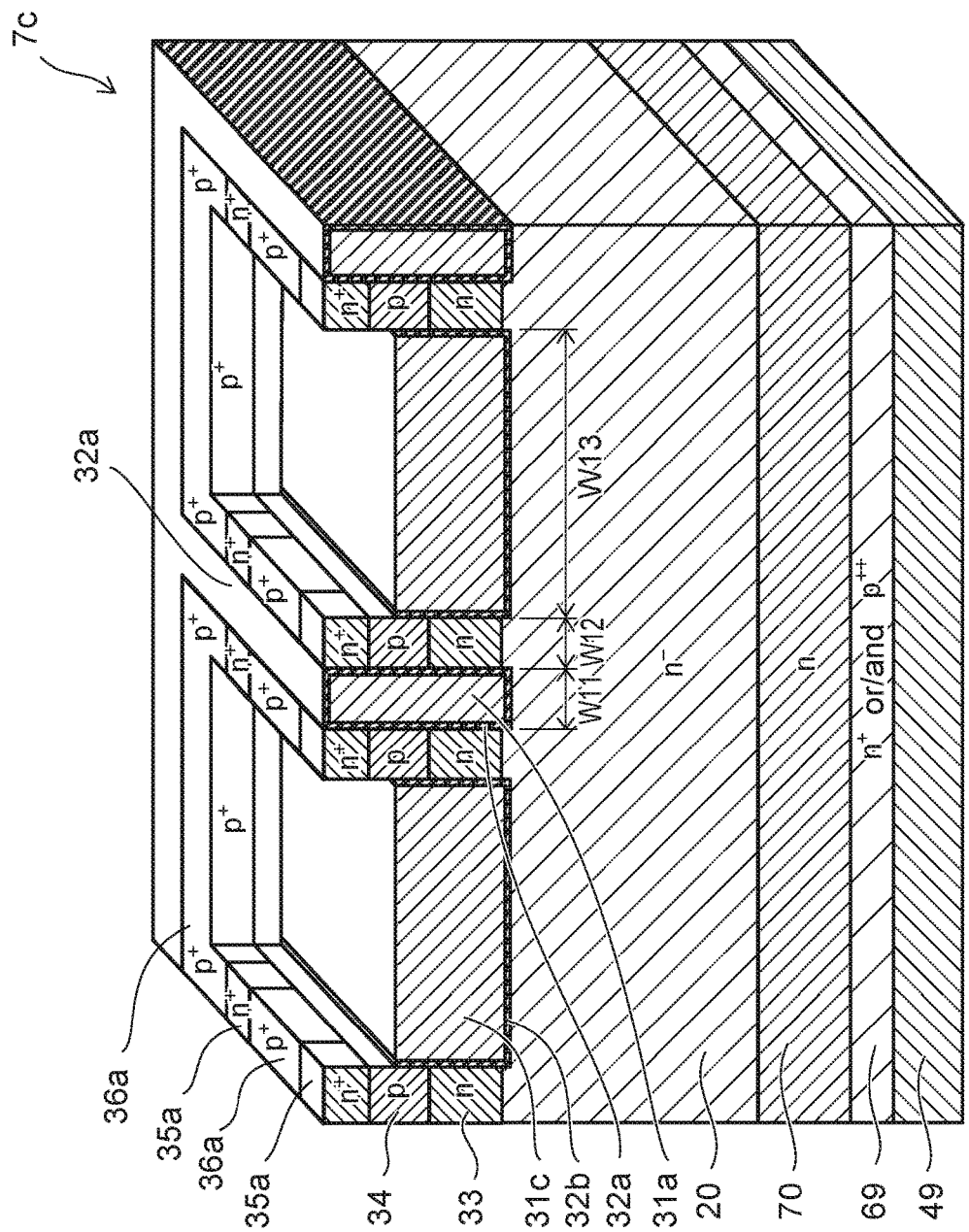
FIG. 29 is a perspective cross-sectional view showing a semiconductor device according to a third modification of the seventh embodiment.

FIG. 29 is a perspective cross-sectional view showing a semiconductor device according to the modification.

In the semiconductor device 7c according to the modification as shown in FIG. 29, the insulating film 32b that is on the upper surface of the electrode 31c is removed; and the electrode 31c contacts the emitter electrode 39 (referring to FIG. 1).

Otherwise, the configuration, the operations, and the effects of the modification are similar to those of the second modification of the seventh embodiment described above.

Fourth Modification of Seventh Embodiment

A fourth modification of the seventh embodiment will now be described.

Figure 30:
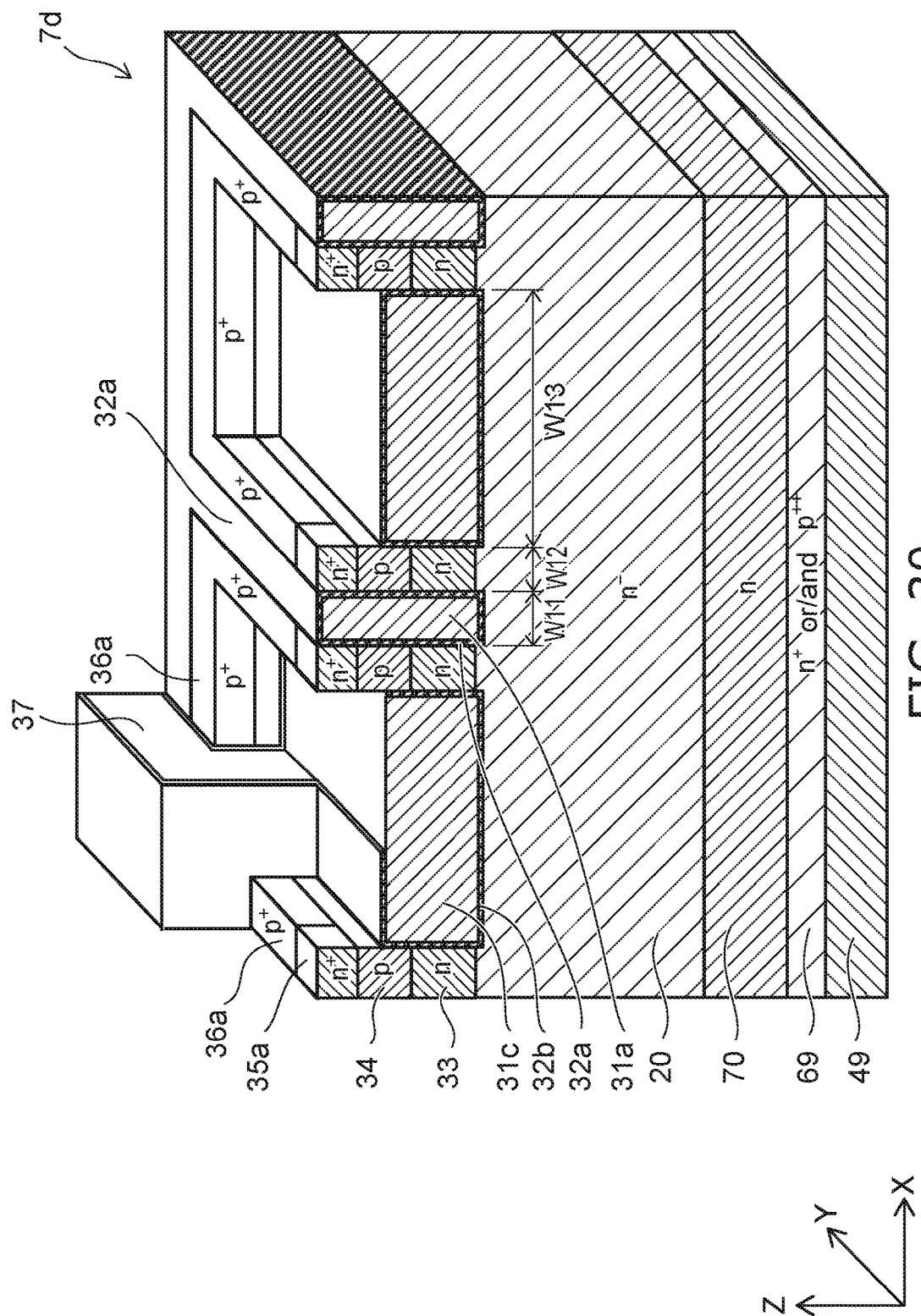
FIG. 30 is a perspective cross-sectional view showing a semiconductor device according to a fourth modification of the seventh embodiment.

FIG. 30 is a perspective cross-sectional view showing a semiconductor device according to the modification.

As shown in FIG. 30, a draw-out electrode 37 is provided on the electrode 31c in the semiconductor device 7d according to the modification. The draw-out electrode 37 is connected to the Y-direction end portion of the electrode 31c and draws out the electrode 31c to the outside. Only a portion of the draw-out electrode 37 is shown in FIG. 30. Actually, the draw-out electrode 37 extends in the X-direction over the entire surface of the emitter side of the semiconductor device 7d.

Fifth Modification of Seventh Embodiment

A fifth modification of the seventh embodiment will now be described.

Figure 31:
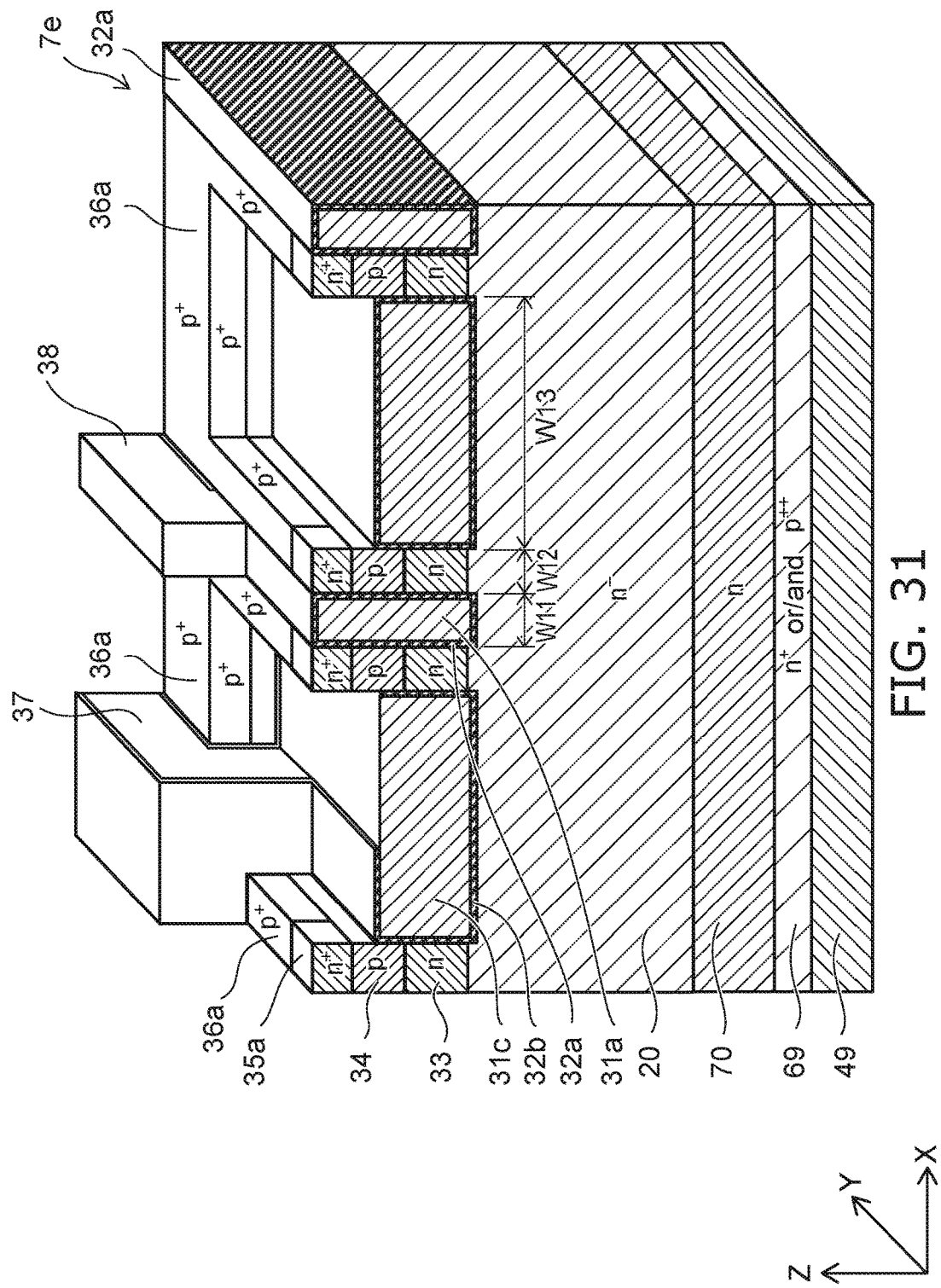
FIG. 31 is a perspective cross-sectional view showing a semiconductor device according to a fifth modification of the seventh embodiment.

FIG. 31 is a perspective cross-sectional view showing a semiconductor device according to the modification.

As shown in FIG. 31, a draw-out electrode 38 is provided on the emitter-side trench gate electrode 31a in the semiconductor device 7e according to the modification. The draw-out electrode 38 is connected to the electrode 31a and draws out the electrode 31a to the outside.

Otherwise, the configuration, the operations, and the effects of the modification are similar to those of the fourth modification of the seventh embodiment described above.

Sixth Modification of Seventh Embodiment

A sixth modification of the seventh embodiment will now be described.

Figure 32:
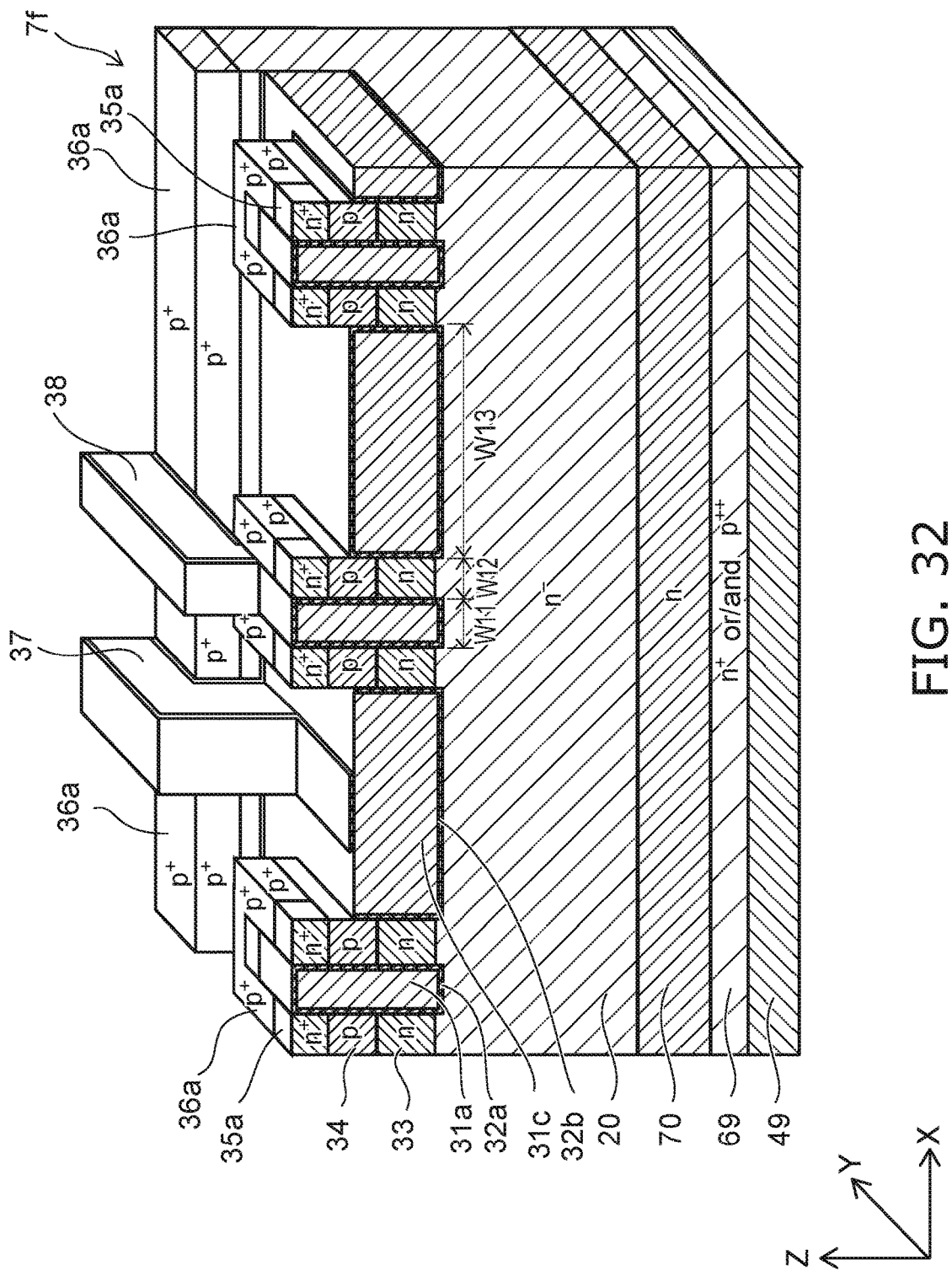
FIG. 32 is a perspective cross-sectional view showing a semiconductor device according to a sixth modification of a seventh embodiment.

FIG. 32 is a perspective cross-sectional view showing a semiconductor device according to the modification.

As shown in FIG. 32, the electrode 31c surrounds the end portions of the two Y-direction sides of the electrode 31a in the semiconductor device 7f according to the modification.

Otherwise, the configuration, the operations, and the effects of the modification are similar to those of the fifth modification of the seventh embodiment described above.

Eighth Embodiment

An eighth embodiment will now be described.

Figure 33:
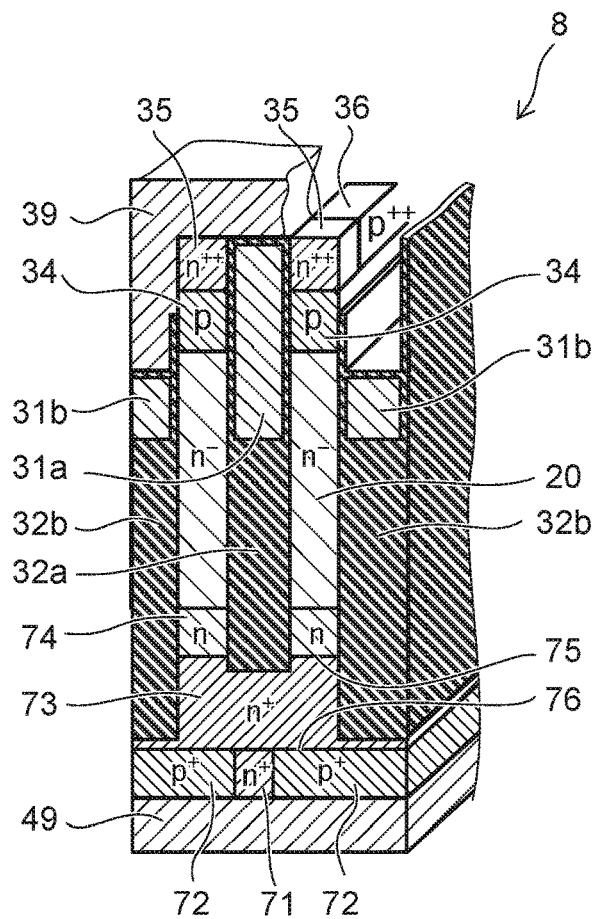
FIG. 33 is a perspective cross-sectional view showing a semiconductor device according to an eighth embodiment.

FIG. 33 is a perspective cross-sectional view showing a semiconductor device according to the embodiment.

In the semiconductor device 8 according to the embodiment as shown in FIG. 33, an $n^+$-type contact layer 71 and a $p^+$-type contact layer 72 are arranged alternately along the X-direction on the collector electrode 49. An $n^+$-type buffer layer 73 is provided on the $n^+$-type contact layer 71 and the $p^+$-type contact layer 72; and an n-type buffer layer 74 is provided on the $n^+$-type buffer layer 73. The upper surface of the n-type buffer layer 74 contacts the lower surface of the $n^-$-type high resistance layer 20. The n-type base layer 33 on the emitter side (referring to FIG. 1) is not provided in the semiconductor device 8.

In the semiconductor device 8, the insulating film 32a extends downward; and the lower end of the insulating film 32a is positioned slightly below an interface 75 between the $n^+$-type buffer layer 73 and the n-type buffer layer 74. Also, the insulating film 32b extends downward; and the lower end of the insulating film 32b is positioned slightly above an interface 76 between the $p^+$-type contact layer 72 and the $n^+$-type buffer layer 73.

According to the embodiment, by setting the insulating films 32a and 32b to extend downward, the surface area of the p-n interface between the p-type base layer 34 and the $n^-$-type high resistance layer 20 can be reduced; and the volume of the depletion layer extending on the $n^-$-type high resistance layer 20 side can be reduced. Thereby, the lifetime of the carriers inside the $n^-$-type high resistance layer 20 can be lengthened.

Generally, when the temperature of the semiconductor device increases, the electrons and the holes combine easily at crystal defects; and the leakage current increases. In the embodiment, by lengthening the lifetime of the carriers, the leakage current when the semiconductor device 8 operates at a high temperature can be suppressed. Therefore, the operating characteristics of the semiconductor device 8 are good at high temperatures, e.g., 200° C.

Otherwise, the configuration, the operations, and the effects of the embodiment are similar to those of the first embodiment described above.

Ninth Embodiment

A ninth embodiment will now be described.

Figure 34:
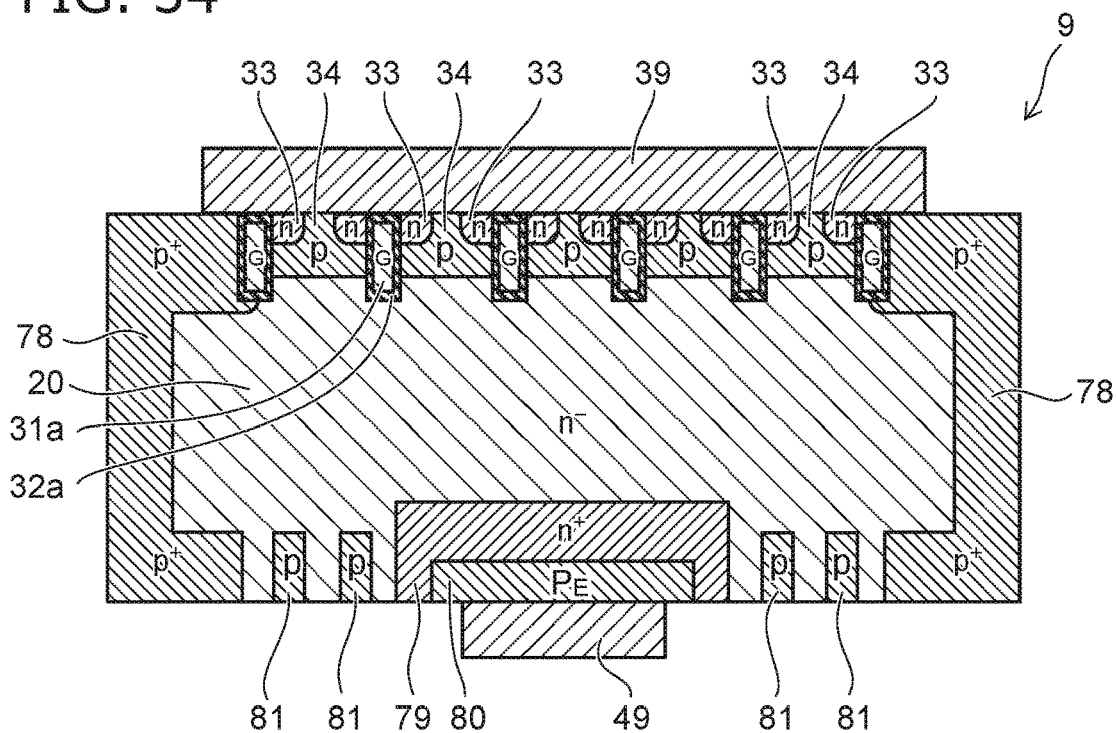
FIG. 34 is a cross-sectional view showing a semiconductor device according to a ninth embodiment.

FIG. 34 is a cross-sectional view showing a semiconductor device according to the embodiment.

As shown in FIG. 34, the configuration of the semiconductor device 9 according to the embodiment is a chip configuration. The semiconductor portion of the semiconductor device 9 is formed of silicon carbide (SiC) or gallium nitride (GaN). The n⁻-type high resistance layer 20 is provided in the semiconductor device 9. A p⁺-type guard ring layer 78 is provided in the terminal portion of the semiconductor device 9 to surround the end portion of the n⁻-type high resistance layer 20.

In the portion (hereinbelow, called the "cell portion") other than the terminal portion of the semiconductor device 9, the p-type base layer 34 is provided on the n⁻-type high resistance layer 20; and the n-type base layer 33 that extends in the Y-direction is provided at a portion of the upper portion of the p-type base layer 34. The multiple emitter-side trench gate electrodes 31a are provided to be adjacent to the n-type base layer 33 and the p-type base layer 34. The electrodes 31a extend in the Y-direction and are arranged periodically along the X-direction. The lower end portion of the electrode 31a is disposed inside the n⁻-type high resistance layer 20.

The insulating film 32a is provided around the electrode 31a. The emitter electrode 39 is provided on the emitter-side trench gate electrode 31a, the n-type base layer 33, the p-type base layer 34, and the end portion of the p⁺-type guard ring layer 78 on the cell portion side and is connected to the p⁺-type guard ring layer 78, the p-type base layer 34, and the n-type base layer 33.

At the X-direction central portion of the cell portion, an n⁺-type layer 79 is provided below the n⁻-type high resistance layer 20; and a p-type layer 80 is provided below the n⁺-type layer 79. The side surface and upper surface of the p-type layer 80 are covered with the n⁺-type layer 79. The lower surface of the p-type layer 80 is connected to the collector electrode 49. Multiple p-type trench layers 81 that extend in the Y-direction are provided at the lower surface of the n⁻-type high resistance layer 20 between the p⁺-type guard ring layer 78 and the n⁺-type layer 79. The terminal structure of the semiconductor device 9 is formed of the p⁺-type guard ring layer 78 and the p-type trench layer 81.

In the embodiment, the breakdown voltage of the terminal portion can be increased by providing the p⁺-type guard ring layer 78 and the p-type trench layer 81.

Otherwise, the configuration, the operations, and the effects of the embodiment are similar to those of the first embodiment described above.

Tenth Embodiment

A tenth embodiment will now be described.

Figure 35:
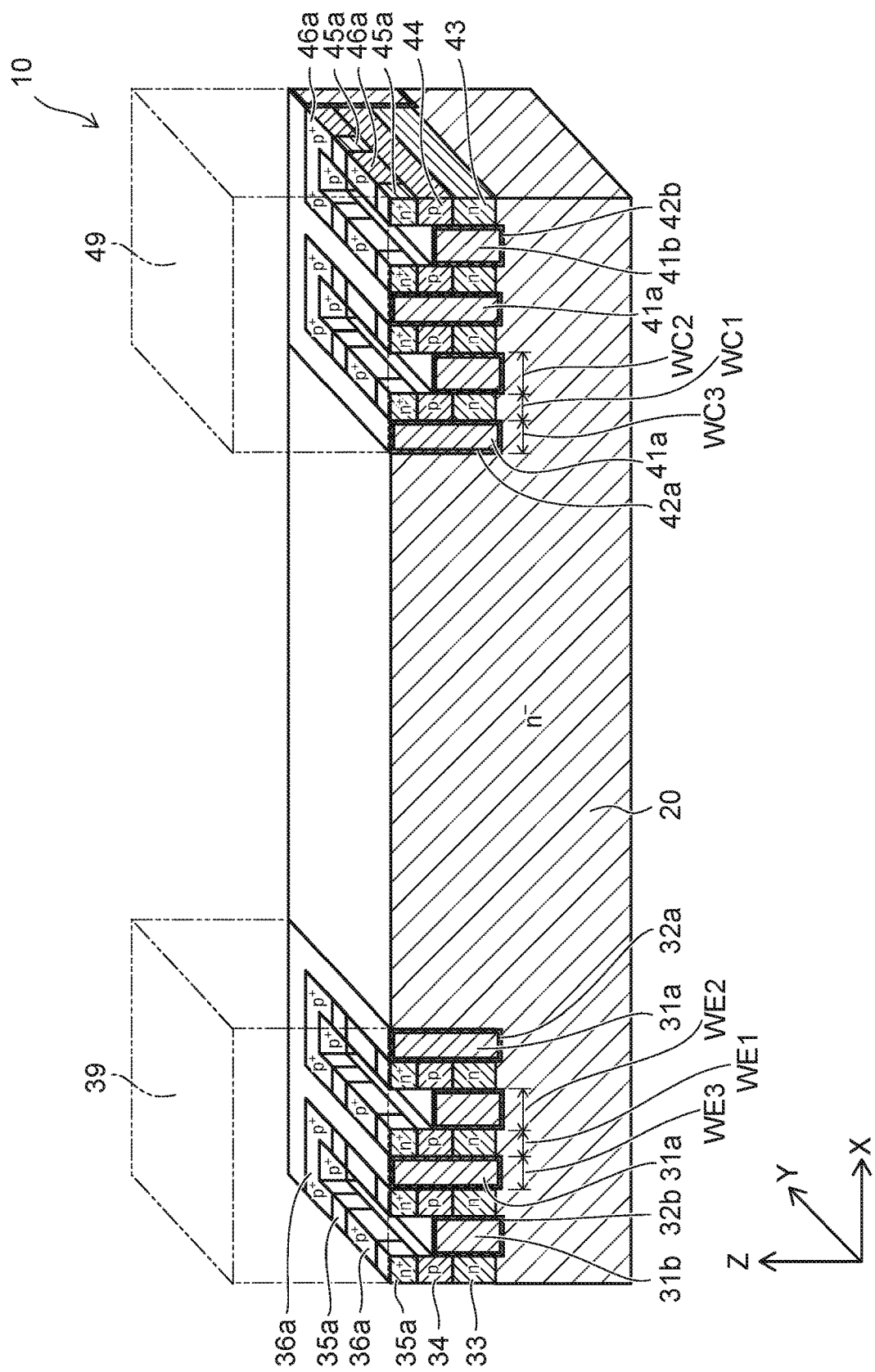
FIG. 35 is a perspective cross-sectional view showing a semiconductor device according to a tenth embodiment.

FIG. 35 is a perspective cross-sectional view showing a semiconductor device according to the embodiment.

As shown in FIG. 35, the semiconductor device 10 according to the embodiment is an IEGT having a lateral double trench gate structure.

In the semiconductor device 10, the structure of the emitter side and the structure of the collector side both are formed in the upper surface of the n⁻-type high resistance layer 20. The emitter electrode 39 and the collector electrode 49 also are disposed to be separated from each other on the upper surface of the n⁻-type high resistance layer 20. Similarly to the seventh embodiment described above (referring to FIG. 26), the region directly above the end portion of the emitter-type trench gate electrode 31b in the Y-direction is surrounded with the p⁺-type contact layer 36a in three directions. Similarly, the region directly above the end portion of the collector-type trench gate electrode 31b in the Y-direction is surrounded with a p⁺-type contact layer 46a in three directions.

To promote the injection of the electrons on the emitter side by the electron IE effect, it is effective for the width WE1 to be narrow, and it is effective for the width WE2 and the width WE3 to be wider than the width WE1, where the trench-gate spacing on the emitter side, i.e., the width of the n-type base layer 33 in the X-direction, is WE1, the width of the electrode 31a is WE3, the width of the electrode 31b is WE2, the trench-gate spacing on the collector side, i.e., the width of the n-type base layer 43 in the X-direction, is WC1, the width of the electrode 41a is WC3, and the width of the electrode 41b is WC2. Also, to promote the injection of the holes on the collector side by the hole IE effect, it is effective for the width WC1 to be narrow, and it is effective for the width WC2 and the width WC3 to be wider than the width WC1. For example, it is favorable for the width WE1 and the width WC1 to be 1 μm or less. The width WE2 and the width WE3 may be configured by a single trench having a wide width or multiple subdivided trenches. This is similar for the width WC2 and the width WC3 as well.

For example, it is favorable when $$WE2 > 2 \times WE1,$$

$$WE3 > 2 \times WE1,$$

$$WC2 > 2 \times WC1, \text{ and}$$

$$WC3 > 2 \times WC1;$$

and more favorable when $$WE2 > 10 \times WE1,$$

$$WE3 > 10 \times WE1,$$

$$WC2 > 10 \times WC1, \text{ and}$$

$$WC3 > 10 \times WC1.$$

Otherwise, the configuration, the operations, and the effects of the embodiment are similar to those of the first embodiment described above.

Eleventh Embodiment

An eleventh embodiment will now be described.

Figure 36:
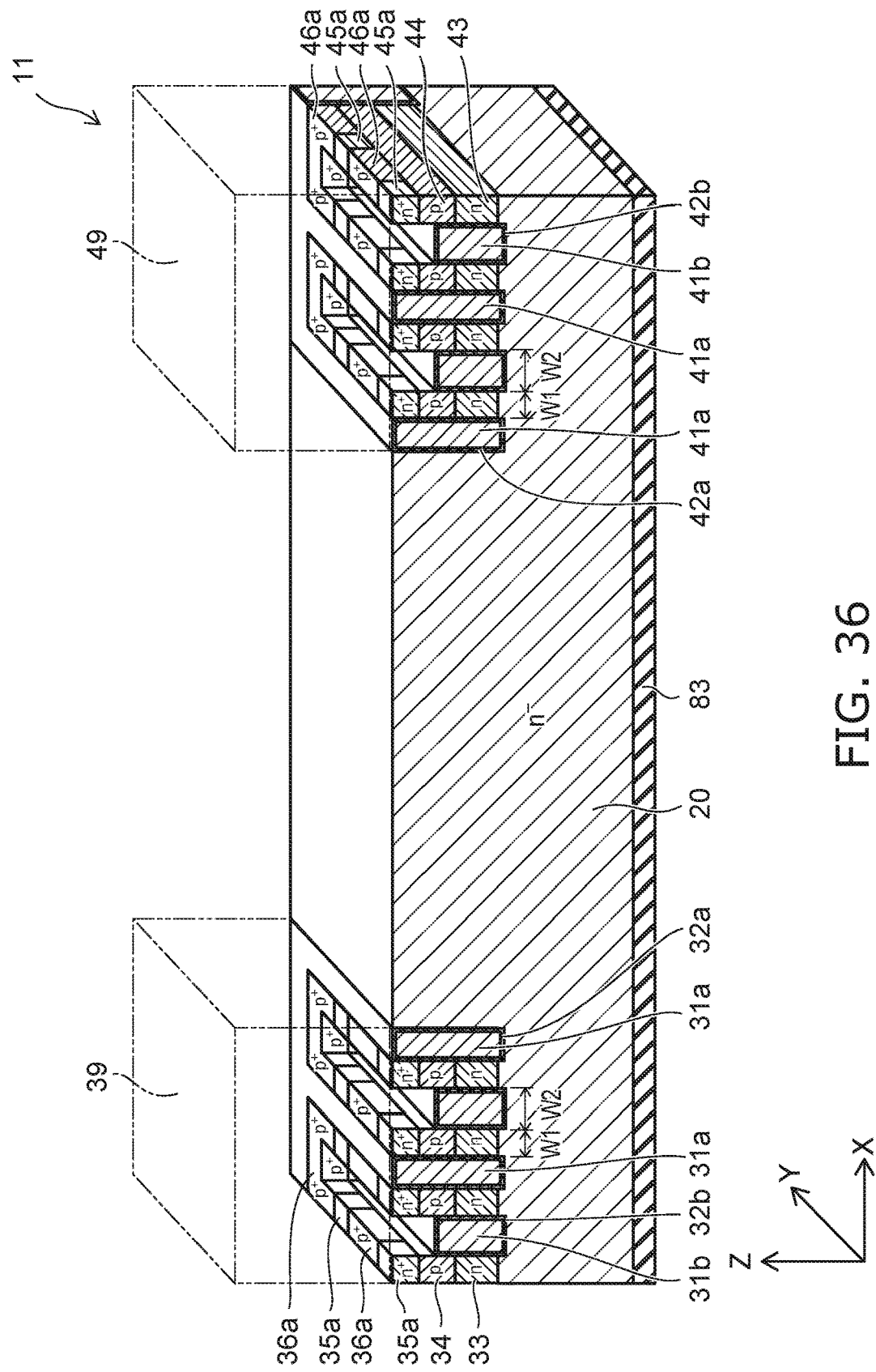
FIG. 36 is a perspective cross-sectional view showing a semiconductor device according to an eleventh embodiment.

FIG. 36 is a perspective cross-sectional view showing a semiconductor device according to the embodiment.

As shown in FIG. 36, an insulating film 83 is provided on the lower surface of the n⁻-type high resistance layer 20 in the semiconductor device 11 according to the embodiment in addition to the configuration of the semiconductor device 10 according to the tenth embodiment described above (referring to FIG. 35). Thereby, the leakage current via the lower surface of the n⁻-type high resistance layer 20 can be blocked reliably.

Otherwise, the configuration, the operations, and the effects of the embodiment are similar to those of the tenth embodiment described above.

A silicon substrate (not shown) may be provided below the insulating film 83. This is advantageous for high speed switching operations because the IEGT can be formed in the silicon layer of an SOI (silicon on insulator) substrate.

Twelfth Embodiment

A twelfth embodiment will now be described.

Figure 37:
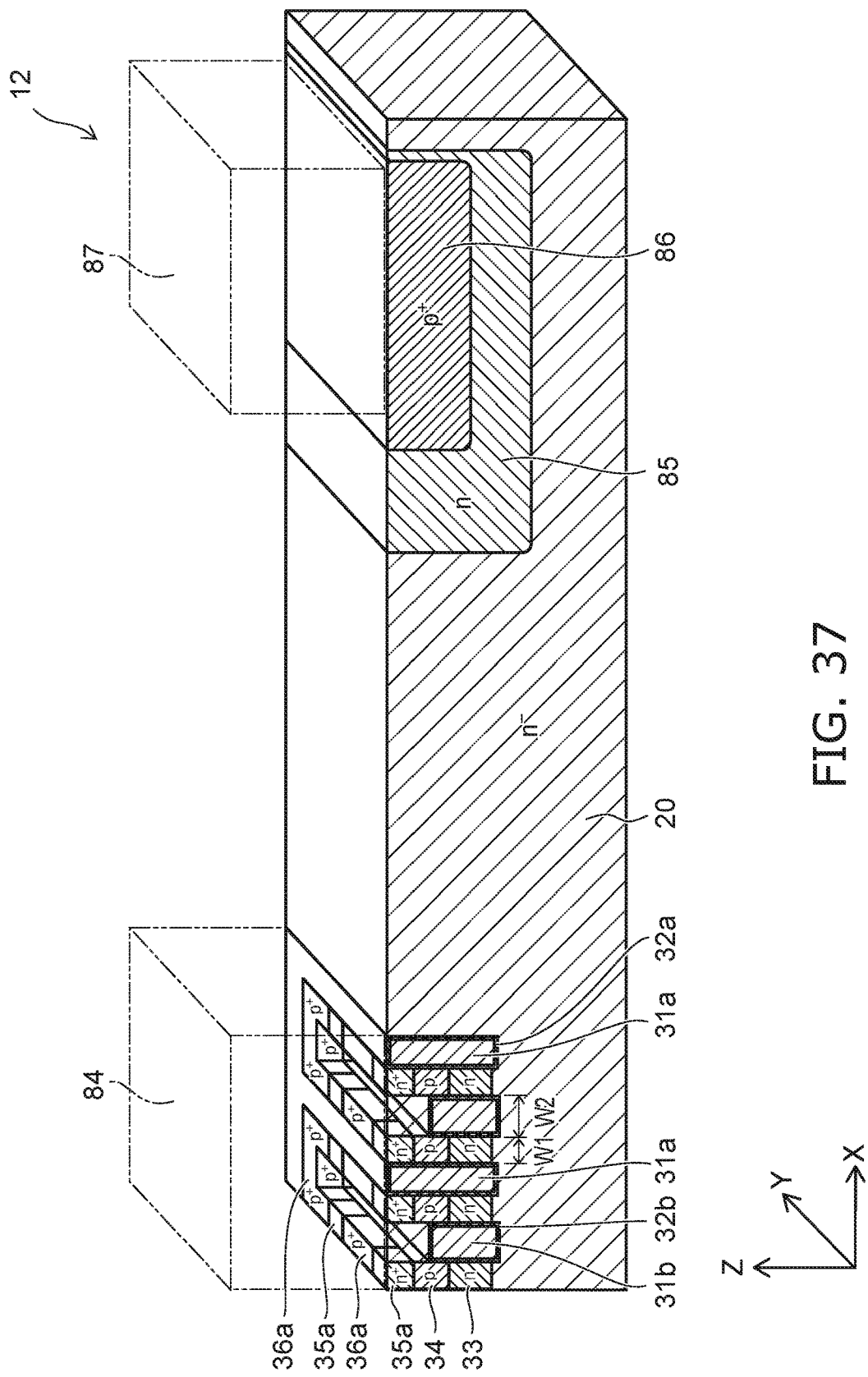
FIG. 37 is a perspective cross-sectional view showing a semiconductor device according to a twelfth embodiment.

FIG. 37 is a perspective cross-sectional view showing a semiconductor device according to the embodiment.

As shown in FIG. 37, the semiconductor device 12 according to the embodiment is a lateral MOSFET.

As shown in FIG. 37, the configuration of the semiconductor device 12 on the source side is similar to the configuration of the emitter side of the semiconductor device according to the tenth embodiment described above (referring to FIG. 35). The p-type base layer 34, an n$^+$-type contact layer 35a, and the p$^+$-type contact layer 36a are connected to a source electrode 84.

On the other hand, on the drain side of the semiconductor device 12, an n-type drift layer 85 is provided on the n$^-$-type high resistance layer 20; and a p$^+$-type drain layer 86 is provided on the n-type drift layer 85. The p$^+$-type drain layer 86 is separated from the n$^-$-type high resistance layer 20 by the n-type drift layer 85. The p$^+$-type drain layer 86 is connected to a drain electrode 87.

In the semiconductor device 12, a p-n-p-type field effect transistor is formed of the p-type base layer 34, the n$^-$-type high resistance layer 20, the n-type drift layer 85, and the p$^+$-type drain layer 86.

Otherwise, the configuration, the operations, and the effects of the embodiment are similar to those of the tenth embodiment described above.

Thirteenth Embodiment

A thirteenth embodiment will now be described.

Figure 38:
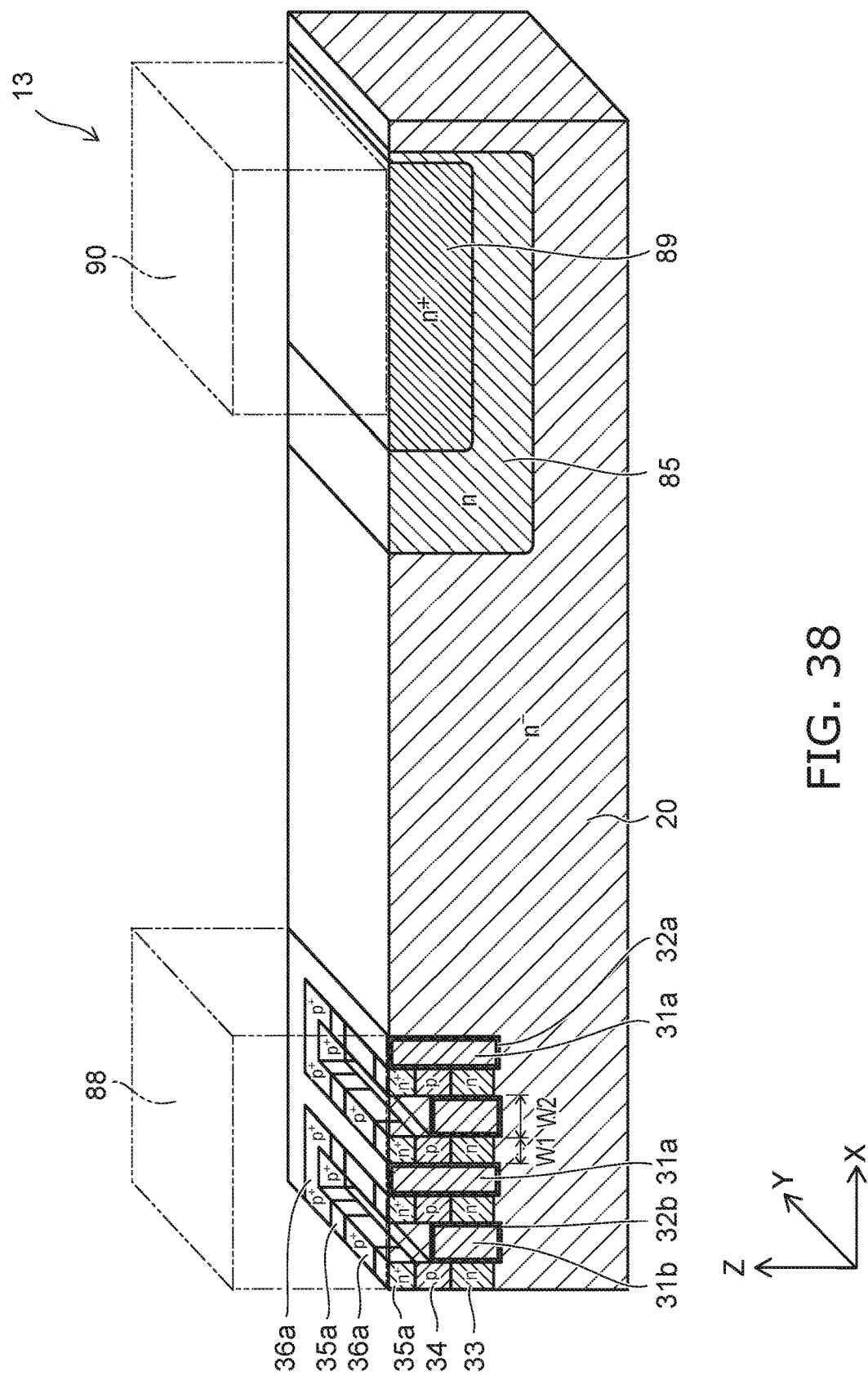
FIG. 38 is a perspective cross-sectional view showing a semiconductor device according to a thirteenth embodiment.

FIG. 38 is a perspective cross-sectional view showing a semiconductor device according to the embodiment.

The semiconductor device 13 according to the embodiment is a lateral p-n diode as shown in FIG. 38.

As shown in FIG. 38, the configuration of the semiconductor device 13 on the anode side is similar to the configuration of the emitter side of the semiconductor device according to the tenth embodiment described above (referring to FIG. 35). The p-type base layer 34, the n$^+$-type contact layer 35a, and the p$^+$-type contact layer 36a are connected to an anode electrode 88.

On the other hand, on the cathode side of the semiconductor device 13, the n-type drift layer 85 is provided on the n$^-$-type high resistance layer 20; and an n$^+$-type cathode layer 89 is provided on the n-type drift layer 85. The n$^+$-type cathode layer 89 is separated from the n$^-$-type high resistance layer 20 by the n-type drift layer 85. The n$^+$-type cathode layer 89 is connected to a cathode electrode 90.

In the semiconductor device 13, a p-n diode is formed of the p-type base layer 34, the n$^-$-type high resistance layer 20, the n-type drift layer 85, and the n$^+$-type cathode layer 89.

Otherwise, the configuration, the operations, and the effects of the embodiment are similar to those of the tenth embodiment described above.

Fourteenth Embodiment

A fourteenth embodiment will now be described.

Figure 39:
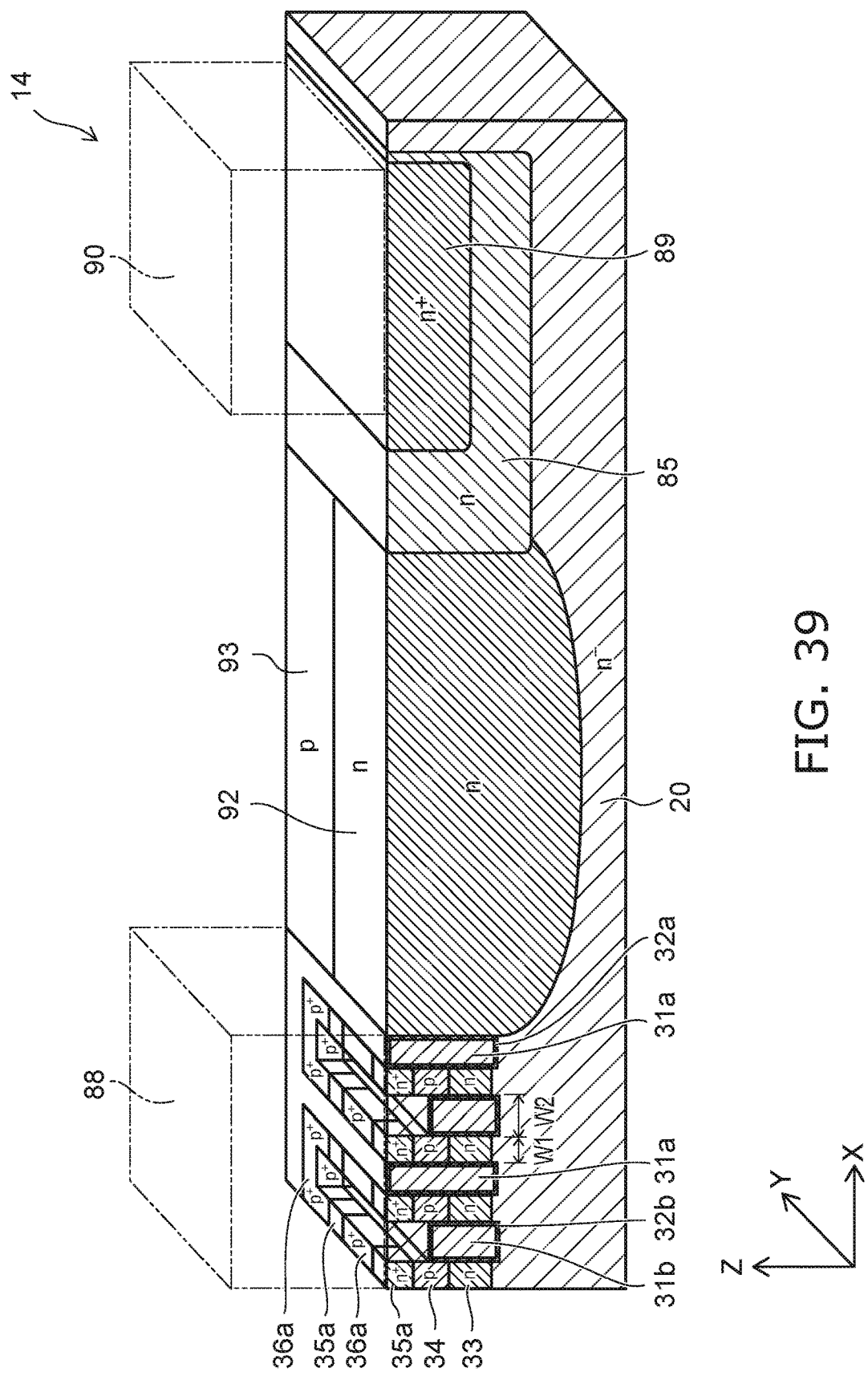
FIG. 39 is a perspective cross-sectional view showing a semiconductor device according to a fourteenth embodiment.

FIG. 39 is a perspective cross-sectional view showing a semiconductor device according to the embodiment.

As shown in FIG. 39, an n-type layer 92 and a p-type layer 93 that extend in the X-direction from the anode side toward the cathode side are provided in the semiconductor device 14 according to the embodiment in addition to the configuration of the semiconductor device 13 according to the thirteenth embodiment described above. The n-type layer 92 and the p-type layer 93 are arranged alternately along the Y-direction.

According to the embodiment, both the increase of the ON current and the increase of the breakdown voltage can be realized because a super junction structure is formed of the n-type layer 92 and the p-type layer 93.

Otherwise, the configuration, the operations, and the effects of the embodiment are similar to those of the thirteenth embodiment described above.

Fifteenth Embodiment

A fifteenth embodiment will now be described.

Figure 40:
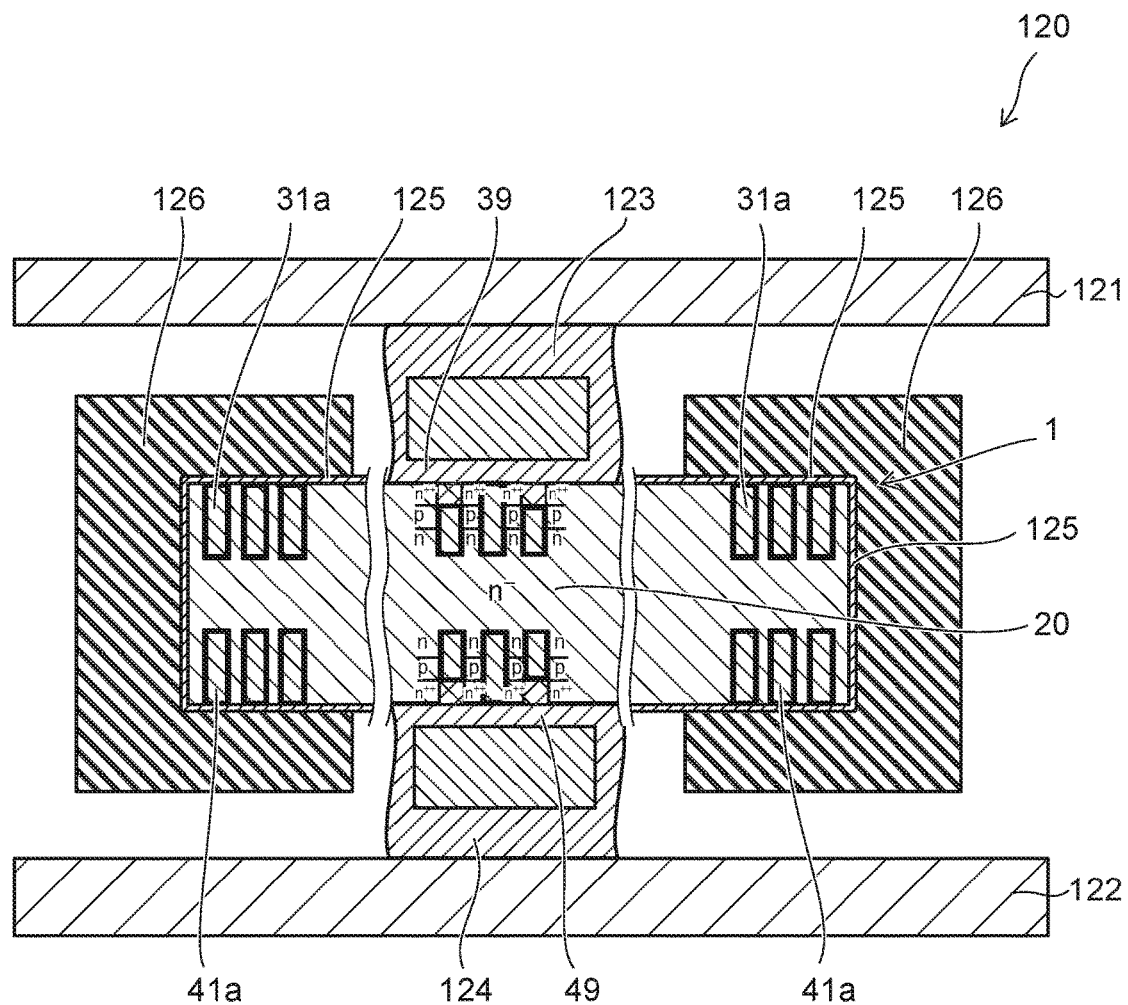
FIG. 40 is a cross-sectional view showing a package according to a fifteenth embodiment.

FIG. 40 is a cross-sectional view showing a package according to the embodiment.

As shown in FIG. 40, the embodiment is an example of a package in which the semiconductor device is mounted.

As shown in FIG. 40, an emitter-side electrode plate 121 and a collector-side electrode plate 122 are provided in the package 120 according to the embodiment; and the semiconductor device 1 is provided between the emitter-side electrode plate 121 and the collector-side electrode plate 122. The configuration of the semiconductor device 1 is similar to that of the semiconductor device 1 according to the first embodiment described above (referring to FIG. 1).

The configurations of the emitter-side electrode plate 121 and the collector-side electrode plate 122 both are plate configurations; and the outer edges of the emitter-side electrode plate 121 and the collector-side electrode plate 122 are outside the outer edge of the semiconductor device 1 as viewed from the Z-direction. Connection members 123 and 124 are provided in the package 120; the emitter-side electrode plate 121 is connected to the emitter electrode 39 of the semiconductor device 1 via the connection member 123; and the collector-side electrode plate 122 is connected to the collector electrode 49 of the semiconductor device 1 via the connection member 124.

A field plate electrode 125 is provided on the surface of the terminal portion of the semiconductor device 1 and covers the entire terminal portion. A capping material 126 is provided in the package 120 and covers the field plate electrode 125. For example, the capping material 126 is formed of a semi-insulating polycrystalline silicon (SIPOS) layer. The capping material 126 is separated a prescribed distance from the emitter-side electrode plate 121 and the collector-side electrode plate 122. The capping material 126 may be formed of non-doped polysilicon.

Thus, in the package 120 according to the embodiment, by covering the terminal portion of the chip made of the semiconductor device 1 with the field plate electrode 125 and by covering the outside of the terminal portion with the semi-insulating capping material 126, the concentration of the electric field at the terminal portion can be relaxed; and the breakdown voltage of the terminal portion can be increased.

Otherwise, the configuration, the operations, and the effects of the embodiment are similar to those of the first embodiment described above.

Sixteenth Embodiment

A sixteenth embodiment will now be described.

Figure 41:
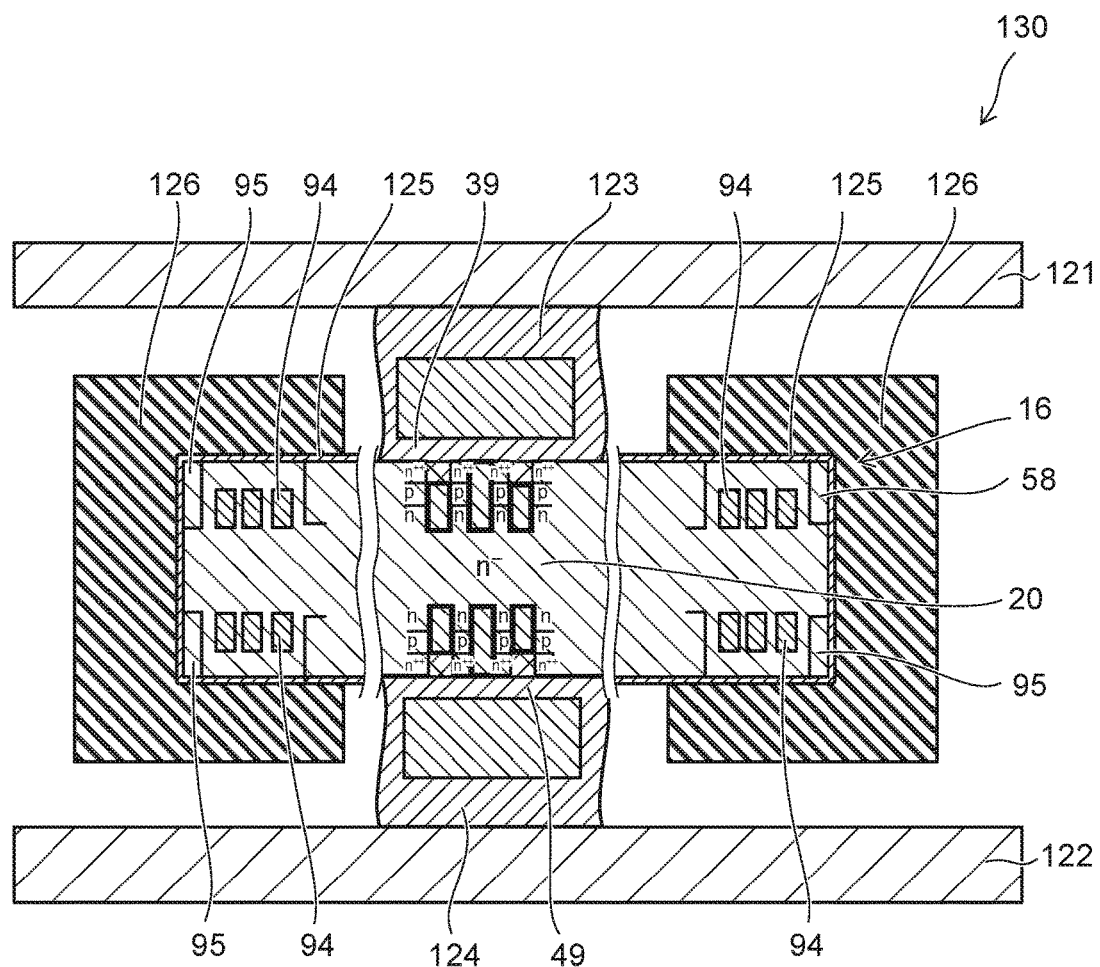
FIG. 41 is a cross-sectional view showing a package according to a sixteenth embodiment.

FIG. 41 is a cross-sectional view showing a package according to the embodiment.

As shown in FIG. 41, the package 130 according to the embodiment differs from the package 120 according to the fifteenth embodiment described above (referring to FIG. 40) in that a semiconductor device 16 is provided instead of the semiconductor device 1.

In the semiconductor device 16, the emitter-side trench gate electrode 31a and the collector-side trench gate electrode 41a are not provided at the terminal portion; and a p-type RESURF layer 94 and an n$^+$-type RESURF layer 95 are provided instead. The p-type RESURF layer 94 is disposed at a position separated from the chip surface; and the n$^+$-type RESURF layer 95 is disposed at a corner of the chip and contacts the field plate electrode 125.

According to the embodiment, the depletion layer reaching the terminal portion can be suppressed by providing the p-type RESURF layer 94 and the n$^+$-type RESURF layer 95 at the terminal portion of the semiconductor device 16. Thereby, the breakdown voltage of the terminal portion improves even further.

Otherwise, the configuration, the operations, and the effects of the embodiment are similar to the fifteenth embodiment described above.

Seventeenth Embodiment

A seventeenth embodiment will now be described.

Figure 42:
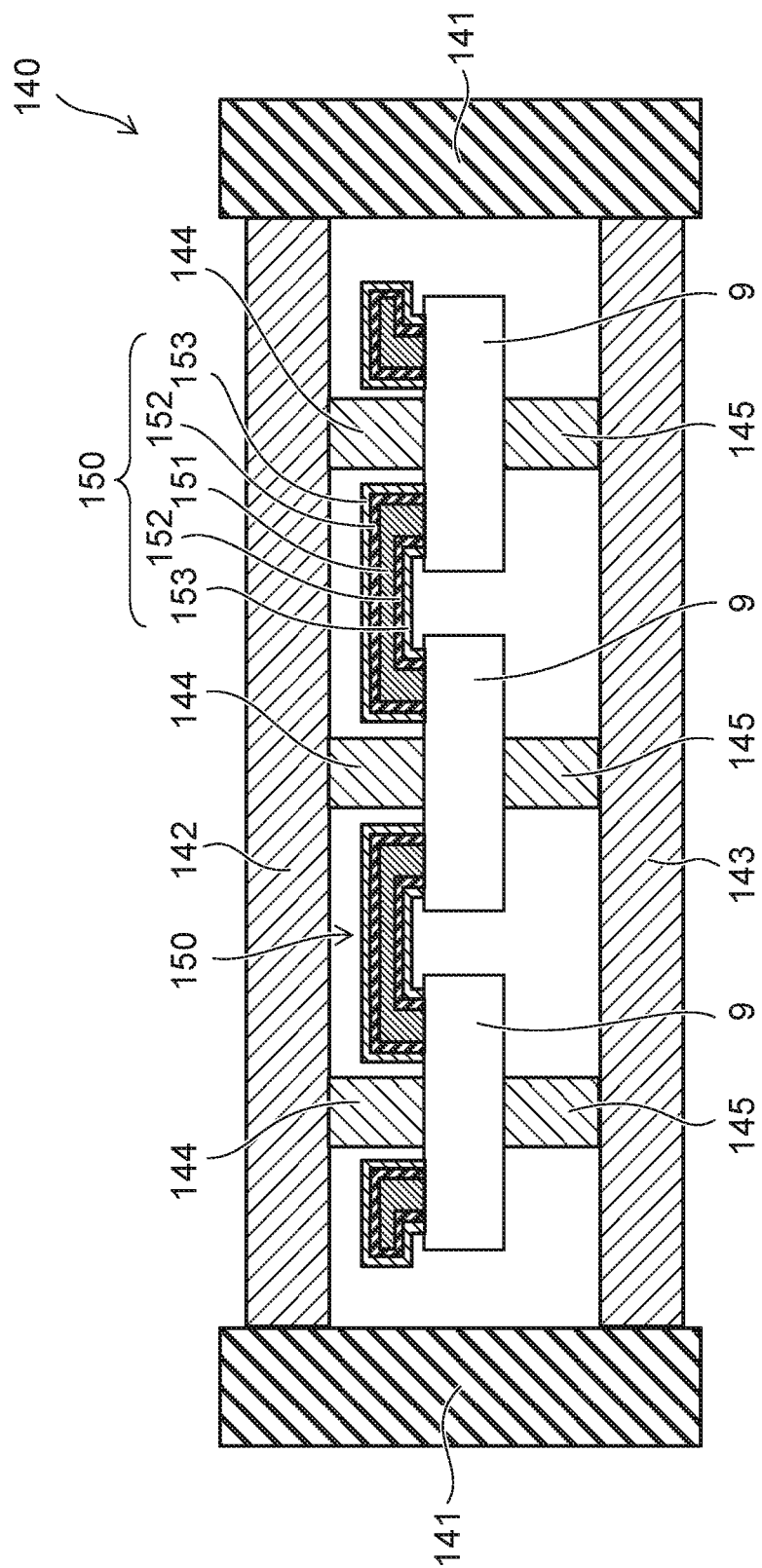
FIG. 42 is a cross-sectional view showing a package according to a seventeenth embodiment.

FIG. 42 is a cross-sectional view showing a package according to the embodiment.

As shown in FIG. 42, a housing 141 that is insulative and has a tubular configuration is provided in the package 140 according to the embodiment; and external electrodes 142 and 143 are fitted respectively into the lower end portion and upper end portion of the housing 141. The multiple semiconductor devices 9 (referring to FIG. 34) are connected in parallel inside the housing 141 between the external electrode 142 and the external electrode 143. As described above, the semiconductor portions of the semiconductor devices 9 are formed of silicon carbide (SiC) or gallium nitride (GaN).

Connection members 144 and 145 are provided in the package 140. The external electrode 142 is connected to the emitter electrodes 39 of the semiconductor devices 9 (referring to FIG. 34) via the connection member 144. The external electrode 142 and the connection member 144 are bonded by solder; and the connection member 144 and the emitter electrode 39 are bonded by solder. The external electrode 143 is connected to the collector electrodes 49 of the semiconductor devices 9 (referring to FIG. 34) via the connection member 145. The external electrode 143 and the connection member 145 are bonded by solder; and the connection member 145 and the collector electrode 49 are bonded by solder. The current path from the external electrode 142 via the connection member 144 to the emitter electrode 39 and the current path from the external electrode 143 via the connection member 145 to the collector electrode 49 have straight line configurations. The emitter-side trench gate electrodes 31a of the mutually-adjacent semiconductor devices 9 (referring to FIG. 34) are connected to each other by a gate interconnect 150. A core interconnect 151 that is connected to the emitter-side trench gate electrode 31a is provided in the gate interconnect 150; and the periphery of the core interconnect 151 is covered with an insulating layer 152. A shield interconnect 153 that has a pipe-like configuration is provided around the insulating layer 152. A fixed potential is applied to the shield interconnect 153; and, for example, the ground potential is applied by being connected to the emitter electrode 39.

According to the embodiment, the emitter-side trench gate electrodes 31a of the semiconductor devices 9 are connected by the gate interconnect 150. In the gate interconnect 150, the periphery of the core interconnect 151 is covered with the shield interconnect 153 to which a fixed potential is applied. Thereby, it is possible to reduce the inductance of the gate interconnect 150 and to provide active control and a higher speed of the switching operations of the multiple semiconductor devices 9 connected in parallel. As a result, the multiple semiconductor devices 9 that are formed of a wide-gap semiconductor such as silicon carbide (SiC), gallium nitride (GaN), etc., can operate in parallel without loss of the high speed operation characteristics of the semiconductor devices 9 themselves.

In the package 140 according to the embodiment, the multiple semiconductor devices 9 are connected in straight lines to the common external electrodes 142 and 143 via the connection members 144 and 145. Thereby, the thermal resistance between the semiconductor devices 9 and the external electrodes 142 and 143 is low; and heat dissipation can be performed from two surfaces of the semiconductor device 9. Therefore, the cooling performance of the semiconductor devices 9 is high.

Thus, according to the embodiment, the multiple semiconductor devices 9 that are connected in parallel can operate at a high speed without a loss of cooling performance. As a result, the entire package 140 can operate at a high speed while effectively utilizing the high speed operation characteristics of the semiconductor devices 9 formed of a semiconductor material having a wide bandgap such as silicon carbide, gallium nitride, etc.

Otherwise, the configuration, the operations, and the effects of the embodiment are similar to those of the ninth embodiment described above.

Eighteenth Embodiment

An eighteenth embodiment will now be described.

Figure 43:
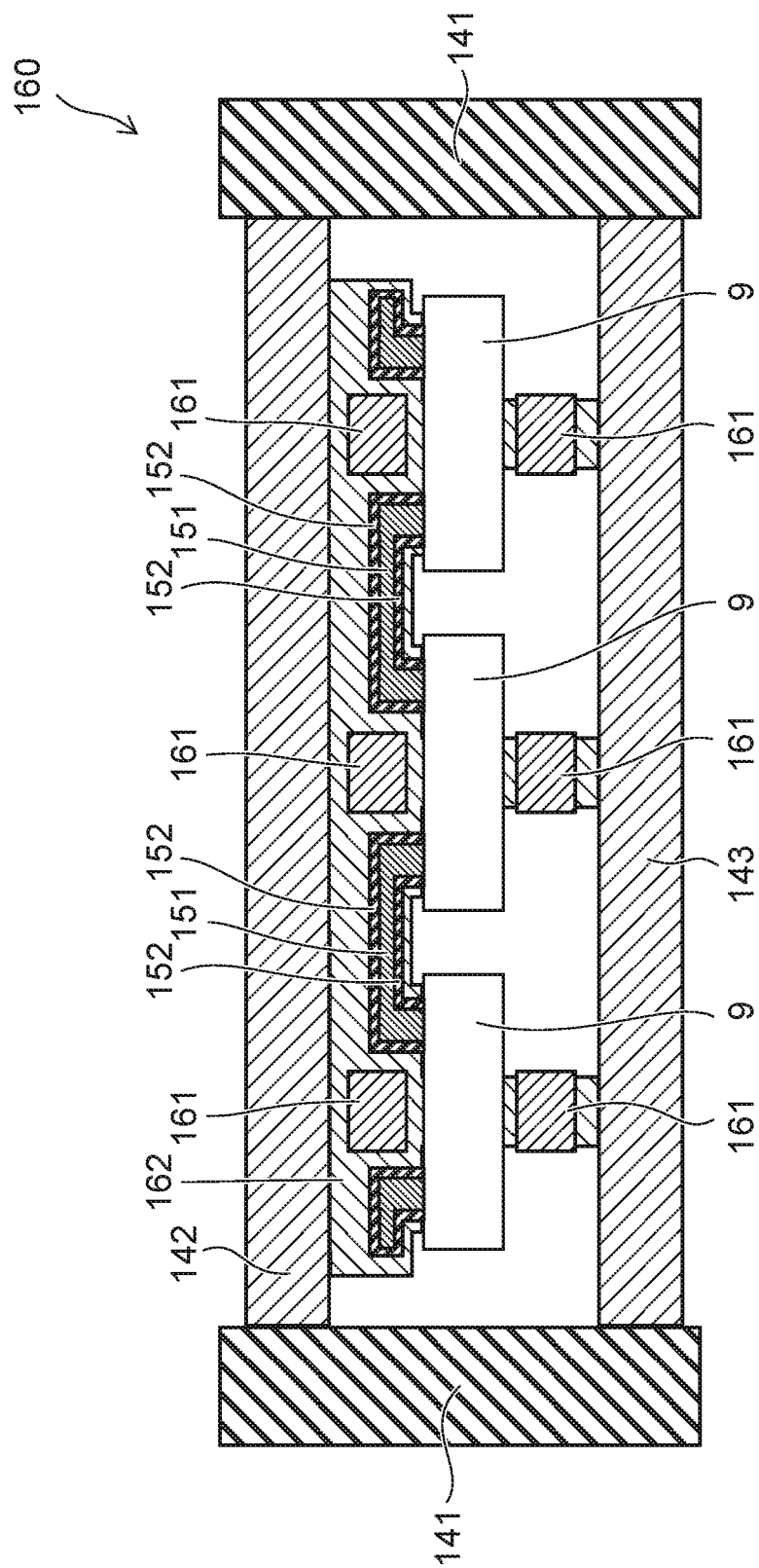
FIG. 43 is a cross-sectional view showing a package according to an eighteenth embodiment.

FIG. 43 is a cross-sectional view showing a package according to the embodiment.

In the package 160 according to the embodiment as shown in FIG. 43, compared to the package 140 according to the seventeenth embodiment described above (referring to FIG. 42), the connection members 144 and 145 and the shield interconnect 153 are not provided; and a spacer electrode 161 and a conductive paste 162 are provided instead. The spacer electrode 161 and the conductive paste 162 are filled between the external electrode 142 and the surfaces of the semiconductor devices 9 on the emitter side. The conductive paste 162 is, for example, solder paste.

The spacer electrode 161 and the conductive paste 162 function as shield materials for the core interconnect 151 and the conductive material that conduct, to the emitter electrode 39, the emitter potential applied to the external electrode 142. Also, the spacer electrode 161 and the conductive paste 162 function as thermally conductive materials that conduct, to the external electrode 142, the heat generated by the semiconductor devices 9. Thereby, in the package 160 according to the embodiment, compared to the package 140 according to the seventeenth embodiment described above, the interconnect resistance and inductance on the emitter side are low; and the thermal conductivity is high.

Otherwise, the configuration, the operations, and the effects of the embodiment are similar to those of the seventeenth embodiment described above.

Nineteenth Embodiment

A nineteenth embodiment will now be described.

Figure 44:
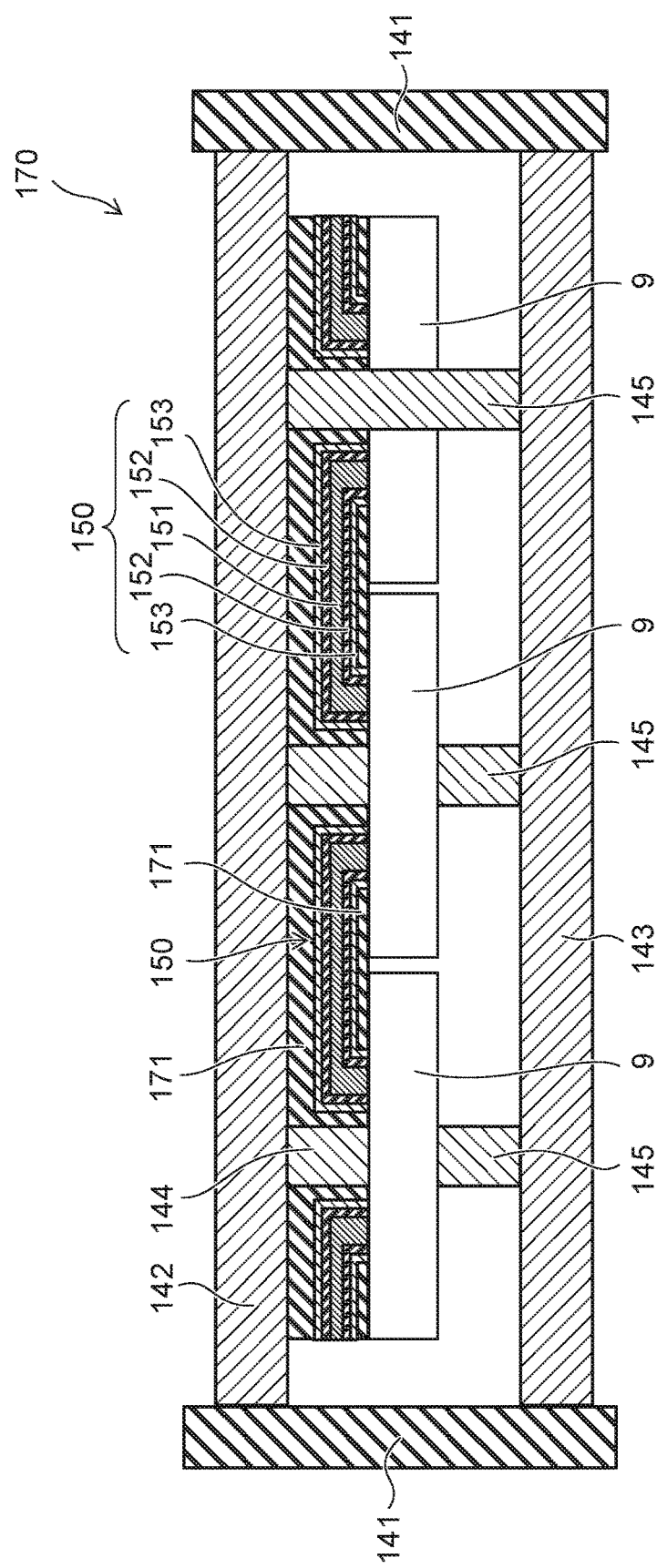
FIG. 44 is a cross-sectional view showing a semiconductor package according to a nineteenth embodiment.

FIG. 44 is a cross-sectional view showing a semiconductor package according to the embodiment.

As shown in FIG. 44, an insulating member 171 is provided in the package 170 according to the embodiment in addition to the configuration of the package 140 according to the seventeenth embodiment described above (referring to FIG. 42). The insulating member 171 is filled between the external electrode 142 and the surfaces of the semiconductor devices 9 on the emitter side.

According to the embodiment, the cooling performance is high because the insulating member 171 also conducts heat in addition to the connection members 144 and 145.

Otherwise, the configuration, the operations, and the effects of the embodiment are similar to those of the seventeenth embodiment described above.

Twentieth Embodiment

A twentieth embodiment will now be described.

Figure 45:
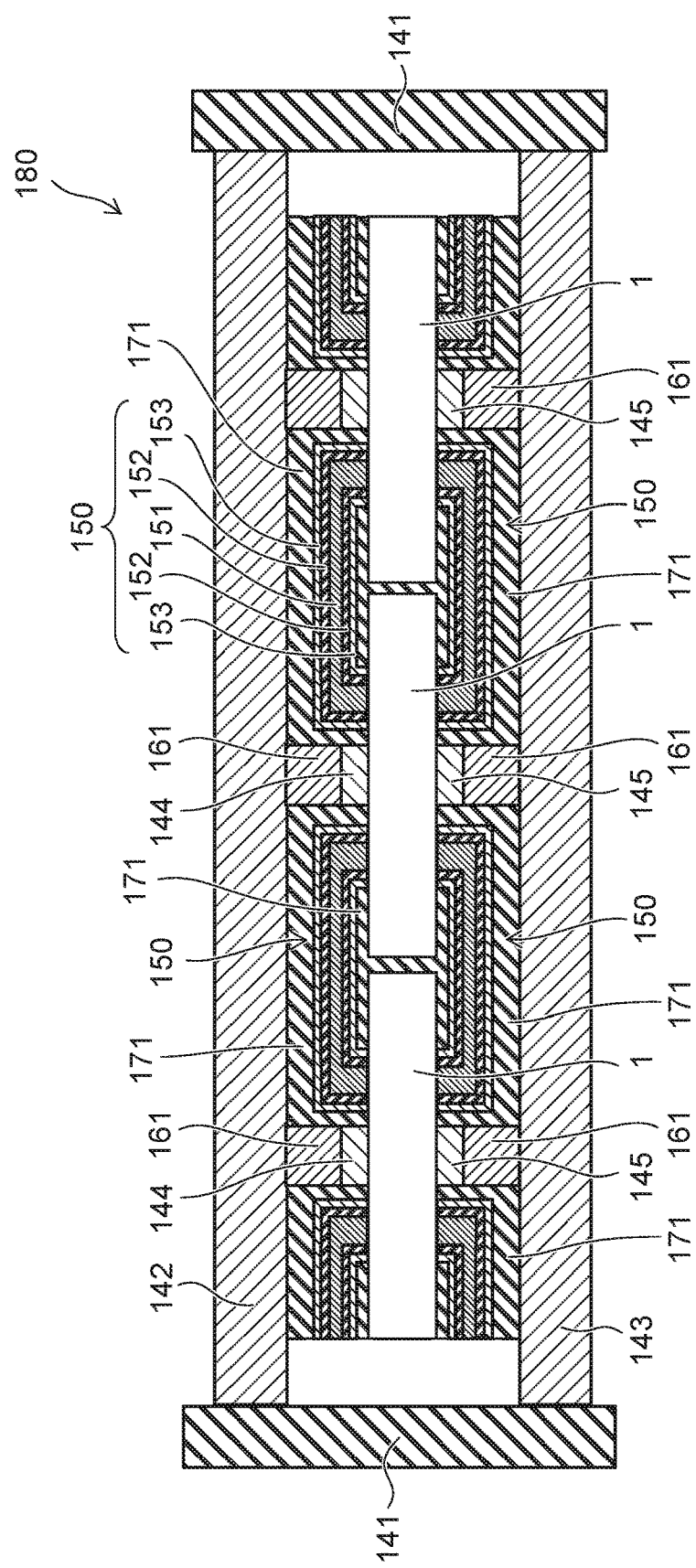
FIG. 45 is a cross-sectional view showing a semiconductor package according to a twentieth embodiment.

FIG. 45 is a cross-sectional view showing a semiconductor package according to the embodiment.

In the package 180 according to the embodiment as shown in FIG. 45, compared to the package 170 according to the nineteenth embodiment described above (referring to FIG. 37), the double-sided trench gate-type semiconductor devices 1 (referring to FIG. 1) are provided instead of the single-sided trench gate-type semiconductor devices 9 (referring to FIG. 34).

The emitter electrodes 39 of the semiconductor devices 1 (referring to FIG. 1) are connected to the external electrode 142 via the connection member 144 and the spacer electrode 161. The collector electrodes 49 (referring to FIG. 1) are connected to the external electrode 143 via the connection member 145 and the spacer electrode 161. The emitter-side trench gate electrodes 31a and 31b of the mutually-adjacent semiconductor devices 1 are connected to each other by the gate interconnect 150. Similarly, the collector-side trench gate electrodes 41a and 41b of the mutually-adjacent semiconductor devices 1 are connected to each other by the gate interconnect 150. The insulating member 171 is filled between the external electrode 142 and the semiconductor devices 1 and between the external electrode 143 and the semiconductor devices 1.

According to the embodiment, similar to the nineteenth embodiment, the package may include the double-sided trench gate-type semiconductor device as well.

Otherwise, the configuration, the operations, and the effects of the embodiment are similar to those of the nineteenth embodiment described above.

Twenty-First Embodiment

A twenty-first embodiment will now be described.

The embodiment summarily describes a first method for manufacturing the semiconductor device 1 according to the first embodiment described above (referring to FIGS. 4A and 4B).

FIG. 46 to FIG. 53 are cross-sectional views showing the method for manufacturing the semiconductor device according to the embodiment.

Figure 46:
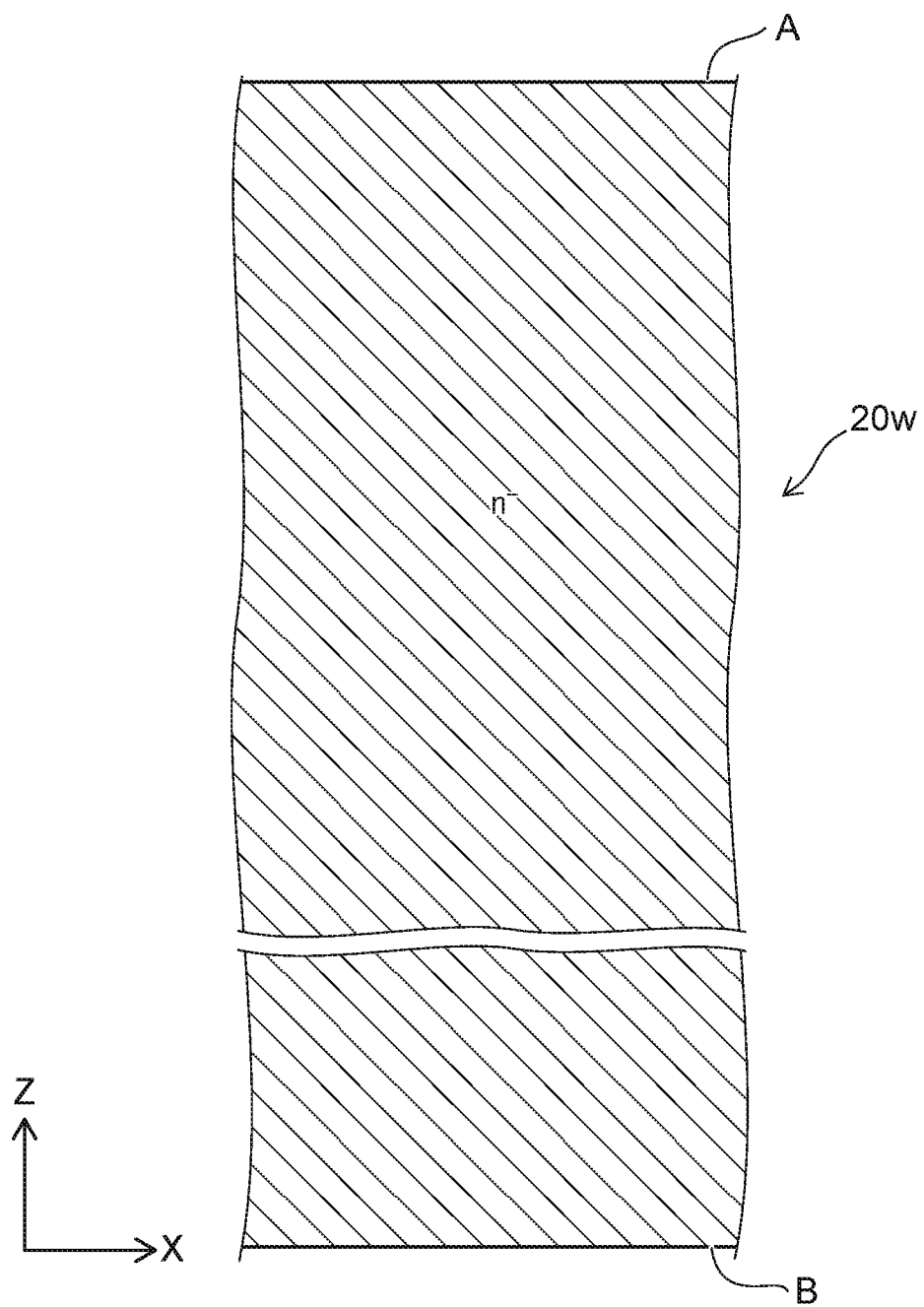
FIG. 46 to FIG. 53 are cross-sectional views showing the method for manufacturing a twenty-first semiconductor device according to the embodiment.

First, an $n^-$-type high resistance wafer 20w is prepared as shown in FIG. 46. The thickness of the $n^-$-type high resistance wafer 20w is, for example, several hundred μm. Hereinbelow, for convenience of description, one surface of the $n^-$-type high resistance wafer 20w is called a surface A; and another surface of the $n^-$-type high resistance wafer 20w is called a surface B. The surface A is used to form the emitter side (the cathode side); and the surface B is used to form the collector side (the anode side).

Although the surface A is notated as the upper side and the surface B is notated as the lower side constantly in the following drawings, the wafer is flipped as necessary in the actual processes. For example, normally, the wafer is held so that the surface B is the upper side in processes that perform processing of the surface B. Although only the method for forming the main portions of the semiconductor device are described summarily in the description hereinbelow, in the actual processes, various processes are appropriately inserted between, before, or after the processes described below. For example, formation processes of the terminal structure and the like are inserted.

Figure 47:
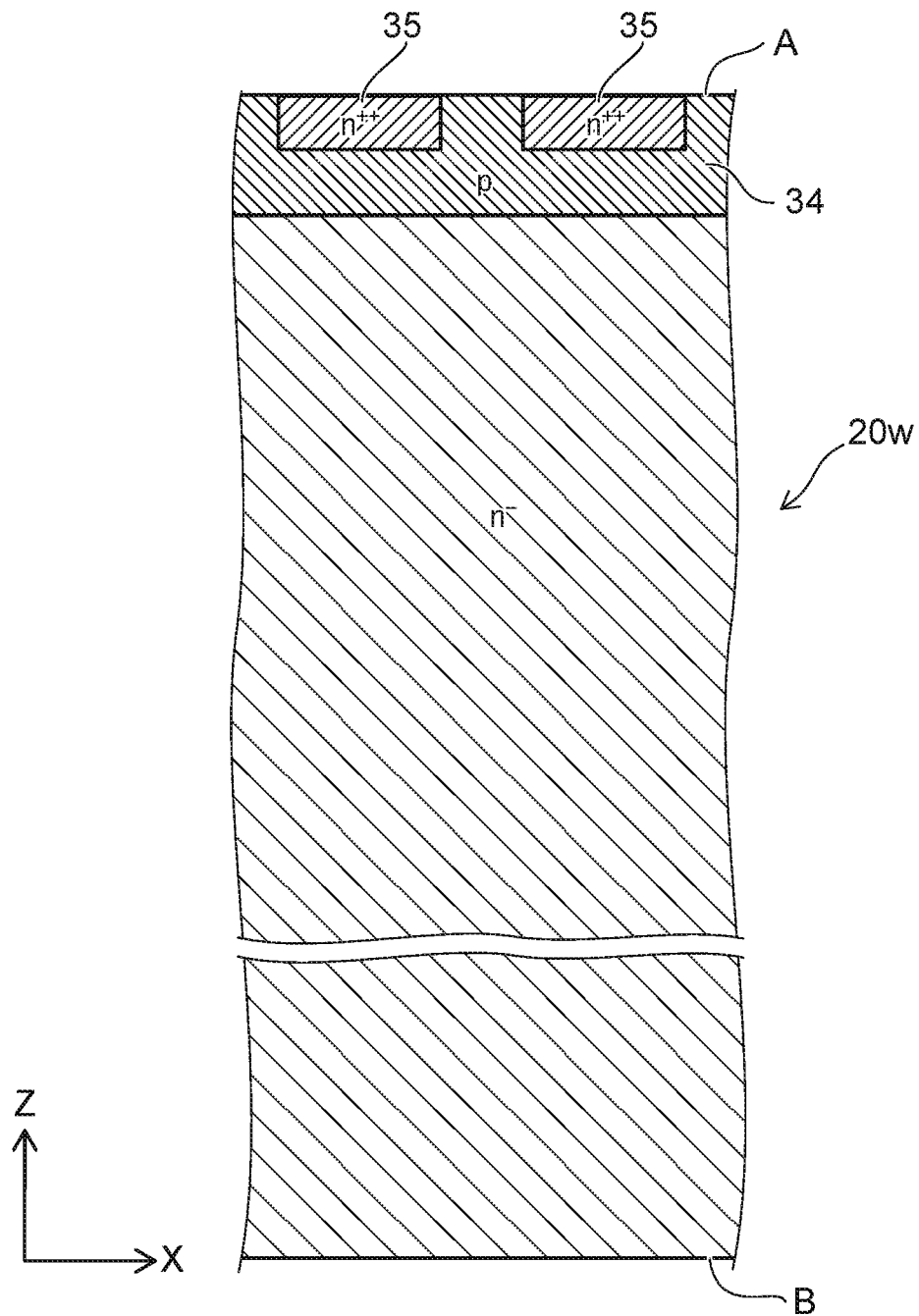

As shown in FIG. 47, the p-type base layer 34 is formed in the portion of the $n^-$-type high resistance wafer 20w on the surface A side by ion-implanting an impurity that forms acceptors into the surface A of the $n^-$-type high resistance wafer 20w. Then, the multiple $n^{++}$-type contact layers 35 are formed in a portion of the upper layer portion of the base layer 34 by selectively ion-implanting an impurity that forms donors into the surface A. The multiple $p^{++}$-type contact layers 36 (referring to FIG. 1) are formed in a portion of the upper layer portion of the base layer 34 by selectively ion-implanting an impurity that forms acceptors into the surface A. The $n^{++}$-type contact layer 35 and the p++ contact layer 36 are formed to be arranged alternately along the Y-direction.

Figure 48:
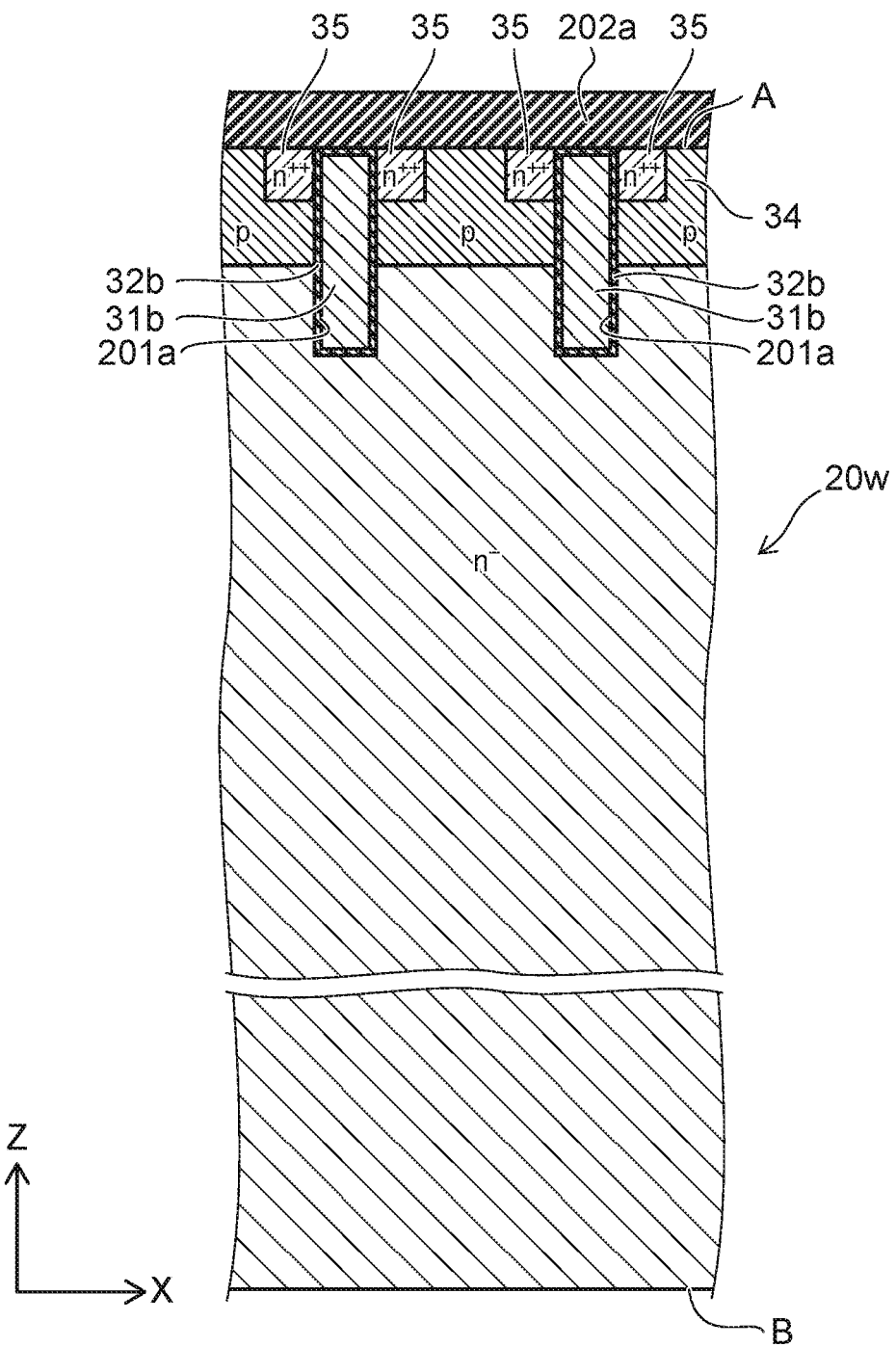

Then, as shown in FIG. 48, a trench 201a is made in the surface A. The trench 201a extends in the Y-direction, pierces the $n^{++}$-type contact layer 35, the $p^{++}$-type contact layer 36, and the p-type base layer 34, and is formed to penetrate the upper portion of the $n^-$-type high resistance wafer 20w. Then, the insulating film 32b is formed on the inner surface of the trench 201a; and the electrode 31b is formed in the interior of the trench 201a. Thereby, the gate structure on the emitter side is formed in the surface A. Then, an inter-layer insulating film 202a is formed on the surface A.

Figure 49:
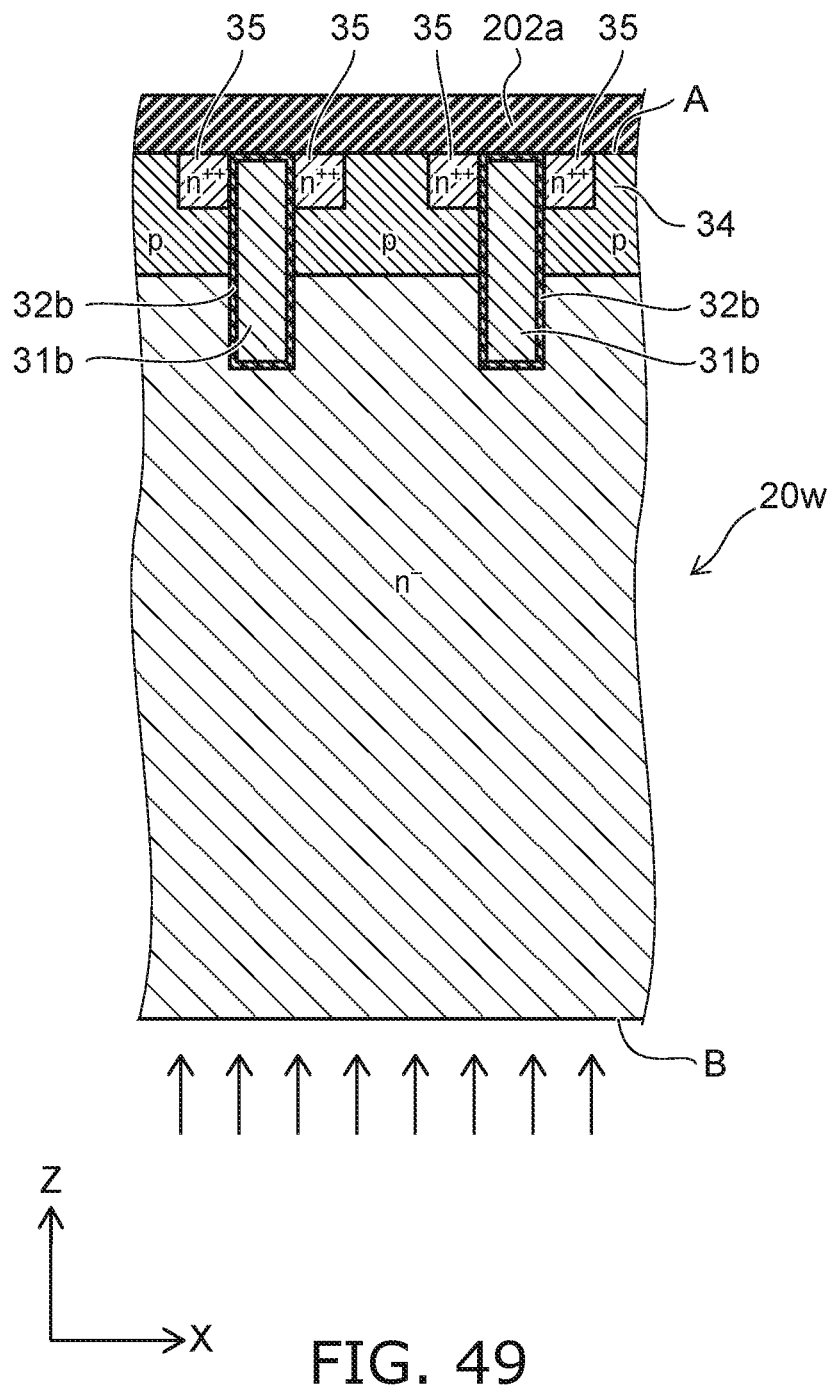

Continuing as shown in FIG. 49, the portion of the $n^-$-type high resistance wafer 20w other than the peripheral portion is polished or etched from the surface B side. Thereby, the thickness of the portion of the $n^-$-type high resistance wafer 20w other than the peripheral portion is reduced to a prescribed thickness. The thickness reduction processing is performed to adjust the thickness of the $n^-$-type high resistance layer 20 of the semiconductor device 1. Then, alignment marks (not shown) are formed in the surface A and the surface B after the processing by a double-sided aligner. The peripheral portion of the $n^-$-type high resistance wafer 20w functions as a portion that reinforces the $n^-$-type high resistance wafer 20w in the subsequent processes.

Figure 50:
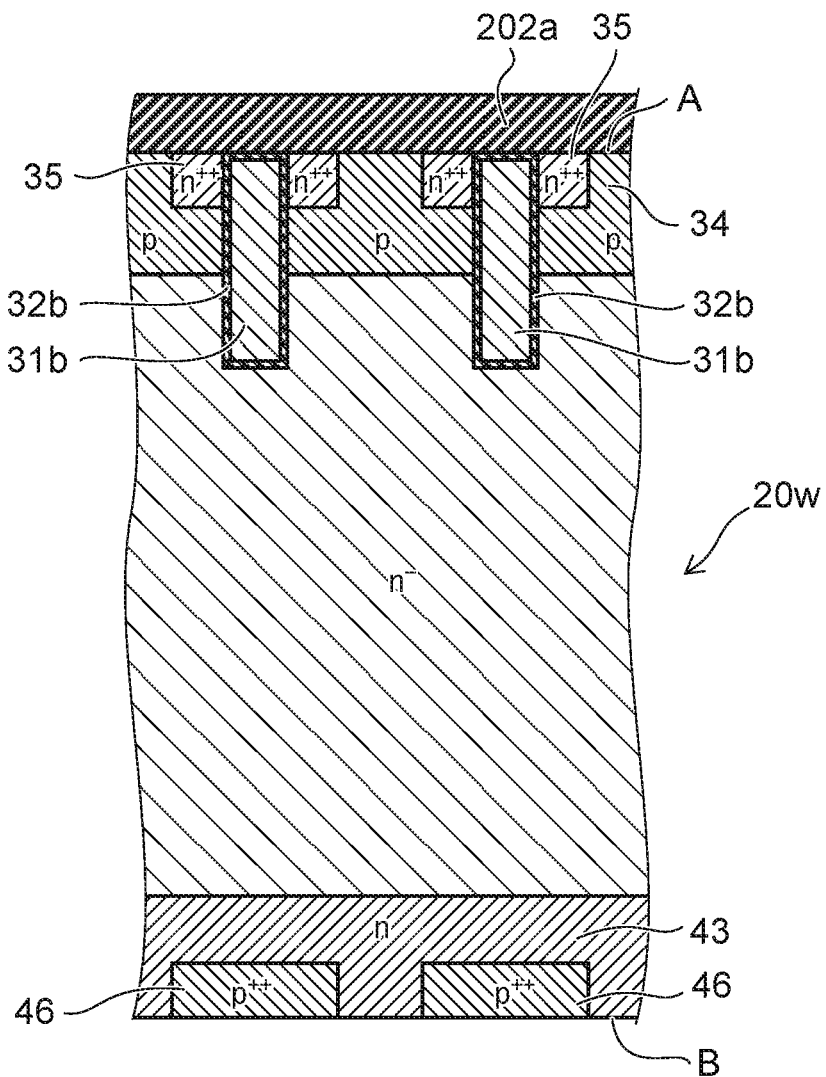

Then, as shown in FIG. 50, the n-type base layer 43, the $p^{++}$-type contact layer 46, and the $n^{++}$-type contact layer 45 (referring to FIG. 1) are formed in the surface B of the $n^-$-type high resistance wafer 20w by a method similar to that of the surface A described above. At this time, the $p^{++}$-type contact layer 46 and the $n^{++}$-type contact layer 45 are arranged alternately along the Y-direction.

Figure 51:
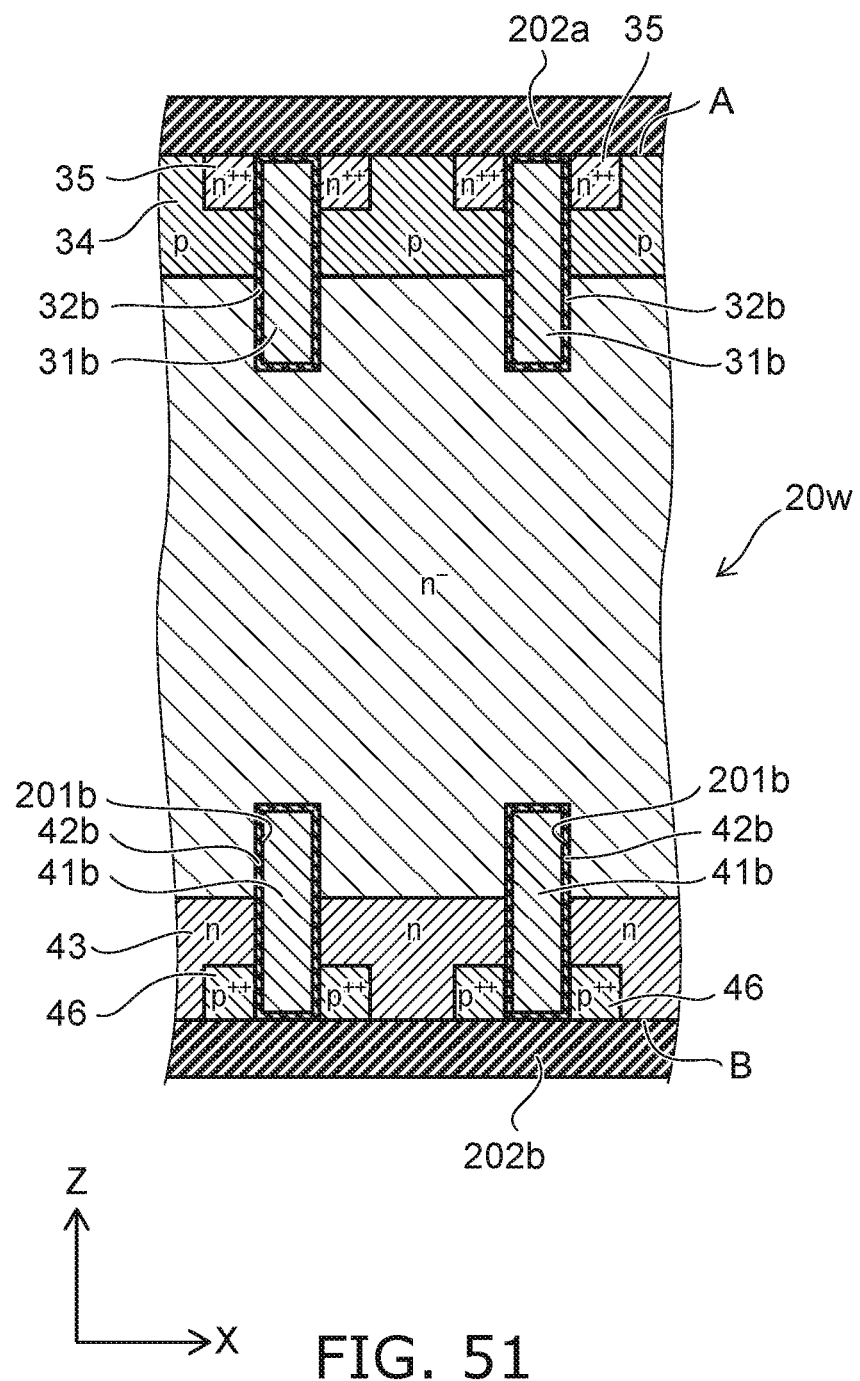

Continuing as shown in FIG. 51, a trench 201b that extends in the Y-direction is made in the surface B. The trench 201b pierces the $n^{++}$-type contact layer 45, the $p^{++}$-type contact layer 46, and the n-type base layer 43 and is formed to penetrate the lower portion of the $n^-$-type high resistance wafer 20w. Then, the insulating film 42b is formed on the inner surface of the trench 201b; and the electrode 41b is formed in the interior of the trench 201b. Thereby, the gate structure on the collector side is formed in the surface B. Then, an inter-layer insulating film 202b is formed on the surface B. Then, heat treatment is performed to diffuse and activate the ion-implanted impurities. The temperature of the heat treatment is, for example, 900 to 1200° C.; and the time is, for example, several tens of minutes to several hours.

Figure 52:
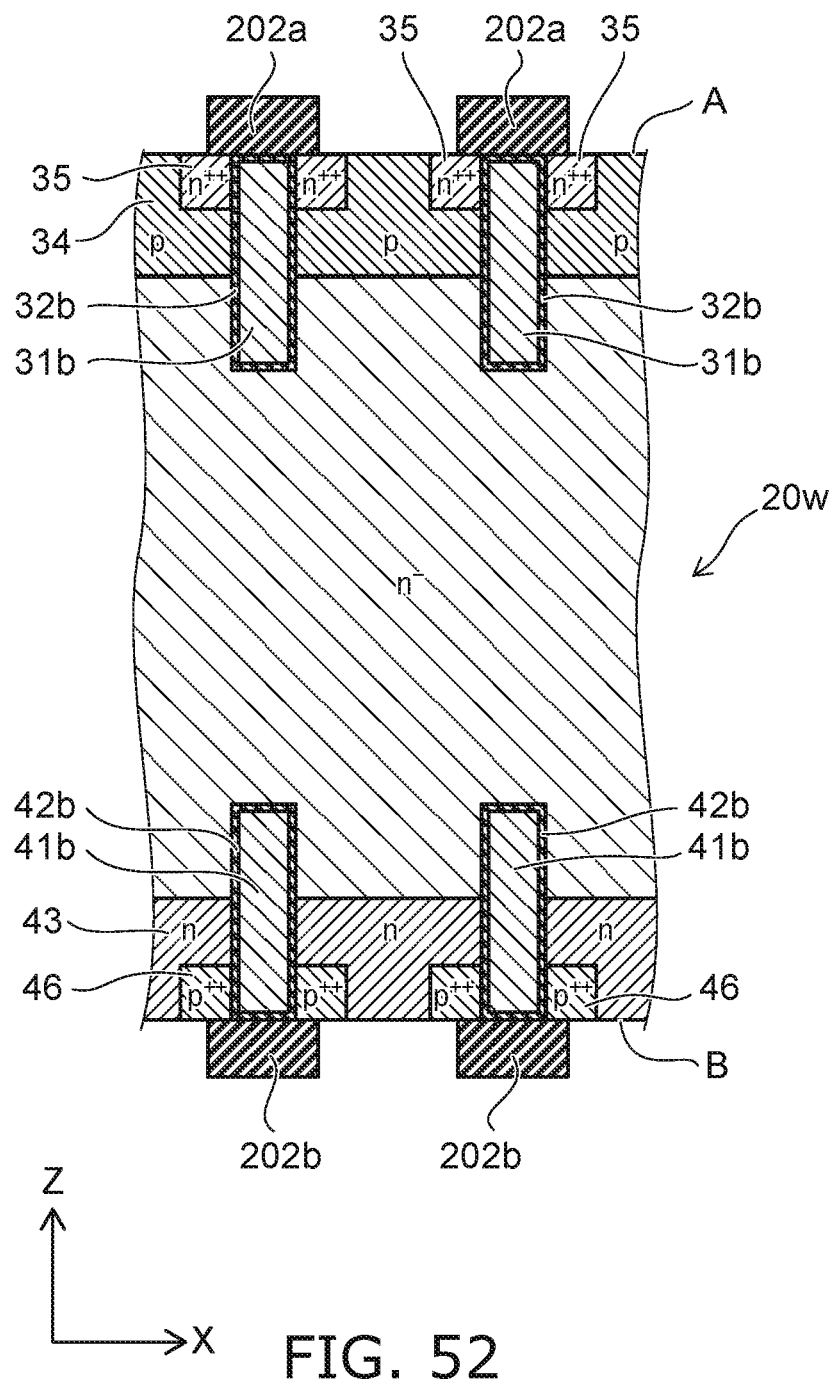

Then, as shown in FIG. 52, by selectively removing the inter-layer insulating film 202a on the surface A, the inter-layer insulating film 202a is caused to remain in the region directly above the electrode 31b and in the periphery of the region directly above the electrode 31b; and the other portions are removed. Thereby, a portion of the surface A is exposed. By selectively removing the inter-layer insulating film 202b on the surface B, the inter-layer insulating film 202b is caused to remain in the region directly under the electrode 41b and in the periphery of the region directly under the electrode 41b; and the other portions are removed. Thereby, a portion of the surface B is exposed.

Figure 53:
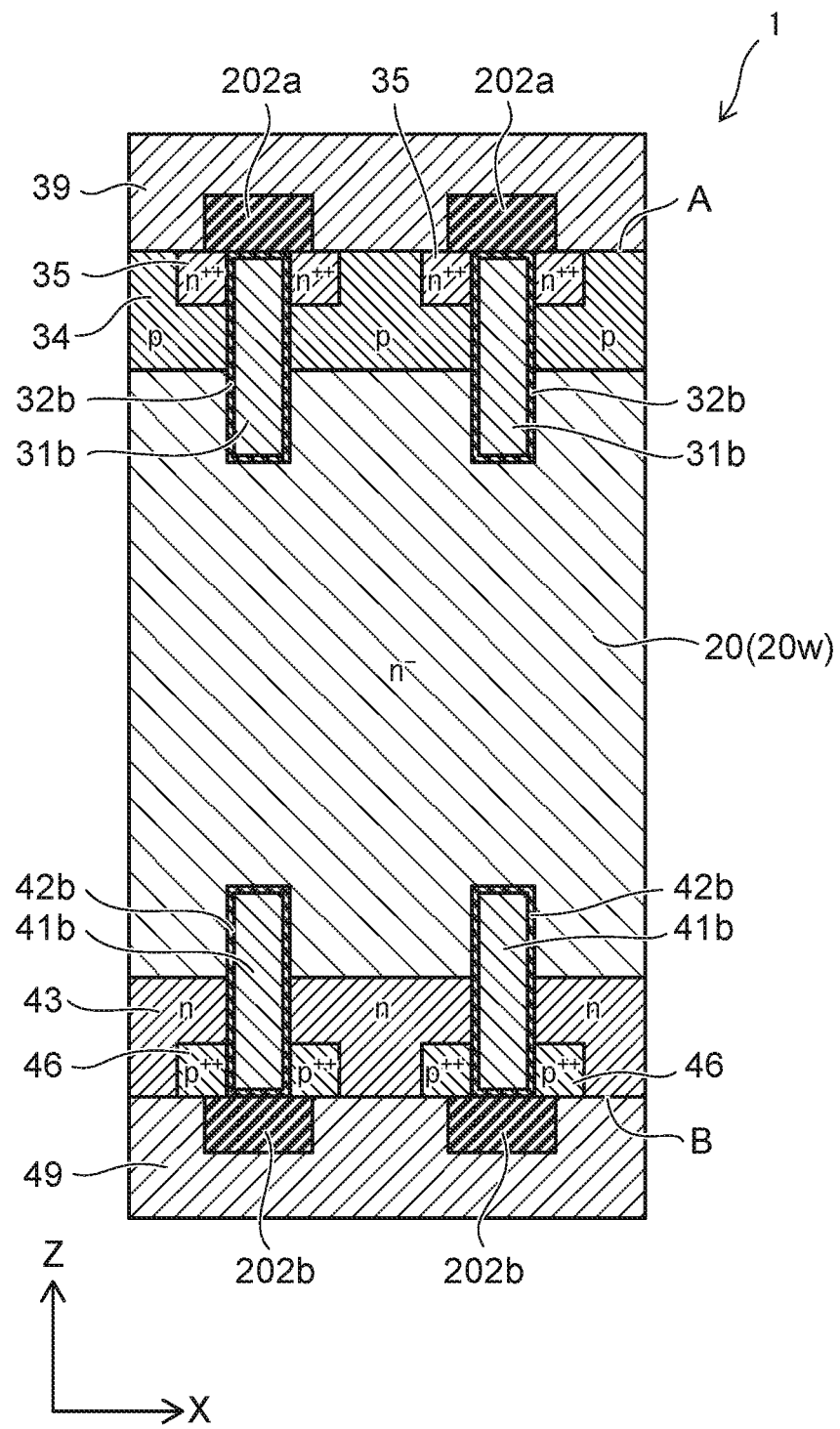

Continuing as shown in FIG. 53, the emitter electrode 39 is formed on the surface A by depositing aluminum by, for example, sputtering. Similarly, the collector electrode 49 is formed on the surface B. The bondability between the semiconductor portion and the electrodes may be improved by additionally ion-implanting an impurity into the outermost surface of the semiconductor portion prior to depositing the aluminum and by heat treatment at a temperature of about 600 to 900° C. Then, the n⁻-type high resistance wafer 20w is singulated by dicing with the structure bodies formed on the surface A and on the surface B. Thereby, the n⁻-type high resistance wafer 20w becomes the n⁻-type high resistance layer 20; and the semiconductor device 1 shown in FIGS. 4A and 4B is manufactured. The inter-layer insulating films 202a and 202b are shown respectively as portions of the insulating films 32a and 32b in FIG. 1 and FIGS. 4A and 4B.

Modification of Twenty-First Embodiment

A modification of the twenty-first embodiment will now be described.

The modification summarily describes a method for manufacturing the semiconductor device 5 according to the fifth embodiment described above (referring to FIG. 12).

Figure 54:
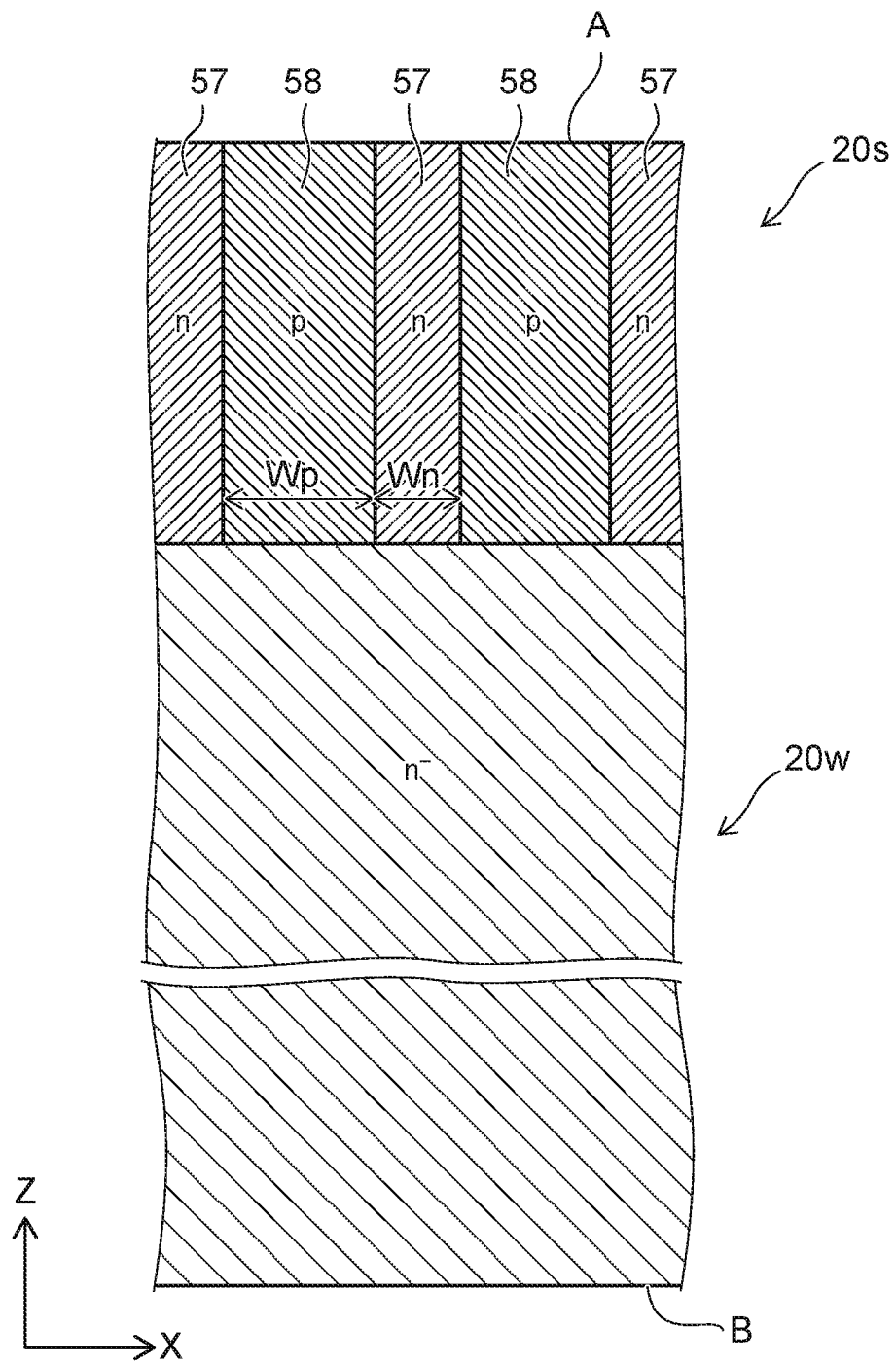
FIG. 54 is a cross-sectional view showing the method for manufacturing the semiconductor device according to a modification of the twenty-first embodiment.

FIG. 54 is a cross-sectional view showing the method for manufacturing the semiconductor device according to the modification.

First, as shown in FIG. 54, the wafer 20s is made in which a super junction structure made of the multiple n-type drift layers 57 and the multiple p-type drift layers 58 is provided on the n⁻-type high resistance wafer 20w. The n-type drift layers 57 and the p-type drift layers 58 extend in the Y-direction and are arranged alternately along the X-direction. For example, the n-type drift layers 57 and the p-type drift layers 58 are formed by epitaxially growing a silicon layer on the surface A of the n⁻-type high resistance wafer 20w. Or, the n-type drift layers 57 are formed by introducing an impurity that forms donors into the surface A of the n⁻-type high resistance wafer 20w; and the p-type drift layers 58 are formed by making multiple trenches extending in the Y-direction to pierce the n-type drift layers 57 at uniform spacing and by filling p-type silicon into the trenches. Thus, the wafer 20s is made.

Then, the processes shown in FIG. 47 to FIG. 53 are implemented. Among these processes, the process of forming the n-type base layer 33 (referring to FIG. 12), the process of forming the p-type base layer 44 (referring to FIG. 12), and the process of making the trenches extending in the Y-direction in the surface A and the surface B are implemented. Thereby, the semiconductor device 5 according to the fifth embodiment described above (referring to FIG. 12) can be manufactured.

Twenty-Second Embodiment

A twenty-second embodiment will now be described.

The embodiment summarily describes a second method for manufacturing the semiconductor device 1 according to the first embodiment described above (referring to FIGS. 4A and 4B).

FIG. 55 to FIG. 59 are cross-sectional views showing the method for manufacturing the semiconductor device according to the embodiment.

First, the n⁻-type high resistance wafer 20w is prepared as shown in FIG. 46.

As shown in FIG. 47, the p-type base layer 34, the n⁺⁺-type contact layer 35, and the p⁺⁺-type contact layer 36 (referring to FIG. 1) are formed in the surface A of the n⁻-type high resistance wafer 20w by a method similar to that of the twenty-first embodiment described above.

Figure 55:
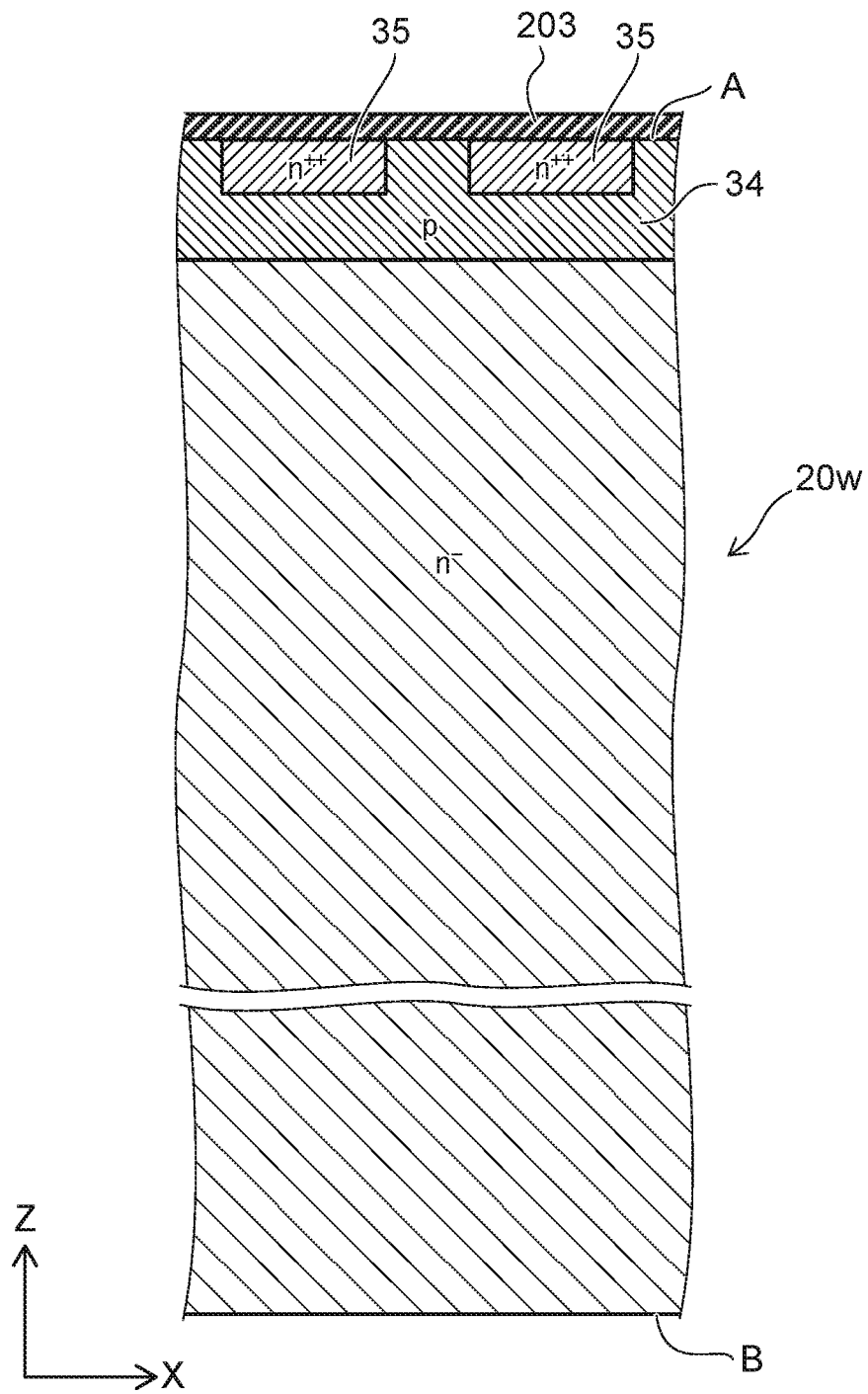
FIG. 55 to FIG. 59 are cross-sectional views showing the method for manufacturing the semiconductor device according to a twenty-second embodiment.

Then, as shown in FIG. 55, a protective film 203 is formed by depositing, for example, silicon oxide on the surface A. The protective film 203 protects the surface A when processing the surface B in the subsequent processes.

Figure 56:
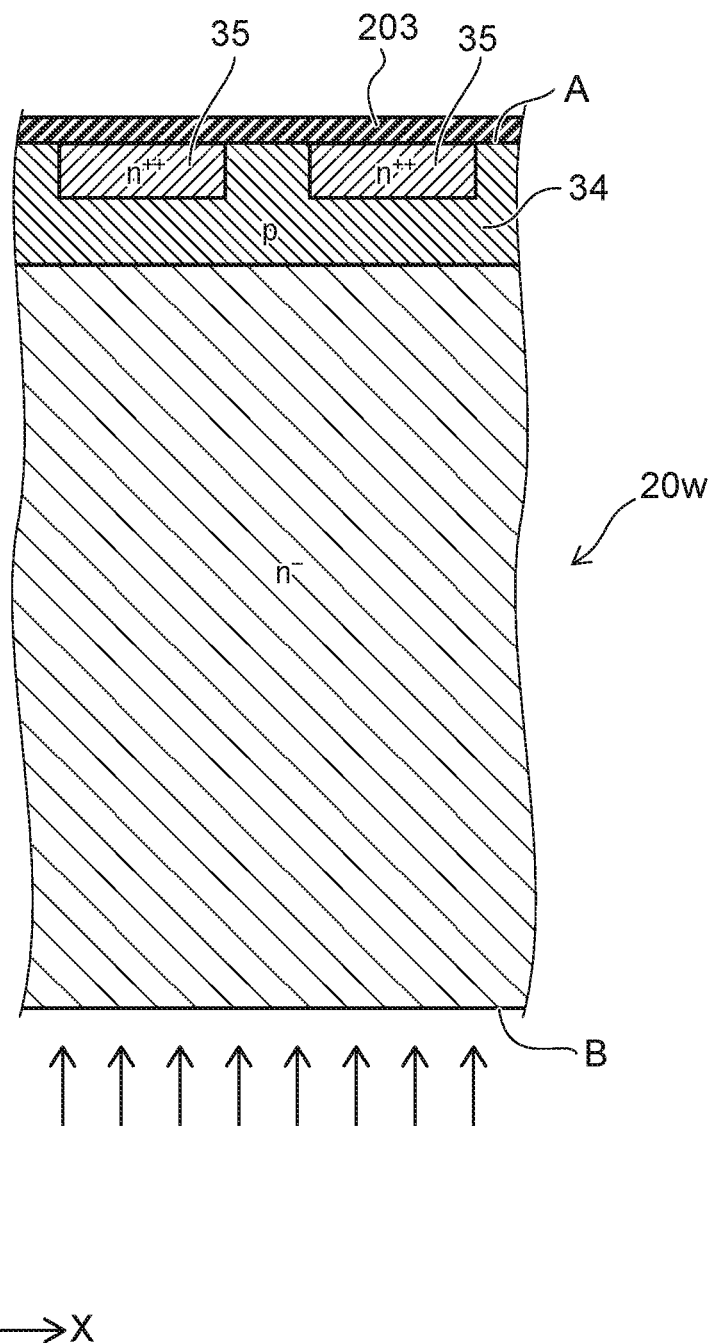

Continuing as shown in FIG. 56, the portion of the n⁻-type high resistance wafer 20w other than the peripheral portion is polished or etched from the surface B side. Then, alignment marks (not shown) are formed in the surface A and the surface B after the processing by a double-sided aligner.

Figure 57:
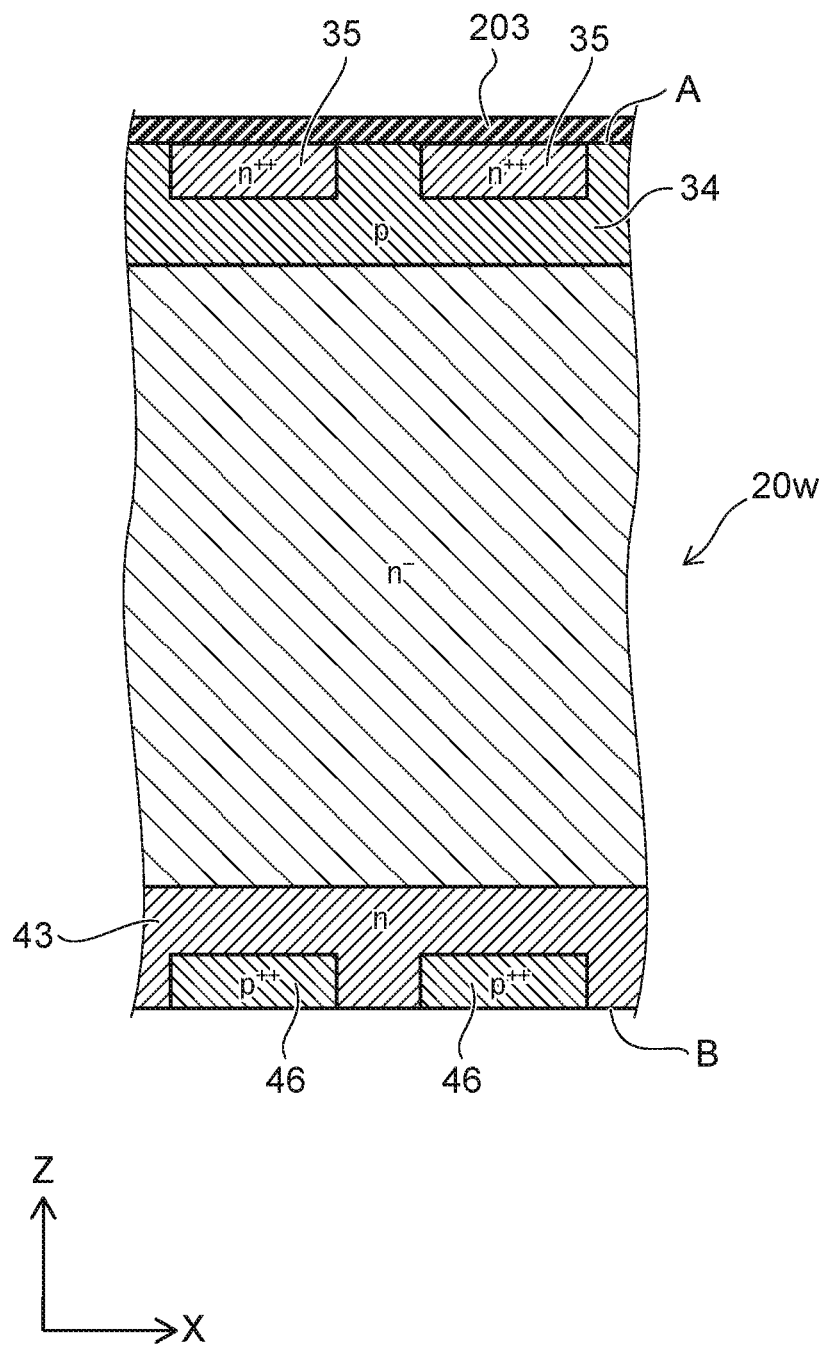

Then, as shown in FIG. 57, the n-type base layer 43, the p⁺⁺-type contact layer 46, and the n⁺⁺-type contact layer 45 (referring to FIG. 1) are formed in the portion of the n⁻-type high resistance wafer 20w on the surface B side by a method similar to that of the surface A described above. Then, heat treatment is performed to diffuse and activate the ion-implanted impurities. The temperature of the heat treatment is, for example, 900 to 1200° C.; and the time is, for example, several tens of minutes to several hours.

Figure 58:
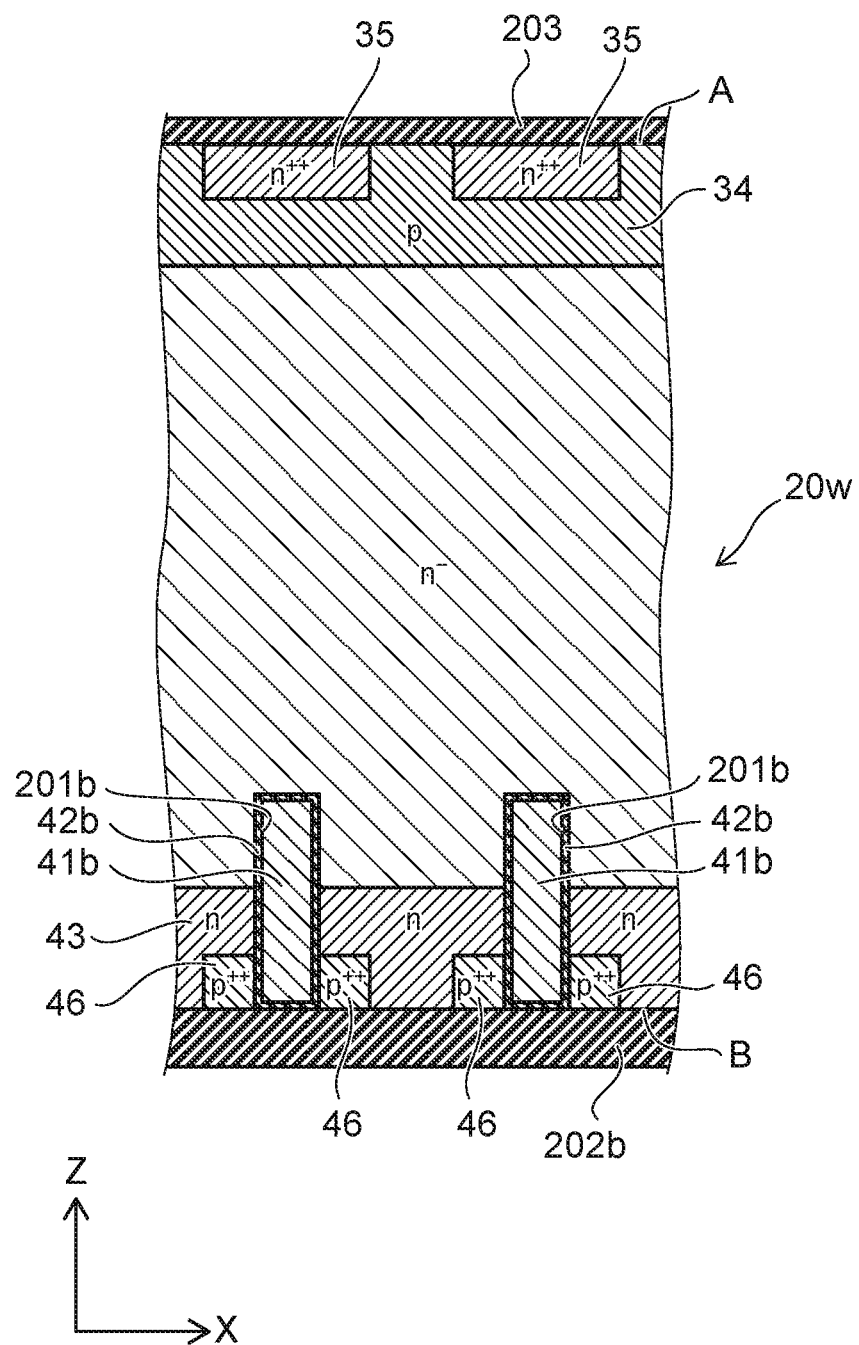

Continuing as shown in FIG. 58, the trench 201b is made in the surface B; the insulating film 42b is formed on the inner surface of the trench 201b; and the electrode 41b is formed in the interior of the trench 201b. Thereby, the gate structure on the collector side is formed in the surface B. Then, the inter-layer insulating film 202b is formed by depositing silicon oxide on the surface B.

Figure 59:
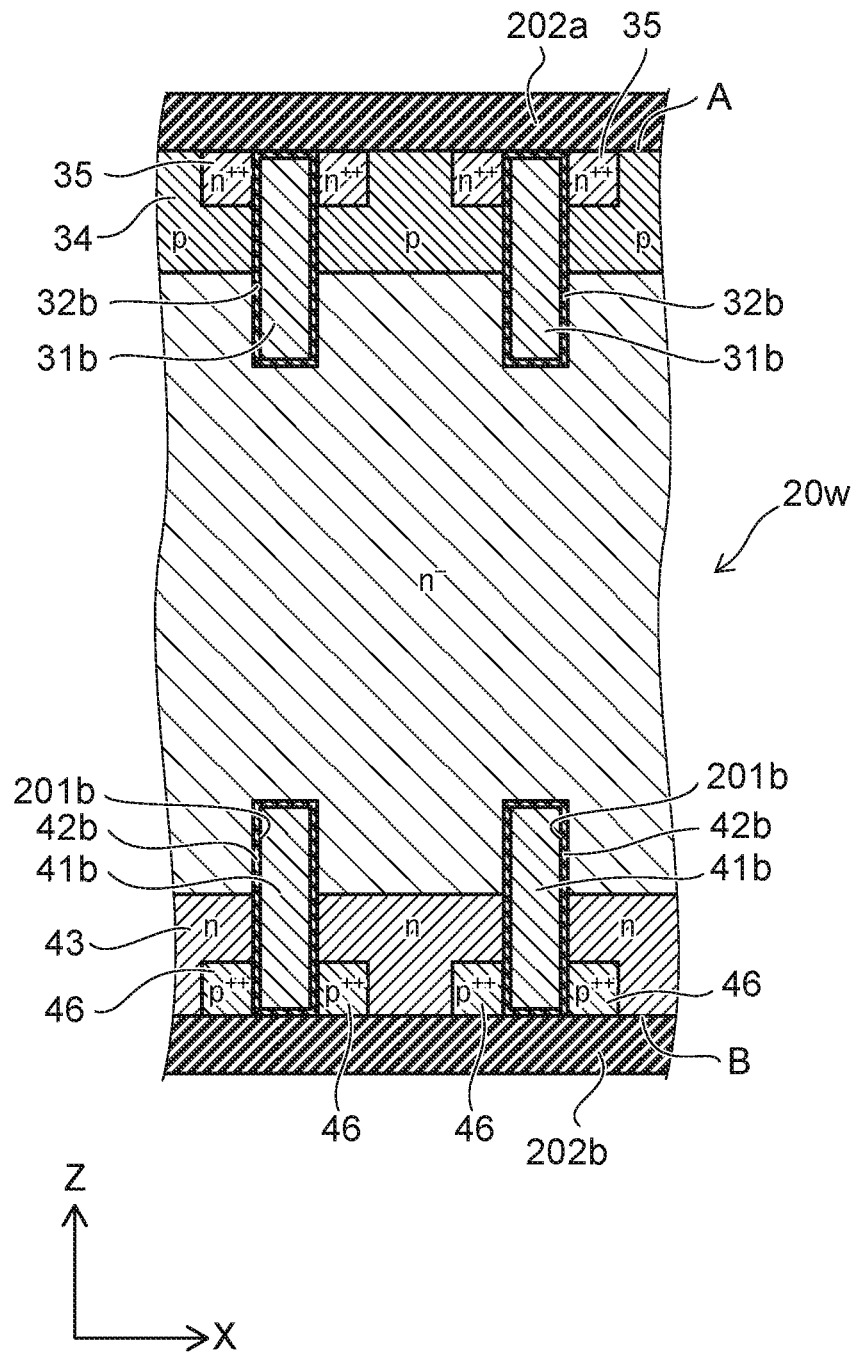

Then, as shown in FIG. 59, the trench 201a is made in the surface A; the insulating film 32b is formed on the inner surface of the trench 201a; and the electrode 31b is formed in the interior of the trench 201a. Thereby, the gate structure on the emitter side is formed in the surface A. Then, the inter-layer insulating film 202a is formed by additively depositing silicon oxide on the surface A. The remaining portion of the protective film 203 at this time is used to form a portion of the inter-layer insulating film 202a.

Continuing as shown in FIG. 53, the inter-layer insulating films 202a and 202b are selectively removed. Then, the emitter electrode 39 is formed on the surface A; and the collector electrode 49 is formed on the surface B. Then, the n⁻-type high resistance wafer 20w is singulated by dicing with the structure bodies formed on the surface A and on the surface B. Thereby, the n⁻-type high resistance wafer 20w becomes the n⁻-type high resistance layer 20; and the semiconductor device 1 shown in FIGS. 4A and 4B is manufactured.

Otherwise, the configuration and the manufacturing method of the embodiment are similar to those of the twenty-first embodiment described above.

In the embodiment as well, similarly to the modification of the twenty-first embodiment described above, the semiconductor device 5 according to the fifth embodiment described above (referring to FIG. 12) can be manufactured by using, instead of the n⁻-type high resistance wafer 20w, the wafer 20s in which the super junction structure is provided on the surface A side.

Twenty-Third Embodiment

A twenty-third embodiment will now be described.

The embodiment summarily describes a third method for manufacturing the semiconductor device 1 according to the first embodiment described above (referring to FIGS. 4A and 4B).

FIG. 60 to FIG. 64 are cross-sectional views showing the method for manufacturing the semiconductor device according to the embodiment.

First, the n⁻-type high resistance wafer 20w is prepared as shown in FIG. 46.

Then, as shown in FIG. 47, the base layer 34, the n⁺⁺-type contact layer 35, and the p⁺⁺-type contact layer 36 (referring to FIG. 1) are formed on the surface A side by a method similar to that of the first embodiment described above. Then, an alignment mark (not shown) is formed in the surface A by an aligner.

Figure 60:
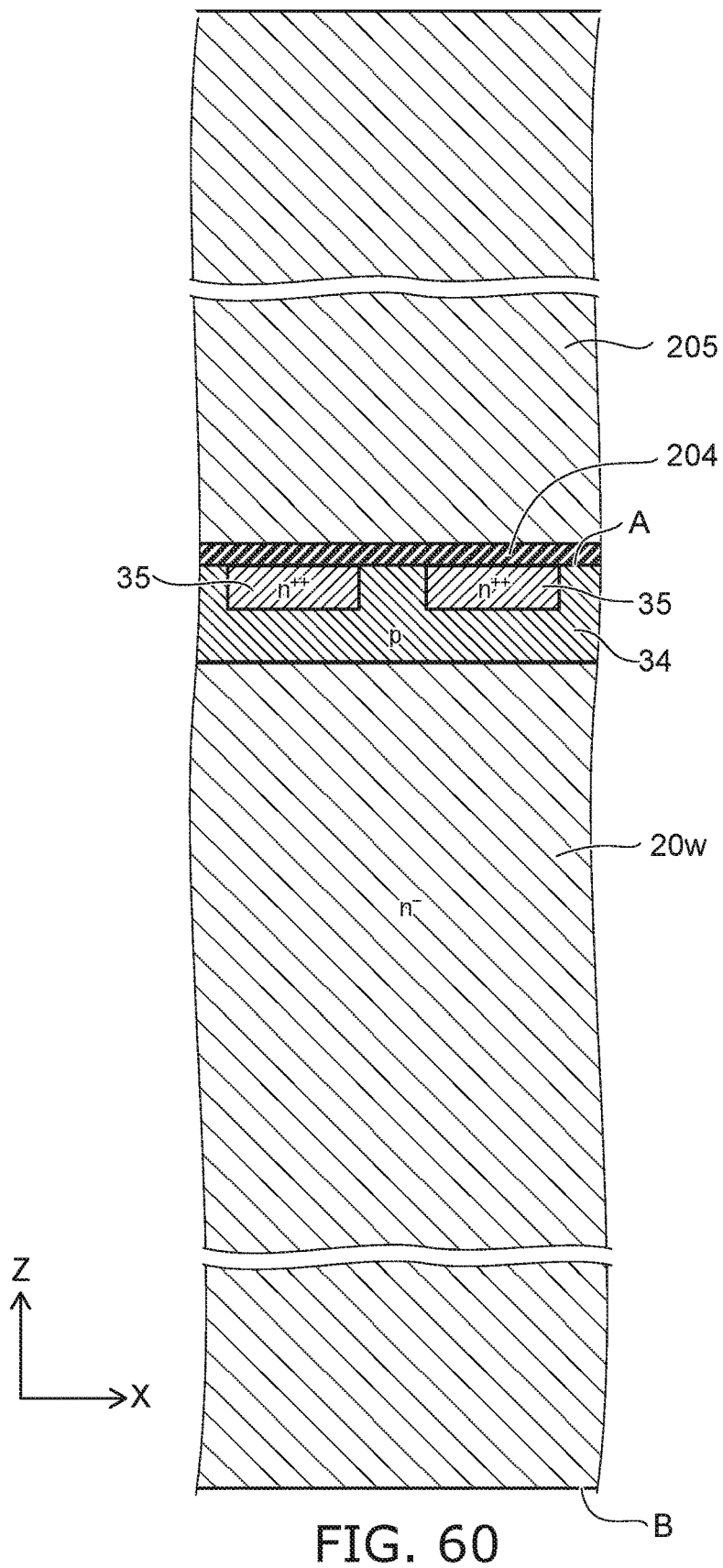
FIG. 60 to FIG. 64 are cross-sectional views showing the method for manufacturing the semiconductor device according to a twenty-third embodiment.

Then, as shown in FIG. 60, a silicon oxide film is formed on the surface A. On the other hand, a support substrate 205 is prepared in which a silicon oxide film is formed in the surface. The support substrate 205 also is a silicon wafer. Then, the support substrate 205 is bonded, with a silicon oxide film 204 interposed, to the surface A of the n⁻-type high resistance wafer 20w by bonding the two silicon oxide films.

Figure 61:
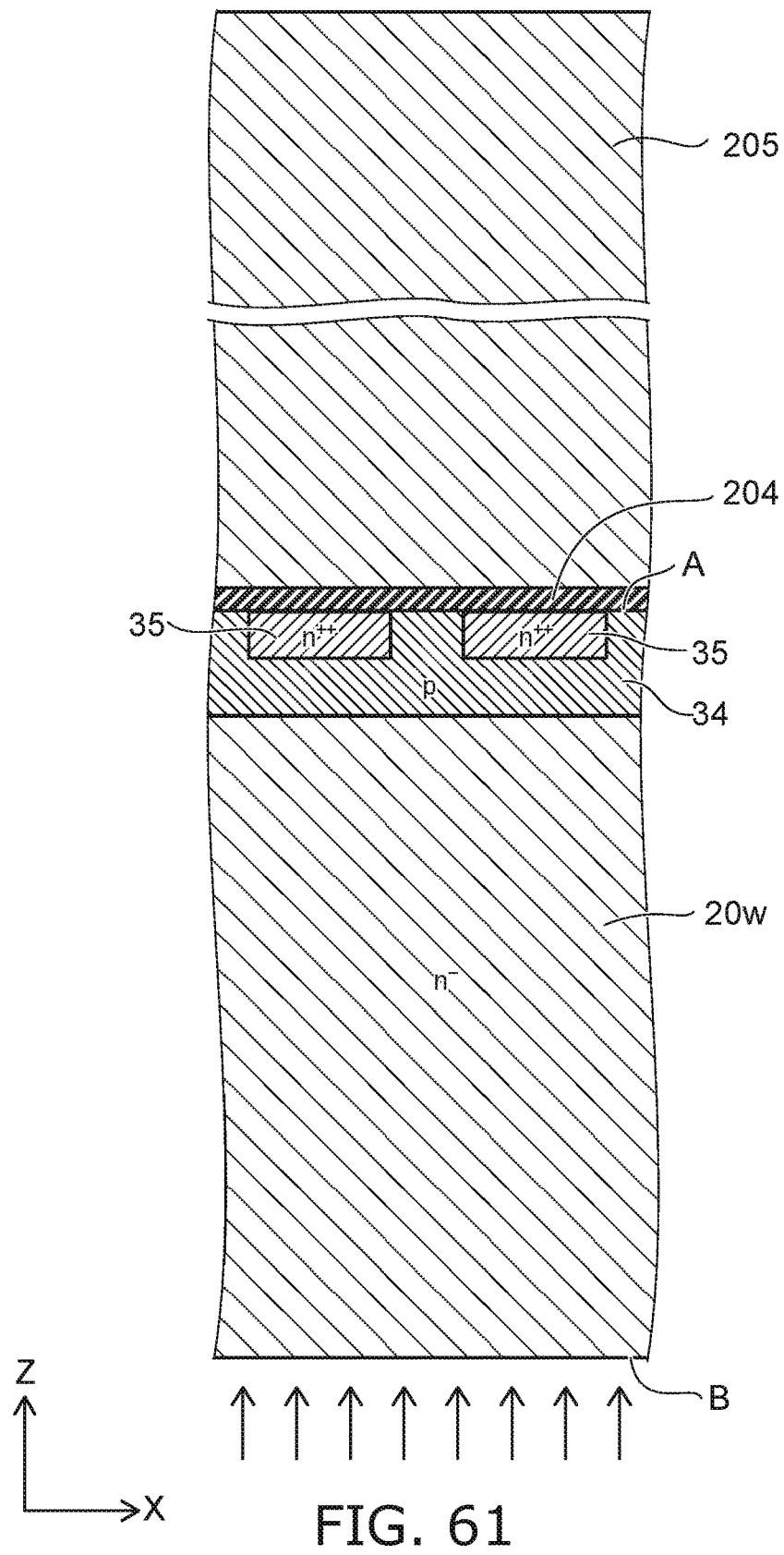

Continuing as shown in FIG. 61, the portion of the n⁻-type high resistance wafer 20w other than the peripheral portion is polished or etched from the surface B side. Thereby, the thickness of the portion of the n⁻-type high resistance wafer 20w other than the peripheral portion is reduced to a prescribed thickness. At this time, the support substrate 205 supports the n⁻-type high resistance wafer 20w. Then, an alignment mark (not shown) is formed in the surface B after the processing to match the alignment mark formed in the surface A. The support substrate 205 and the peripheral portion of the n⁻-type high resistance wafer 20w function as portions that reinforce the n⁻-type high resistance wafer 20w in the subsequent processes.

Figure 62:
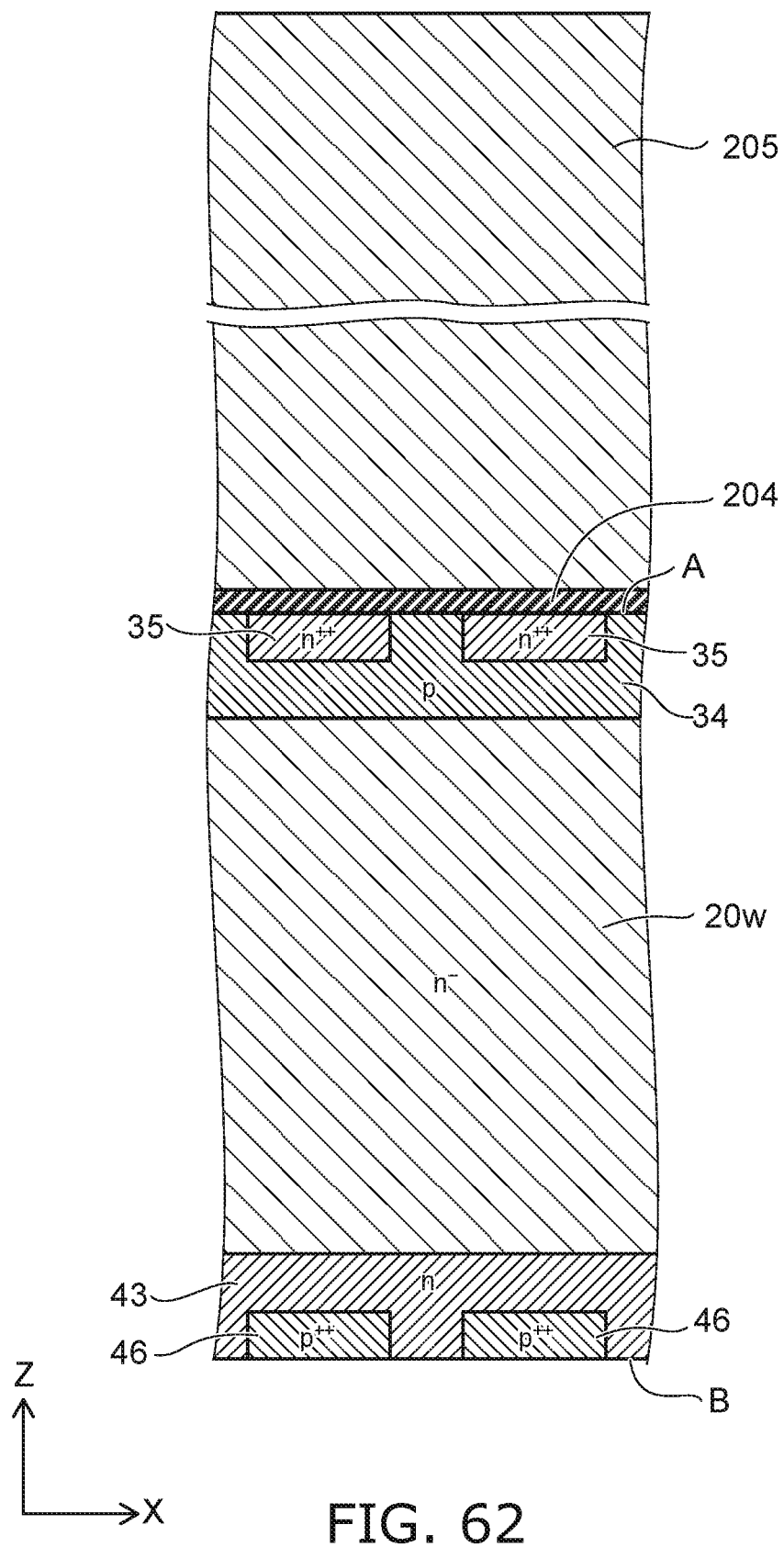

Then, as shown in FIG. 62, the n-type base layer 43, the p⁺⁺-type contact layer 46, and the n⁺⁺-type contact layer 45 (referring to FIG. 1) are formed in the portion of the n⁻-type high resistance wafer 20w on the surface B side by a method similar to that of the twenty-first embodiment described above. Then, heat treatment is performed by diffusing and activating the ion-implanted impurities. The temperature of the heat treatment is, for example, 900 to 1200° C.; and the time is, for example, several tens of minutes to several hours.

Figure 63:
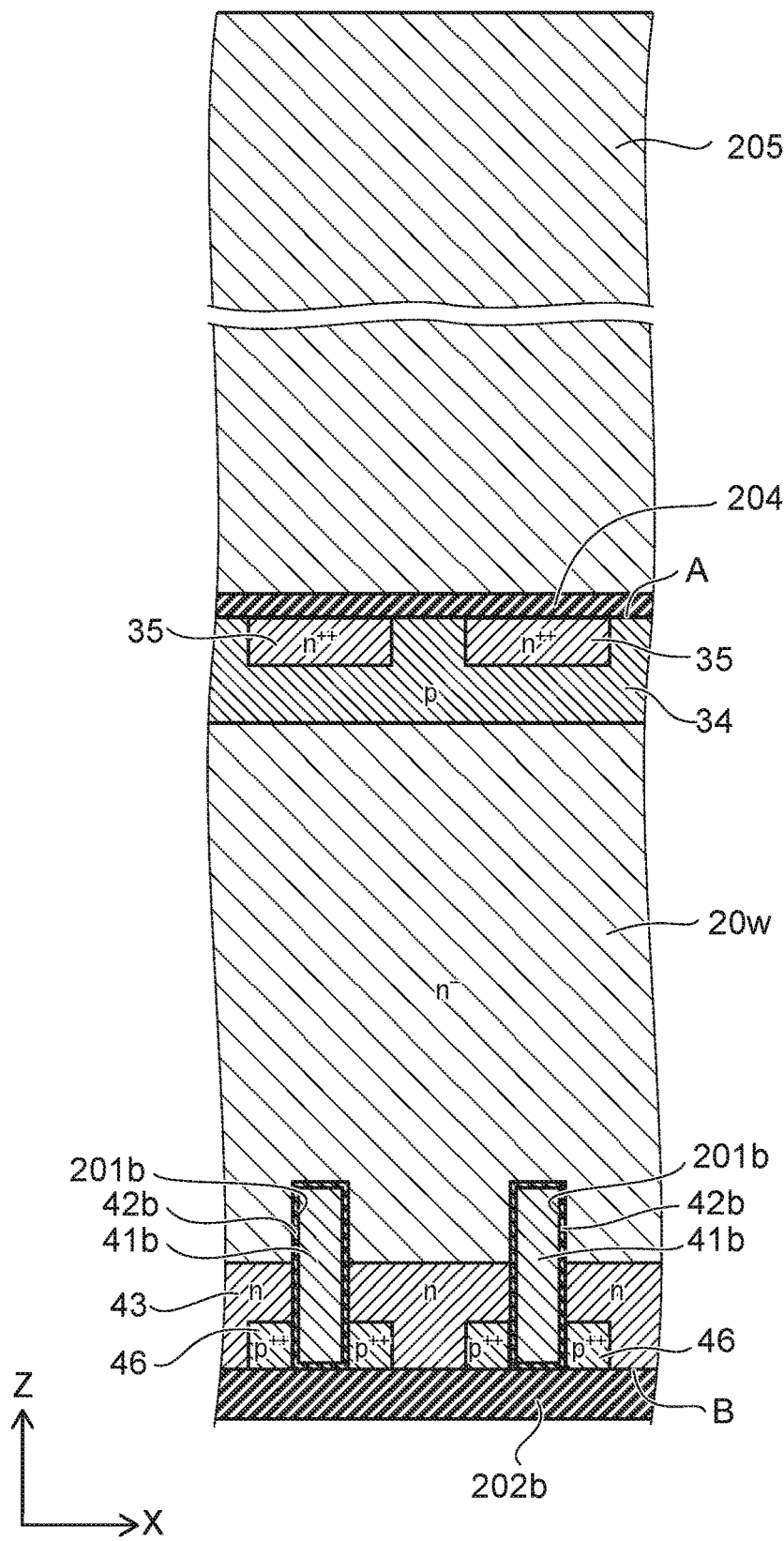
Figure 64:
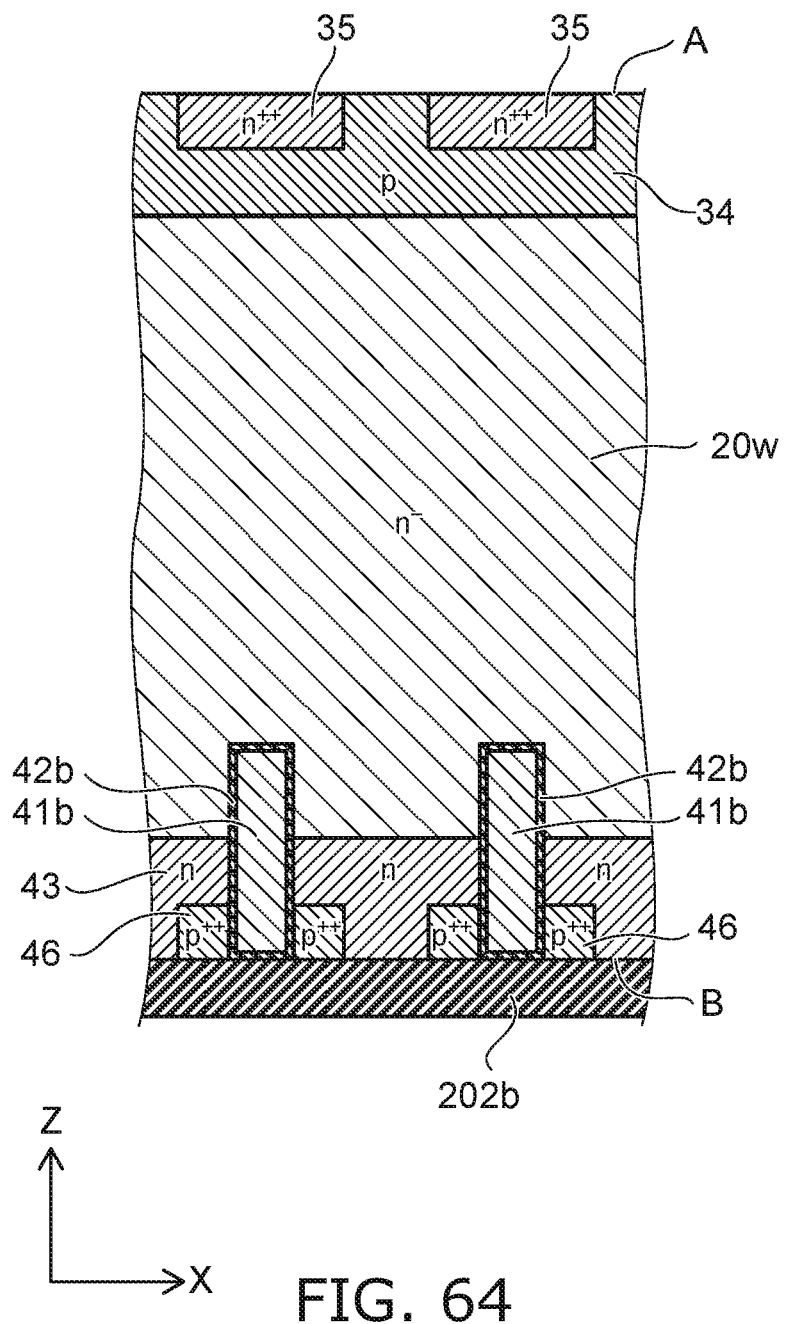

Continuing as shown in FIG. 63, the trench 201b is made in the surface B; the insulating film 42b is formed on the inner surface of the trench 201b; and the electrode 41b is formed in the interior of the trench 201b. Thereby, the gate structure on the collector side is formed in the surface B. Then, the inter-layer insulating film 202b is formed on the surface B. Then, as shown in FIG. 64, the support substrate 205 (referring to FIG. 63) is removed from the n⁻-type high resistance wafer 20w by removing the silicon oxide film 204 by etching.

Continuing as shown in FIG. 59, the gate structure on the emitter side is formed in the surface A by a method similar to that of the twenty-second embodiment described above. Then, the inter-layer insulating film 202a is formed on the surface A.

Thereafter, the method is similar to that of the twenty-first embodiment described above. In other words, as shown in FIG. 52, the inter-layer insulating films 202a and 202b are selectively removed. Then, as shown in FIG. 53, the emitter electrode 39 is formed on the surface A; and the collector electrode 49 is formed on the surface B. Then, the n⁻-type high resistance wafer 20w and the like are singulated by dicing. Thereby, the semiconductor device 1 shown in FIGS. 4A and 4B is manufactured.

According to the embodiment, compared to the twenty-first embodiment described above, the heat treatment can be performed while supporting the n⁻-type high resistance wafer 20w by the support substrate 205 in the process shown in FIG. 62 because the support substrate 205 is bonded to the n⁻-type high resistance wafer 20w in the process shown in FIG. 60. Therefore, the handling in the heat treatment is easy. Also, the gate structure is not damaged by the heat treatment because the heat treatment can be performed prior to forming the gate structure on the surface A side and the surface B side. Otherwise, the configuration and the manufacturing method of the embodiment are similar to those of the twenty-first embodiment described above.

In the embodiment as well, similarly to the modification of the twenty-first embodiment described above, the semiconductor device 5 according to the fifth embodiment described above (referring to FIG. 12) can be manufactured by using, instead of the n⁻-type high resistance wafer 20w, the wafer 20s in which the super junction structure is provided on the surface A side.

According to the embodiments described above, a semiconductor device and a method for driving the semiconductor device capable of improving the controllability of the current can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:
   a first semiconductor layer of a first conductivity type;
   a second semiconductor layer of a second conductivity type provided on the first semiconductor layer;
   a third semiconductor layer of the first conductivity type provided on the second semiconductor layer, a carrier concentration of the third semiconductor layer being higher than a carrier concentration of the first semiconductor layer;

a fourth semiconductor layer of the second conductivity type provided on the second semiconductor layer, a carrier concentration of the fourth semiconductor layer being higher than a carrier concentration of the second semiconductor layer;

a first electrode connected to the second semiconductor layer and the fourth semiconductor layer;

a second electrode facing the second semiconductor layer with an insulating film interposed;

a fifth semiconductor layer provided under the first semiconductor layer, a carrier concentration of the fifth semiconductor layer being higher than the carrier concentration of the first semiconductor layer;

a sixth semiconductor layer of the first conductivity type provided under the fifth semiconductor layer, a carrier concentration of the sixth semiconductor layer being higher than the carrier concentration of the first semiconductor layer;

a seventh semiconductor layer of the second conductivity type provided under the fifth semiconductor layer, a carrier concentration of the seventh semiconductor layer being higher than a carrier concentration of the fifth semiconductor layer;

a third electrode connected to the fifth semiconductor layer and the seventh semiconductor layer; and a fourth electrode facing the fifth semiconductor layer with an insulating film interposed.

2. The device according to claim 1, further comprising:
an eighth semiconductor layer of the second conductivity type disposed between the first semiconductor layer and the second electrode; and
a ninth semiconductor layer of the second conductivity type disposed between the first semiconductor layer and the fourth electrode.

3. The device according to claim 1, further comprising:
an eighth semiconductor layer of the first conductivity type disposed between the first semiconductor layer and the fourth electrode, and between the first semiconductor layer and the fifth semiconductor layer; and
a ninth semiconductor layer of the second conductivity type disposed between the eighth semiconductor layer and the second electrode, the first semiconductor layer and the ninth semiconductor layer being arranged alternately along a second direction intersecting a first direction, the first direction being from the third electrode toward the first electrode.

4. The device according to claim 3, wherein the fourth electrode overlaps with the ninth semiconductor layer when seen from the first direction.

5. The device according to claim 1, wherein the fifth semiconductor layer is the first conductivity type.

6. The device according to claim 1, wherein the fifth semiconductor layer is the second conductivity type.

7. The device according to claim 1, wherein the first to seventh semiconductor layers are formed of a silicon or a semiconductor material having a larger bandgap than silicon.

8. A method for driving the semiconductor device according to claim 1, the method comprising:
setting a first mode by applying a potential to the third electrode to form an inversion layer in the fifth semiconductor layer;
setting a second mode by applying a potential to the third electrode to form an inversion layer in the first semiconductor layer;

setting an ON state by applying a positive potential to the second electrode to form an inversion layer in the second semiconductor layer; and
setting an OFF state by applying a negative potential to the second electrode to cause an inversion layer not to form in the second semiconductor layer.

9. The method according to claim 8, further comprising:
transitioning from the OFF state to the ON state in the first mode; and
transitioning from the first mode to the second mode while still in the ON state.

10. The method according to claim 8, further comprising:
transitioning from the second mode to the first mode in the ON state; and
transitioning from the ON state to the OFF state while still in the first mode.

11. The method according to claim 8, wherein the device further comprising:
an eighth semiconductor layer of the first conductivity type disposed between the first semiconductor layer and the fourth electrode, and between the first semiconductor layer and the fifth semiconductor layer; and
a ninth semiconductor layer of the second conductivity type disposed between the eighth semiconductor layer and the second electrode, the first semiconductor layer and the ninth semiconductor layer being arranged alternately along a second direction intersecting a first direction, the first direction being from the third electrode toward the first electrode.

12. The method according to claim 8, wherein the first to seventh semiconductor layers are formed of a silicon or a semiconductor material having a larger bandgap than silicon.

13. A method for manufacturing the semiconductor device according to claim 1, the method comprising:
forming the second semiconductor layer in an upper layer portion of the first semiconductor layer;
forming the third semiconductor layer and the fourth semiconductor layer in an upper layer portion of the second semiconductor layer, the third semiconductor layer and the fourth semiconductor layer being arranged alternately along a first direction parallel to an upper surface of the first semiconductor layer;
forming a protective film on the second semiconductor layer, the third semiconductor layer and the fourth semiconductor layer;
reducing a thickness of the first semiconductor layer from a lower surface of the first semiconductor layer;
forming the fifth semiconductor layer in a lower layer portion of the first semiconductor layer;
forming the sixth semiconductor layer and the seventh semiconductor layer in a lower layer portion of the fifth semiconductor layer, the sixth semiconductor layer and the seventh semiconductor layer being arranged alternately along the first direction;
forming a first trench to penetrate the sixth semiconductor layer and the seventh semiconductor layer, the first trench extending in the first direction;
forming the fourth electrode in the first trench;
forming a first insulating film under the fourth electrode;
forming a second trench to penetrate the third semiconductor layer and the fourth semiconductor layer, the second trench extending in the first direction;
forming the second electrode in the second trench;
forming a second insulating film on the second electrode; and
forming the first electrode and the third electrode.

14. A method for manufacturing the semiconductor device according to claim 1, the method comprising:
- forming the second semiconductor layer in an upper layer portion of the first semiconductor layer;
- forming the third semiconductor layer and the fourth semiconductor layer in an upper layer portion of the second semiconductor layer, the third semiconductor layer and the fourth semiconductor layer being arranged alternately along a first direction parallel to an upper surface of the first semiconductor layer;
- bonding a support substrate to the second semiconductor layer, the third semiconductor layer and the fourth semiconductor layer;
- reducing a thickness of the first semiconductor layer from a lower surface of the first semiconductor layer;
- forming the fifth semiconductor layer in a lower layer portion of the first semiconductor layer;
- forming the sixth semiconductor layer and the seventh semiconductor layer in a lower layer portion of the fifth semiconductor layer, the sixth semiconductor layer and the seventh semiconductor layer being arranged alternately along the first direction;
- forming a first trench to penetrate the sixth semiconductor layer and the seventh semiconductor layer, the first trench extending in the first direction;
- forming the fourth electrode in the first trench;
- forming a first insulating film under the fourth electrode;
- removing the support substrate from the second semiconductor layer, the third semiconductor layer and the fourth semiconductor layer;
- forming a second trench to penetrate the third semiconductor layer and the fourth semiconductor layer, the second trench extending in the first direction;
- forming the second electrode in the second trench;
- forming a second insulating film on the second electrode; and
- forming the first electrode and the third electrode.

* * * * *